(12) United States Patent
Ogihara et al.

(10) Patent No.: US 8,715,913 B2
(45) Date of Patent: May 6, 2014

(54) SILICON-CONTAINING RESIST UNDERLAYER FILM-FORMING COMPOSITION AND PATTERNING PROCESS

(71) Applicant: Shin-Etsu Chemical Co., Ltd., Tokyo (JP)

(72) Inventors: Tsutomu Ogihara, Jyoetsu (JP); Takafumi Ueda, Jyoetsu (JP); Fujio Yagihashi, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 7 days.

(21) Appl. No.: 13/669,183

(22) Filed: Nov. 5, 2012

(65) Prior Publication Data
US 2013/0137041 A1 May 30, 2013

(30) Foreign Application Priority Data

Nov. 29, 2011 (JP) ................................ 2011-260525

(51) Int. Cl.
*G03F 7/36* (2006.01)
*G03F 7/20* (2006.01)
*G03F 7/30* (2006.01)
*G03F 7/38* (2006.01)
*G03F 7/09* (2006.01)

(52) U.S. Cl.
USPC .................... 430/313; 430/270.1; 430/272.1; 430/311; 430/316; 430/317; 430/318; 430/323; 430/325; 430/326; 430/330

(58) Field of Classification Search
None
See application file for complete search history.

(56) References Cited

U.S. PATENT DOCUMENTS

| | | | |
|---|---|---|---|
| 5,632,910 A | 5/1997 | Nagayama et al. | |
| 2006/0019195 A1 | 1/2006 | Hatakeyama et al. | |
| 2007/0238300 A1 | 10/2007 | Ogihara et al. | |
| 2009/0011366 A1 | 1/2009 | Tsubaki et al. | |
| 2009/0011372 A1 | 1/2009 | Ogihara et al. | |
| 2009/0136869 A1 | 5/2009 | Ogihara et al. | |
| 2010/0040972 A1 | 2/2010 | Tarutani et al. | |
| 2011/0021736 A1 | 1/2011 | Zhu | |
| 2013/0137271 A1* | 5/2013 | Ogihara et al. | 438/706 |

FOREIGN PATENT DOCUMENTS

| | | |
|---|---|---|
| EP | 2 172 808 A1 | 4/2010 |
| JP | A-07-181688 | 7/1995 |
| JP | A-07-183194 | 7/1995 |

(Continued)

OTHER PUBLICATIONS

Apr. 5, 2013 Extended European Search Report issued in European Application No. 12007830.8.

*Primary Examiner* — Sin J. Lee
(74) *Attorney, Agent, or Firm* — Oliff PLC

(57) ABSTRACT

The present invention is a silicon-containing resist underlayer film-forming composition containing at least any one of a condensation product and a hydrolysis condensation product or both of a mixture comprising: one or more kinds of a compound (A) selected from the group consisting of an organic boron compound shown by the following general formula (1) and a condensation product thereof and one or more kinds of a silicon compound (B) shown by the following general formula (2). Thereby, there can be provided a resist underlayer film applicable not only to the resist pattern formed of a hydrophilic organic compound obtained by the negative development but also to the resist pattern formed of a hydrophobic compound obtained by the conventional positive development.

$$R^1{}_{m0}B(OH)_{m1}(OR)_{(3-m0-m1)} \quad (1)$$

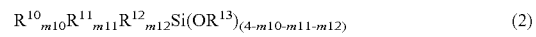

$$R^{10}{}_{m10}R^{11}{}_{m11}R^{12}{}_{m12}Si(OR^{13})_{(4-m10-m11-m12)} \quad (2)$$

26 Claims, 1 Drawing Sheet

(56) References Cited

FOREIGN PATENT DOCUMENTS

| | | |
|---|---|---|
| JP | A-2004-153125 | 5/2004 |
| JP | A-2005-128509 | 5/2005 |
| JP | A-2005-520354 | 7/2005 |
| JP | A-2007-302873 | 11/2007 |
| JP | A-2008-281974 | 11/2008 |
| JP | A-2008-281980 | 11/2008 |
| JP | A-2009-053657 | 3/2009 |
| JP | A-2009-126940 | 6/2009 |
| JP | B-04-716044 | 4/2011 |
| WO | WO 2004/007192 A1 | 1/2004 |

* cited by examiner

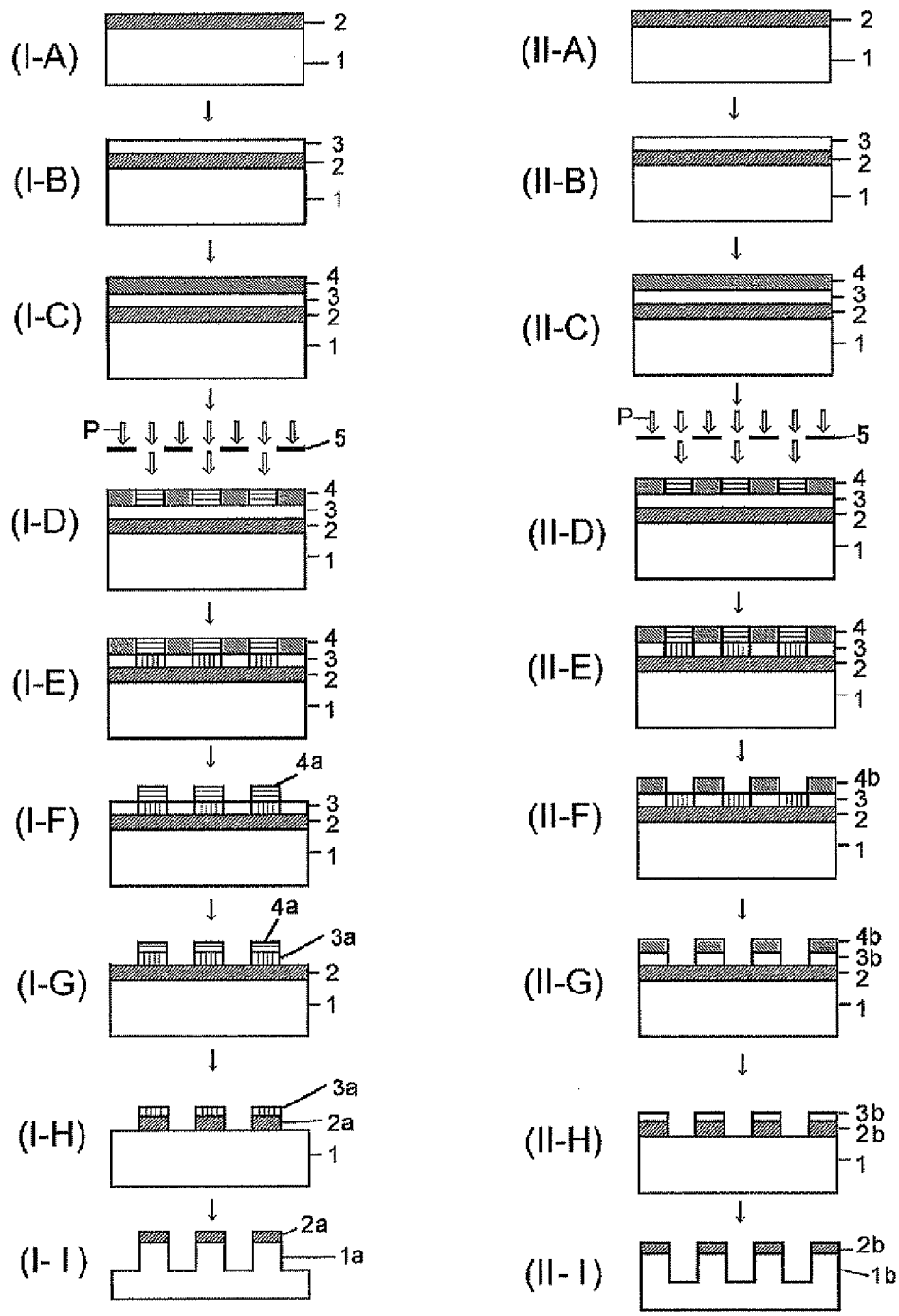

SILICON-CONTAINING RESIST UNDERLAYER FILM-FORMING COMPOSITION AND PATTERNING PROCESS

BACKGROUND OF THE INVENTION

1. Field of the Invention

The present invention relates to a silicon-containing resist underlayer film-forming composition and a patterning process using the same.

2. Description of the Related Art

In 1980s, a g-beam (436 nm) or an i-beam (365 nm) of a mercury lamp had been widely used as an exposure light in the resist patterning. As a means for further miniaturization, shifting to a shorter wavelength of the exposure light was assumed to be effective, so that, in mass production process after the DRAM (Dynamic Random Access Memory) with a 64-Mega bit (processing dimension of 0.25 µl or less) in 1990s, a KrF excimer laser (248 nm), a shorter wavelength than the i-beam (365 nm), had been used in place of the i-beam as an exposure light source. However, in production of DRAMs with integration of 256 M and 1 G or higher which require further miniaturized process technologies (processing dimension of 0.2 µm or less), a light source with further short wavelength is required, and thus, a photolithography using an ArF excimer laser (193 nm) has been investigated seriously since about a decade ago. At first, the ArF lithography was planned to be applied to manufacturing of a device starting from a 180-nm node device, but the life of the KrF excimer lithography was prolonged to mass production of the 130-nm node device; and thus, a full-fledged application of the ArF lithography started from the 90-nm node. Further, mass production of the 65-nm node device is now underway by combining thereof with a lens having an increased NA till 0.9. Further shortening of wavelength of the exposure light is progressing in the next 45-nm node device; and for that, the $F_2$-lithography with 157 nm wavelength became a candidate. However, there are many problems with the $F_2$ lithography: cost-up of a scanner due to use of a large quantities of expensive $CaF_2$ single crystals for a projection lens; extremely poor sustainability of a soft pellicle, which leads to change of an optical system due to introduction of a hard pellicle; decrease in etching resistance of a resist film, and so forth. Because of these problems, development of the $F_2$ lithography was stopped, and the ArF immersion lithography was introduced.

In the ArF immersion lithography, water having refractive index of 1.44 is introduced between a projection lens and a wafer by a partial fill method thereby enabling high speed scanning; and thus, mass production of the 45-nm node device is now underway by using a lens with a 1.3 NA class.

For the 32-nm node lithography technology, a lithography with a vacuum ultraviolet beam (EUV) of 13.5 nm wavelength is a candidate. Problems to be solved in the EUV lithography are a higher output power of the laser, a higher sensitivity of the resist film, a higher resolution, a lower line edge roughness (LER), a non-defective MoSi laminate mask, a lower aberration of the reflective mirror, and so forth; and thus, there are mounting problems to be solved.

Development of the immersion lithography with a high refractive index, another candidate for the 32-nm node, was suspended, because transmittance of LUAG, a candidate for a high refractive index lens, is low, and refractive index of the liquid could not reach an aimed value of 1.8.

As mentioned above, in the photo-exposure used as a general technology, resolution due to the wavelength of a light source is approaching to its inherent limit. Therefore, in recent years, development by an organic solvent, with which a very fine hole pattern that could not been formed by a patterning process with a positive tone by a conventional alkaline development is formed by a patterning process with a negative tone by the organic solvent development, is receiving an attention again. This is a patterning process with which a negative pattern is formed by the organic solvent development by using a positive resist composition having a high resolution. Further, an investigation to obtain a doubled resolution by combining two developments of the alkaline development and the organic solvent development is now underway.

As to the ArF resist composition used for the negative tone development by an organic solvent as mentioned above, a conventional positive ArF resist composition can be used; and a patterning process thereof is shown, for example, in Patent Documents 1 to 3.

One method to transfer the negative tone pattern formed as mentioned above to a substrate is a multilayer resist method. In this method, a resist underlayer film having different etching selectivity from a photoresist film (i.e., resist upperlayer film), for example, a silicon-containing resist underlayer film is intervened between the resist upperlayer film and the substrate to be processed whereby obtaining a pattern in the resist upperlayer film; and then, after the pattern is transferred to the silicon-containing resist underlayer film by dry etching by using the upperlayer resist pattern as a dry etching mask, the pattern is further transferred to the substrate to be processed by dry etching by using the silicon-containing resist underlayer film as a dry etching mask.

Illustrative examples of the silicon-containing resist underlayer film used in the multilayer resist method as mentioned above include a silicon-containing inorganic film formed by CVD, such as a $SiO_2$ film (for example, Patent Document 4 etc.) and a SiON film (for example, Patent Document 5 etc.), and those formed by a spin-coating method, such as a SOG film (spin-on-glass film) (for example, Patent Document 6 etc.) and a crosslinking silsesquioxane film (for example, Patent Document 7 etc.).

CITATION LIST

Patent Literature

Patent Document 1: Japanese Patent Laid-Open Publication No. 2008-281974
Patent Document 2: Japanese Patent Laid-Open Publication No. 2008-281980
Patent Document 3: Japanese Patent Laid-Open Publication No. 2009-53657.
Patent Document 4: Japanese Patent Laid-Open Publication No. H07-183194
Patent Document 5: Japanese Patent Laid-Open Publication No. H07-181688
Patent Document 6: Japanese Patent Laid-Open Publication No. 2007-302873
Patent Document 7: Japanese translation of PCT international application No. 2005-520354

SUMMARY OF THE INVENTION

However, on contrary to the positive development (alkaline development) in which a resist pattern formed of a hydrophobic compound not soluble in an alkaline developer is formed, in the negative development (organic solvent development), a resist pattern formed of a hydrophilic organic compound having an acidic carboxyl group and the like in high concentration by a deprotection reaction is formed, so that the underlayer resist cannot express satisfactorily its performance in a conventional resist underlayer film for the alkaline development.

On the other hand, if the resist underlayer film used in the negative development is different from the resist underlayer film used in the positive development, piping equipment dedicated to respective developments are necessary; and therefore, it is economically irrational.

The present invention was made in view of the situation mentioned above, and has an object to provide a resist underlayer film applicable not only to the resist pattern formed of a hydrophilic organic compound obtained by the negative development but also to the resist pattern formed of a hydrophobic compound obtained by the conventional positive development.

To solve the problems mentioned above, the present invention provides a silicon-containing resist underlayer film-forming composition containing at least any one of a condensation product and a hydrolysis condensation product or both of a mixture comprising:

one or more kinds of a compound (A) selected from the group consisting of an organic boron compound shown by the following general formula (1) and a condensation product thereof and one or more kinds of a silicon compound (B) shown by the following general formula (2),

$$R^1_{m0}B(OH)_{m1}(OR)_{(2-m0-m1)} \quad (1)$$

wherein R represents an organic group having 1 to 6 carbon atoms and optionally forming a cyclic organic group by bonding of two ORs; $R^1$ represents an organic group having a hydroxyl group or a carboxyl group substituted with an acid-labile group and optionally forming a cyclic organic group by bonding of two $R^1$s; m0 represents 1 or 2, m1 represents 0, 1, or 2, and $1 \le m0+m1 \le 3$,

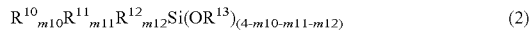
$$R^{10}_{m10}R^{11}_{m11}R^{12}_{m12}Si(OR^{13})_{(4-m10-m11-m12)} \quad (2)$$

wherein $R^{13}$ represents an organic group having 1 to 6 carbon atoms; each of $R^{10}$, $R^{11}$, and $R^{12}$ represents a hydrogen atom or a monovalent organic group having 1 to 30 carbon atoms; and m10, m11, and m12 represent 0 or 1, and $0 \le m10+m11+m12 \le 3$.

In the present invention mentioned above, by introducing a boron atom into the silicon-containing film, its reactivity to a dry etching gas is increased so that higher etching selectivity to the upperlayer photoresist than heretofore known silicon-containing compositions can be obtained.

In addition, the silicon-containing resist underlayer film-forming composition may contain any one of a condensation product and a hydrolysis condensation product or both of a mixture comprising the compound (A), the compound (B), and a compound (C) shown by the following general formula (3),

$$U(OR^2)_{m2}(OR^3)_{m3}(O)_{m4} \quad (3)$$

wherein $R^2$ and $R^3$ represent a hydrogen atom, or an organic group having 1 to 30 carbon atoms; m2+m3+m4 is a valency that is determined by a kind of U; m2, m3, and m4 represent an integer of 0 or more; and U represents an element belonging to the groups III, IV, or V in the periodic table except for carbon and silicon.

In the present invention, by further addition of a metal oxide other than silicon, the silicon-containing resist underlayer film-forming composition having good storage stability and adhesion with a resist pattern can be obtained.

In addition, it is preferable that the U in the above general formula (3) represents any of boron, aluminum, gallium, yttrium, germanium, titanium, zirconium, hafnium, bismuth, tin, phosphorous, vanadium, arsenic, antimony, niobium, and a tantalum.

The silicon-containing resist underlayer film containing the metal shown by U has a higher etching speed than the silicon-containing resist underlayer film not containing the U; and thus, the silicon-containing resist underlayer film being capable of pattern transfer can be formed even if a thinned photoresist is used as an etching mask.

In addition, a solvent having a boiling point of 180° C. or higher may be contained in the silicon-containing resist underlayer film-forming composition.

By containing therein a high boiling point solvent having a boiling point of 180° C. or higher, the silicon-containing resist underlayer film having excellent adhesion with the upperlayer resist pattern can be formed.

In addition, the present invention provides a patterning process, wherein an organic underlayer film is formed on a body to be processed by using an organic underlayer film-forming composition of an application type, on the organic underlayer film is formed a silicon-containing resist underlayer film by using the silicon-containing resist underlayer film-forming composition, on the silicon-containing resist underlayer film is formed a photoresist film by using a resist composition of a chemically amplification type, and after heat treatment thereof, the photoresist film is exposed to a high energy beam, an exposed area of the photoresist film is dissolved by using an alkaline developer to form a positive pattern, the pattern is transferred to the silicon-containing resist underlayer film by dry etching by using the photoresist film having the pattern formed therein as a mask, the pattern is transferred to the organic underlayer film by dry etching by using the silicon-containing resist underlayer film having the pattern transferred thereto as a mask, and further the pattern is transferred to the body to be processed by dry etching by using the organic underlayer film having the pattern transferred thereto as a mask.

Moreover, the present invention provides a patterning process, wherein an organic hard mask composed of mainly a carbon is formed on a body to be processed by a CVD method, on the organic hard mask is formed a silicon-containing resist underlayer film by using the silicon-containing resist underlayer film-forming composition, on the silicon-containing resist underlayer film is formed a photoresist film by using a resist composition of a chemically amplification type, and after heat treatment thereof, the photoresist film is exposed to a high energy beam, an exposed area of the photoresist film is dissolved by using an alkaline developer to form a positive pattern, the pattern is transferred to the silicon-containing resist underlayer film by dry etching by using the photoresist film having the pattern formed therein as a mask, the pattern is transferred to the organic hard mask by dry etching by using the silicon-containing resist underlayer film having the pattern transferred thereto as a mask, and further the pattern is transferred to the body to be processed by dry etching by using the organic hard mask having the pattern transferred thereto as a mask.

If a pattern is formed by positive development by using the silicon-containing resist underlayer film formed by the silicon-containing resist underlayer film-forming composition of the present invention, a pattern formed in the upperlayer resist can be formed on the substrate without causing transfer difference in size by optimizing a combination with the CVD film or the coating film as mentioned above.

In addition, it is preferable that difference between contact angle to pure water of the silicon-containing resist underlayer film before formation of the photoresist film and contact angle to pure water of the silicon-containing resist underlayer film corresponding to the unexposed area of the photoresist film after exposure is 10 degrees or less.

If difference between contact angle to pure water of the silicon-containing resist underlayer film before formation of the photoresist film and contact angle to pure water of the silicon-containing resist underlayer film corresponding to the unexposed area of the photoresist film after exposure is 10 degrees or less, difference of the contact angles between the upperlayer resist and the unexposed area of the silicon-containing resist underlayer film can be made 10 degrees or less, whereby leading to good adhesion in the positive development; and thus, a fine pattern can be formed.

In addition, the present invention provides a patterning process, wherein an organic underlayer film is formed on a body to be processed by using an organic underlayer film-forming composition of an application type, on the organic underlayer film is formed a silicon-containing resist underlayer film by using the silicon-containing resist underlayer film-forming composition, on the silicon-containing resist underlayer film is formed a photoresist film by using a resist composition of a chemically amplification type, and after heat treatment thereof, the photoresist film is exposed to a high energy beam, an unexposed area of the photoresist film is dissolved by using an organic solvent developer to form a negative pattern, the pattern is transferred to the silicon-containing resist underlayer film by dry etching by using the photoresist film having the pattern formed therein as a mask, the pattern is transferred to the organic underlayer film by dry etching by using the silicon-containing resist underlayer film having the pattern transferred thereto as a mask, and further the pattern is transferred to the body to be processed by dry etching by using the organic underlayer film having the pattern transferred thereto as a mask.

Moreover, the present invention provides a patterning process, wherein an organic hard mask composed of mainly a carbon is formed on a body to be processed by a CVD method, on the organic hard mask is formed a silicon-containing resist underlayer film by using the silicon-containing resist underlayer film-forming composition, on the silicon-containing resist underlayer film is formed a photoresist film by using a resist composition of a chemically amplification type, and after heat treatment thereof, the photoresist film is exposed to a high energy beam, an unexposed area of the photoresist film is dissolved by using an organic solvent developer to form a negative pattern, the pattern is transferred to the silicon-containing resist underlayer film by dry etching by using the photoresist film having the pattern formed therein as a mask, the pattern is transferred to the organic hard mask by dry etching by using the silicon-containing resist underlayer film having the pattern transferred thereto as a mask, and further the pattern is transferred to the body to be processed by dry etching by using the organic hard mask having the pattern transferred thereto as a mask.

If a pattern is formed by negative development by using the silicon-containing resist underlayer film formed by the silicon-containing resist underlayer film-forming composition of the present invention, a pattern formed in the upperlayer resist can be formed on the substrate without causing transfer difference in size by optimizing a combination with the CVD film or the coating film as mentioned above.

In addition, it is preferable that, in the exposure of the photoresist film, contact angle to pure water of the silicon-containing resist underlayer film corresponding to the exposed area of the photoresist film is decreased by 10 degrees or more as compared with before the exposure.

When contact angle of the part of the silicon-containing resist underlayer film corresponding to the exposed area of the photoresist film is decreased by 10 degrees or more as compared with before exposure, difference in the contact angle to the resist pattern after the negative development becomes smaller, whereby leading to enhancement of adhesion; and as a result, pattern collapse can be avoided, and a fine pattern can be formed.

In addition, as the body to be processed, a substrate for a semiconductor device or a substrate for a semiconductor device coated with any of a metal film, a metal carbide film, a metal oxide film, a metal nitride film, a metal oxycarbide film, and a metal oxynitride film may be used.

In this case, it is preferable that the metal to constitute the body to be processed is any of silicon, titanium, tungsten, hafnium, zirconium, chromium, germanium, copper, aluminum, and iron, or a metal alloy of them.

When the patterning process of the present invention as mentioned above is used, a pattern can be formed by processing the body to be processed as described above.

As mentioned above, when the silicon-containing resist underlayer film formed by using the composition of the present invention is used, a formed resist pattern has good adhesion so that a patterning with good surface roughness and without pattern collapse is possible in any of the alkaline development and the organic solvent development. In addition, because the silicon-containing resist underlayer film can have high etching selectivity to an organic material, the formed photoresist pattern can be transferred to the silicon-containing resist underlayer film and then sequentially to the organic underlayer film or to the CVD carbon film by a dry etching process. Especially, in recent years, as a process for manufacturing of a semiconductor device progresses toward miniaturization, in order to avoid pattern collapse after development, film thickness of the upperlayer resist becomes thinner so that pattern transfer to the underlayer film becomes difficult. However, if the silicon-containing resist underlayer film formed by using the composition of the present invention is used, deformation of the upperlayer resist pattern during dry etching can be suppressed even if the thinned upperlayer resist is used as an etching mask, so that this pattern can be transferred to the substrate with high precision.

In addition, in practical manufacturing process of a semiconductor device, all the patterning processes cannot be changed for the negative development, but only part of an ultrafine process is changed; and thus, it may be assumed that the existing positive development process remains unchanged. In this case, if resist underlayer film solely dedicated to each of the negative development and the positive development are used, the equipment and quality control of the composition may become cumbersome. Accordingly, if the resist underlayer film-forming composition is usable in both the positive and the negative processes, rational management may be possible in both equipment and quality control.

BRIEF DESCRIPTION OF THE DRAWINGS

FIG. 1 is a flow chart showing one embodiment of a patterning process according to the present invention.

DESCRIPTION OF THE EMBODIMENTS

Hereinafter, the present invention will be explained in more detail.

As mentioned above, in a conventional positive upperlayer resist, film properties of the coat film before exposure and film properties of the pattern formed by an alkaline development after exposure (hereinafter this pattern is called "positively developed pattern") have been the same. And thus, to enhance adhesion of the positively developed pattern with the silicon-containing resist underlayer film, enhancement of adhesion of the pattern and lowering of the roughness thereof could be effectively achieved by approximating contact angle of the upperlayer resist to pure water (hereinafter "contact angle to pure water" is called "contact angle") with contact angle of the silicon-containing underlayer film.

However, in the pattern obtained by a negative development (hereinafter, this pattern is called "negatively developed pattern"), when comparison is made on film properties between the upperlayer resist coat film before exposure and the negatively developed pattern, in the negatively developed pattern, an acid-labile group (acid-releasing group) is eliminated by an acid generated by the exposure thereby increasing the amount of hydrophilic groups such as a carboxyl group and a phenolic hydroxyl group; and as a result, the contact angle of the resist pattern is shifted toward a more hydrophilic side, i.e., a lower side, than that of immediately after film formation. Because of this, it was found, in a conventional resist underlayer film for positive development whose contact angle is made coincident with that of the photoresist film before the exposure, discrepancy from the contact angle of the negative pattern is generated thereby causing pattern collapse and an adverse effect in roughness.

Accordingly, inventors of the present invention found that, by utilizing the fact that the positively developed pattern is the unexposed area of the upperlayer resist film and that the negatively developed pattern is the exposed area of the upperlayer resist film, if it was possible to have the contact angle in the unexposed area approximated to the contact angle of the upperlayer resist film and to have the contact angle in the exposed area approximated to the contact angle of the upperlayer resist after the exposure, the resist underlayer film having optimum surface conditions in any of the processes could be obtained. Accordingly, the inventors carried out an extensive investigation on the silicon-containing resist underlayer film-forming composition having the contact angle thereof decreased only in the exposed area; and as a result, the inventors found that, when a polymer having an acid-labile group and a polymer not having this group were blended in an appropriate mixing ratio, the silicon-containing resist underlayer film-forming composition having the contact angle thereof decreased only in the exposed area could be obtained, thereby accomplished the present invention. In addition, by controlling the constituting element in the film that contains an organic group, which is the driving force to change the contact angle, etching selectivity with the upperlayer resist could be optimized so that both etching performance and patterning performance could be satisfied.

Namely, the present invention provides a silicon-containing resist upperlayer film-forming composition containing at least any one of a condensation product and a hydrolysis condensation product or both of a mixture comprising:

one or more kinds of a compound (A) selected from the group consisting of an organic boron compound shown by the following general formula (1) and a condensation product thereof and one or more kinds of a silicon compound (B) shown by the following general formula (2), $$R^1{}_{m0}B(OH)_{m1}(OR)_{(3-m0-m1)} \quad (1)$$

wherein R represents an organic group having 1 to 6 carbon atoms and optionally forming a cyclic organic group by bonding of two ORS; $R^1$ represents an organic group having a hydroxyl group or a carboxyl group substituted with an acid-labile group and optionally forming a cyclic organic group by bonding of two $R^1$s; m0 represents 1 or 2, m1 represents 0, 1, or 2, and $1 \leq m0+m1 \leq 3$, $$R^{10}{}_{m10}R^{11}{}_{m11}R^{12}{}_{m12}Si(OR^{13})_{(4-m10-m11-m12)} \quad (2)$$

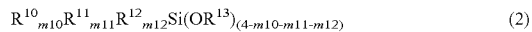

wherein $R^{13}$ represents an organic group having 1 to 6 carbon atoms; each of $R^{10}$, $R^{11}$, and $R^{12}$ represents a hydrogen atom or a monovalent organic group having 1 to 30 carbon atoms; and m10, m11, and m12 represent 0 or 1, and $0 \leq m10+m11+m12 \leq 3$.

In the present invention, reactivity to a dry etching gas is enhanced by introducing a boron atom to a silicon-containing film having high etching selectivity which has already been known in Japanese Patent No. 4716044, so that higher etching selectivity to the upperlayer photoresist than heretofore known silicon-containing compositions can be obtained.

In the silicon-containing resist underlayer film-forming composition of the present invention, the boron-containing compound (A) used in the present invention is a compound selected from the group consisting of an organic boron compound shown by the following general formula (1) and a condensation product thereof.

$$R^1{}_{m0}B(OH)_{m1}(OR)_{(3-m0-m1)} \quad (1)$$

wherein R represents an organic group having 1 to 6 carbon atoms and optionally forming a cyclic organic group by bonding of two ORS; $R^1$ represents an organic group having a hydroxyl group or a carboxyl group substituted with an acid-labile group and optionally forming a cyclic organic group by bonding of two $R^1$s; and m0 represents 1 or 2, m1 represents 0, 1, or 2, and $1 \leq m0+m1 \leq 3$.

Here, R represents an organic group having 1 to 6 carbon atoms; and specific examples thereof include a methyl group, an ethyl group, a n-propyl group, an iso-propyl group, a n-butyl group, an iso-butyl group, a sec-butyl group, a tert-butyl group, a n-pentyl group, a cyclopentyl group, a n-hexyl group, a cyclohexyl group, and a phenyl group.

Meanwhile, the organic group in the present invention means a group which contains a carbon atom; and it may further contain a hydrogen atom, and in addition, a nitrogen atom, an oxygen atom, a sulfur atom, a silicon atom, and so on.

Illustrative examples of $R^1$ in the above general formula (1) include the following groups. Meanwhile, in the following formulae, (B) is described to show the bonding site to B; and to B is bonded —OH or —OR.

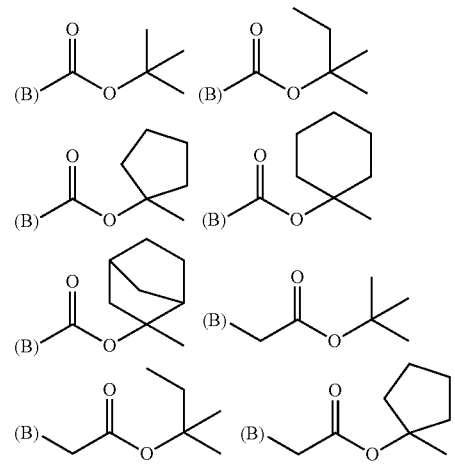

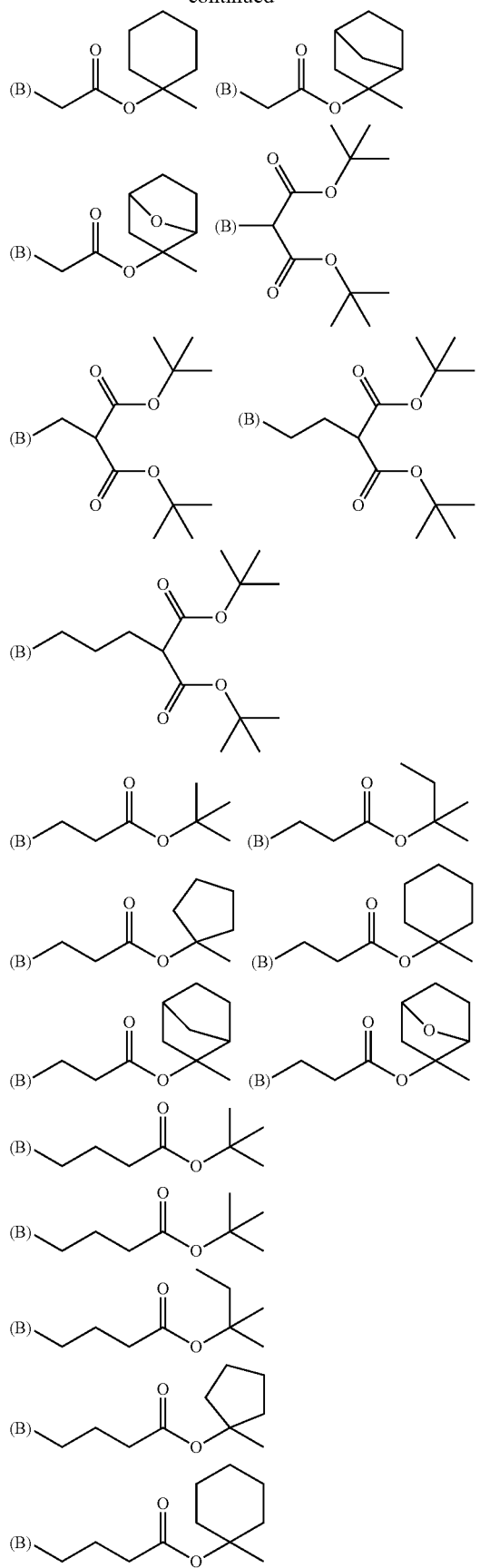
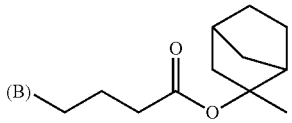
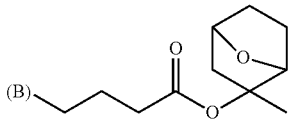
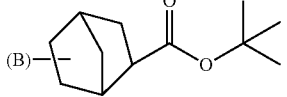
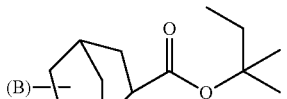
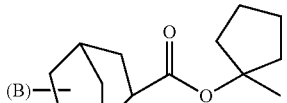
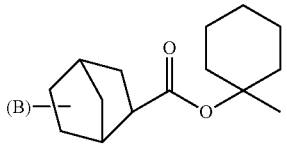
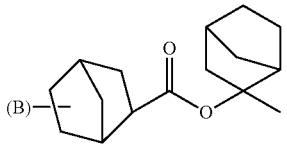
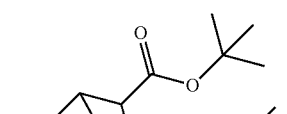
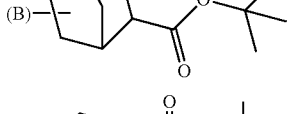
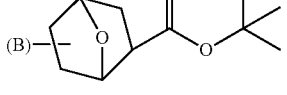
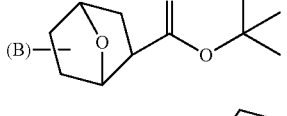
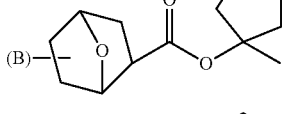
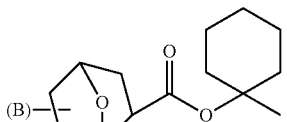

-continued
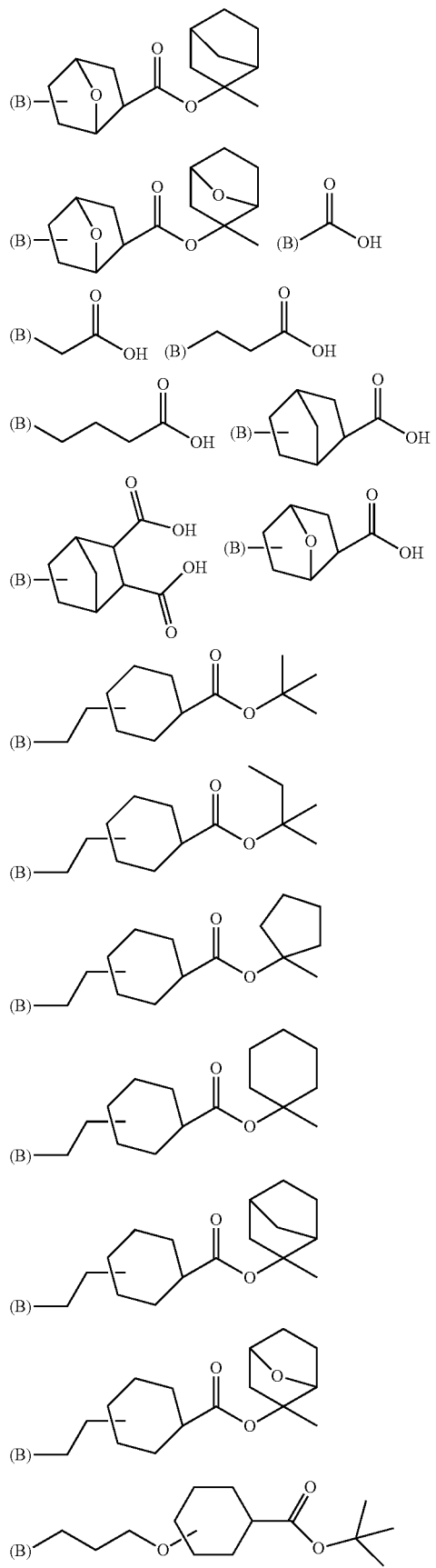
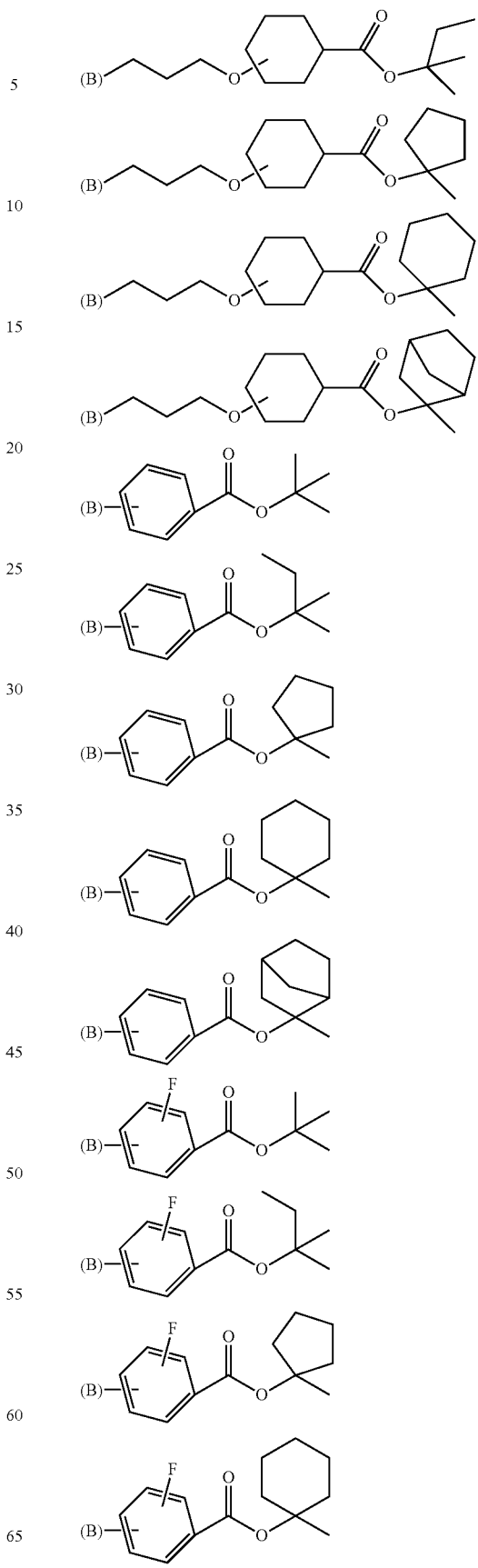

-continued
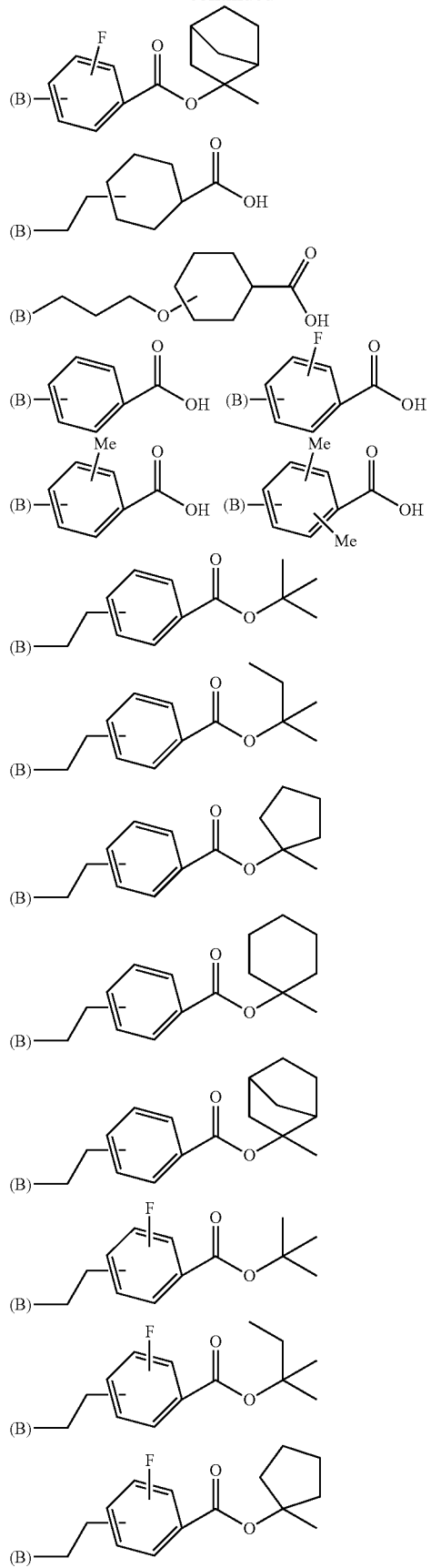
-continued
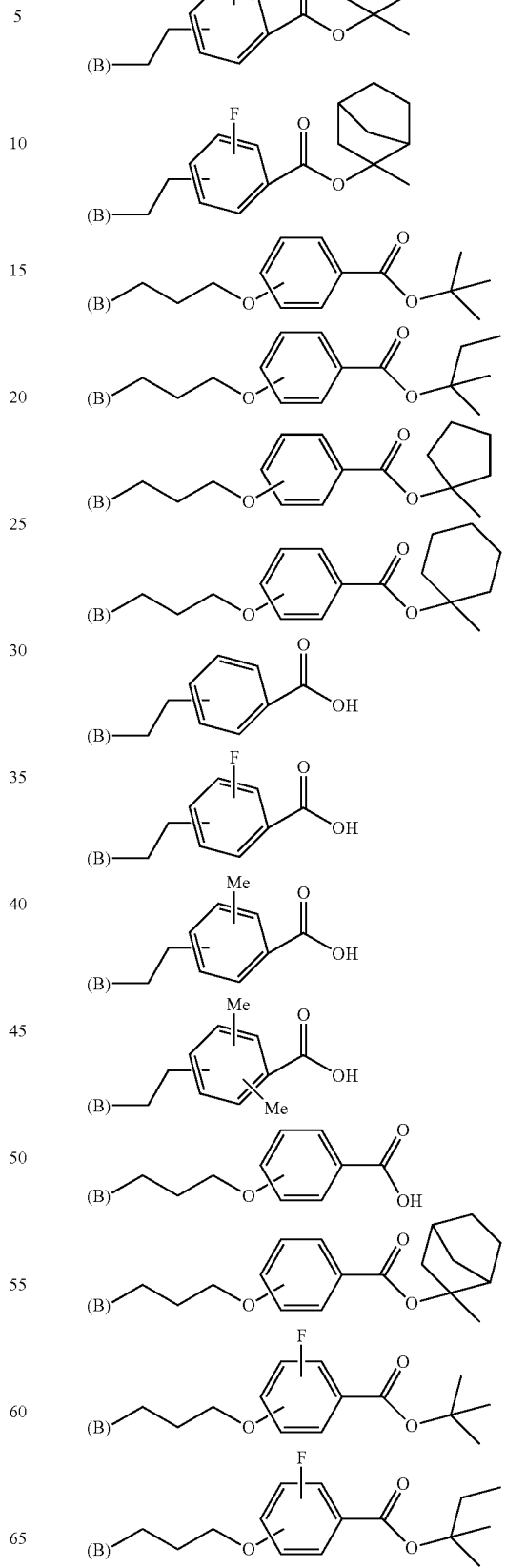

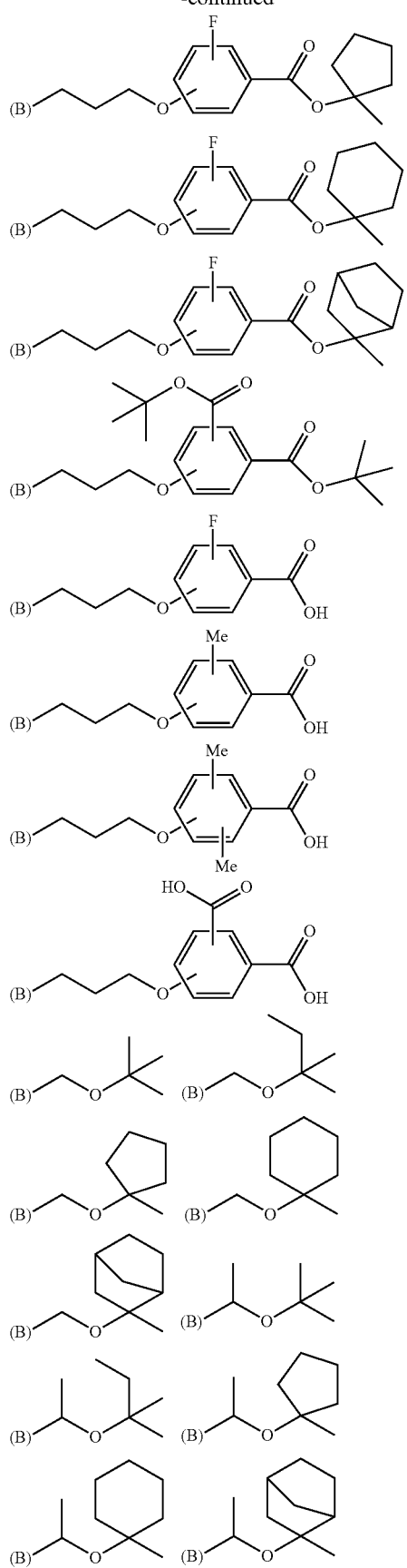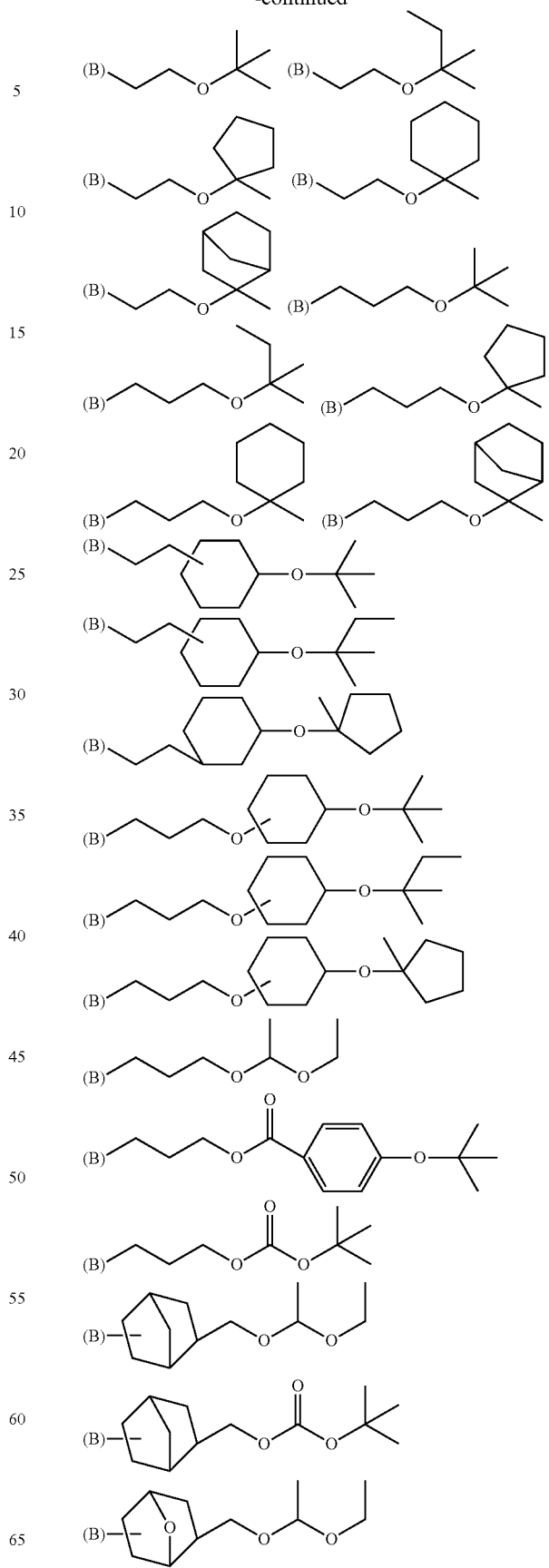

-continued
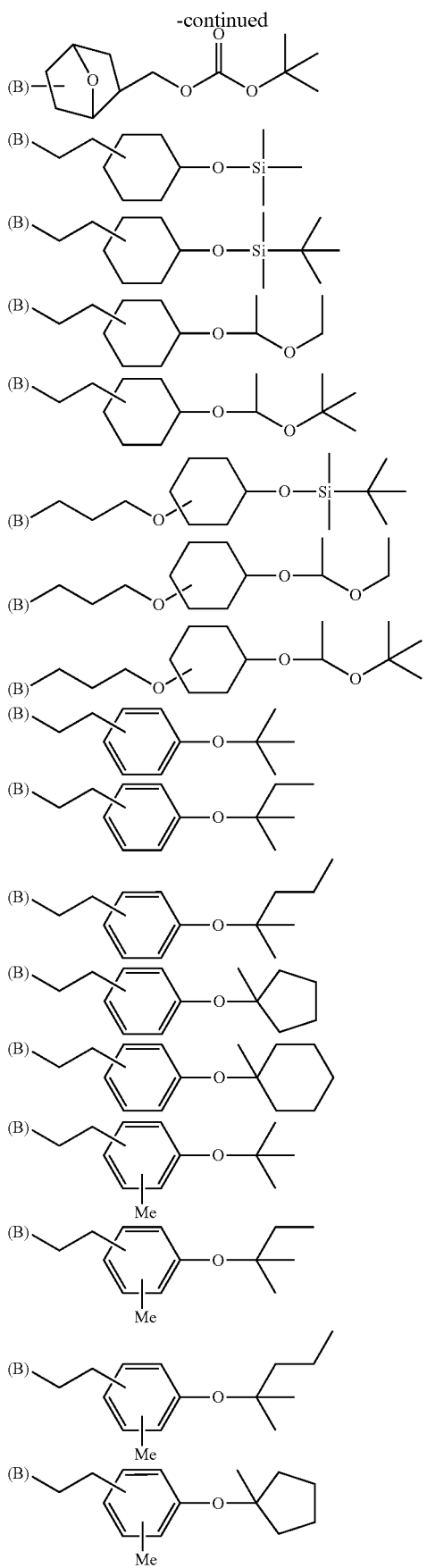
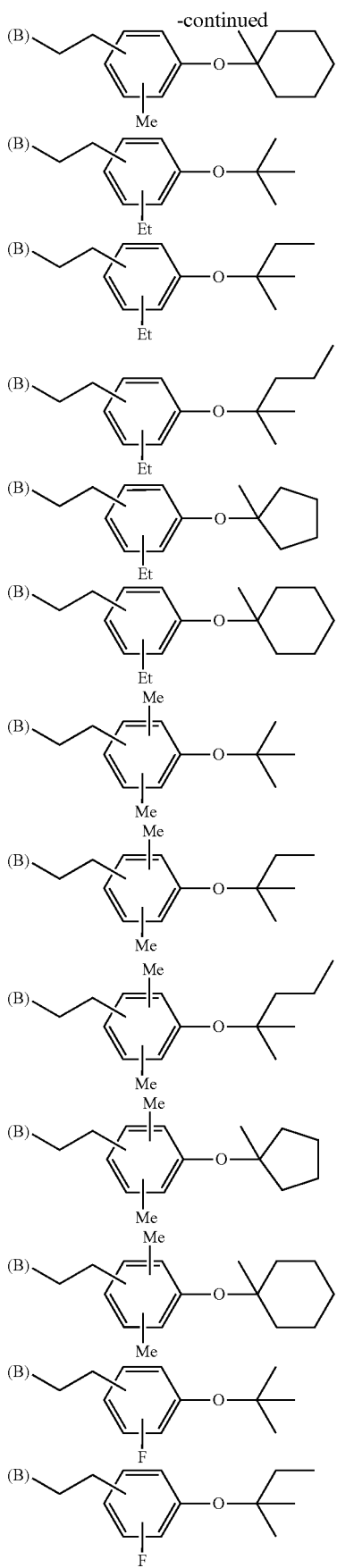

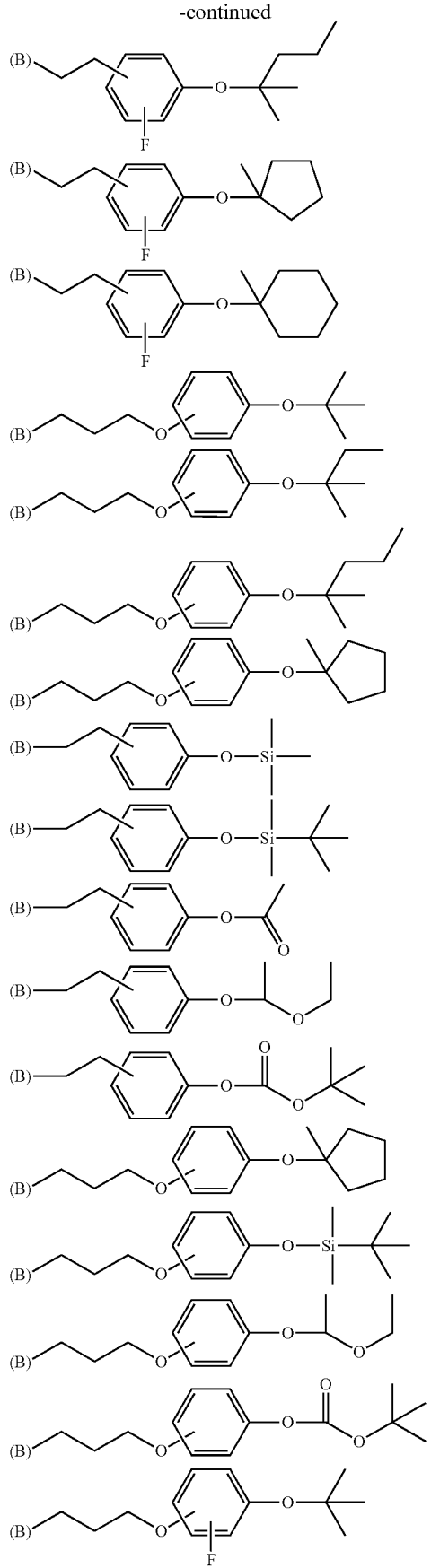
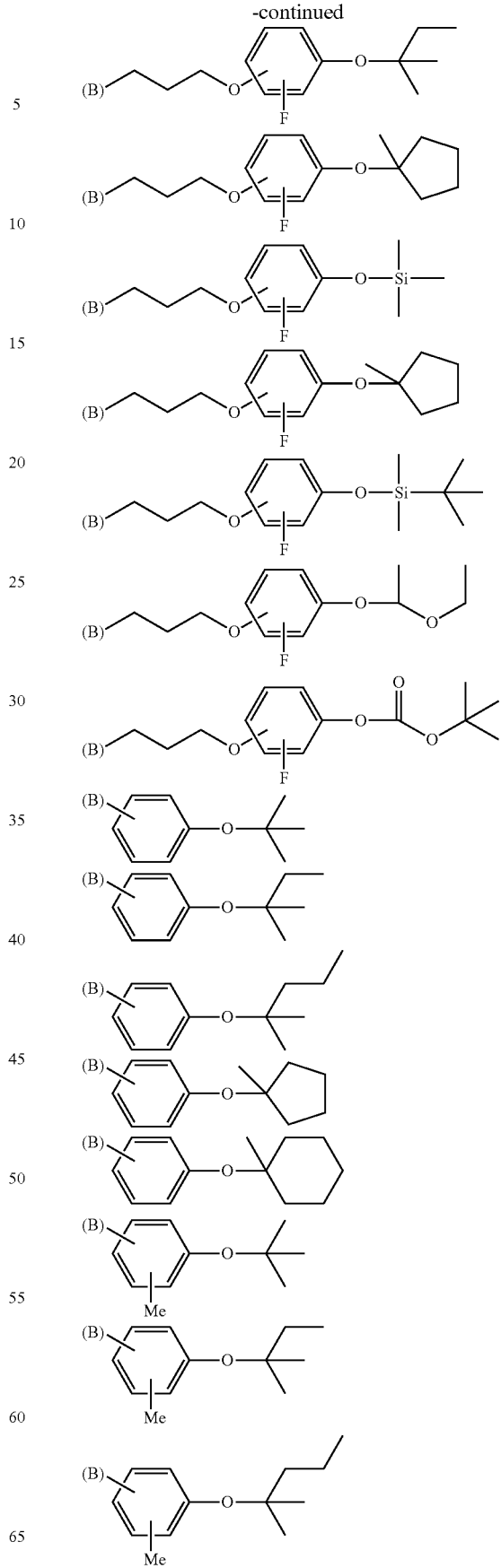

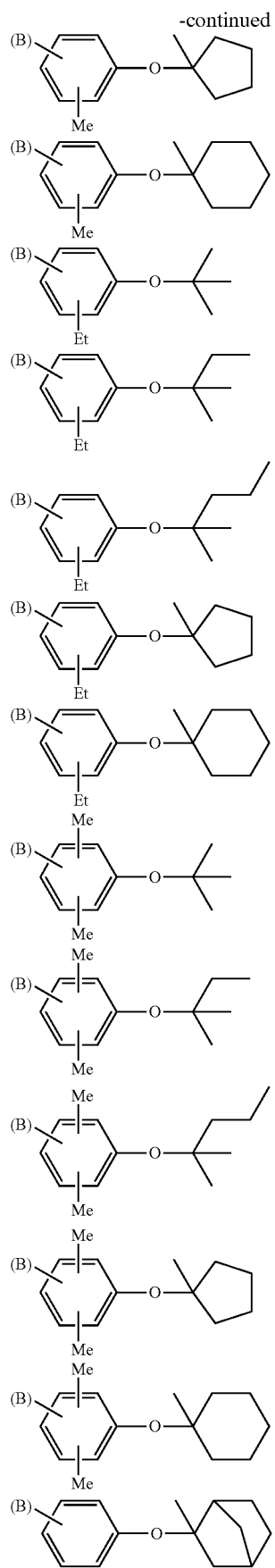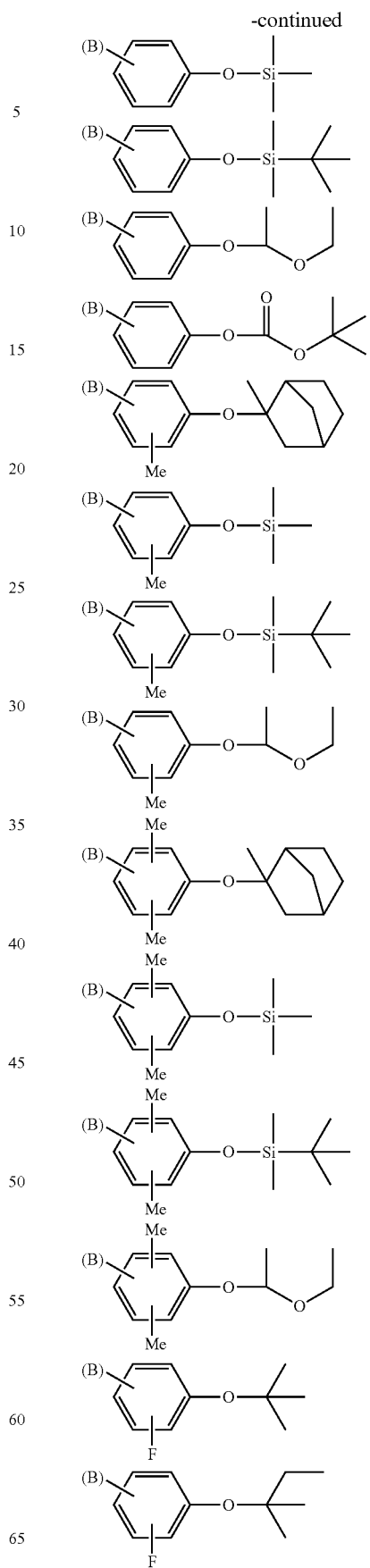

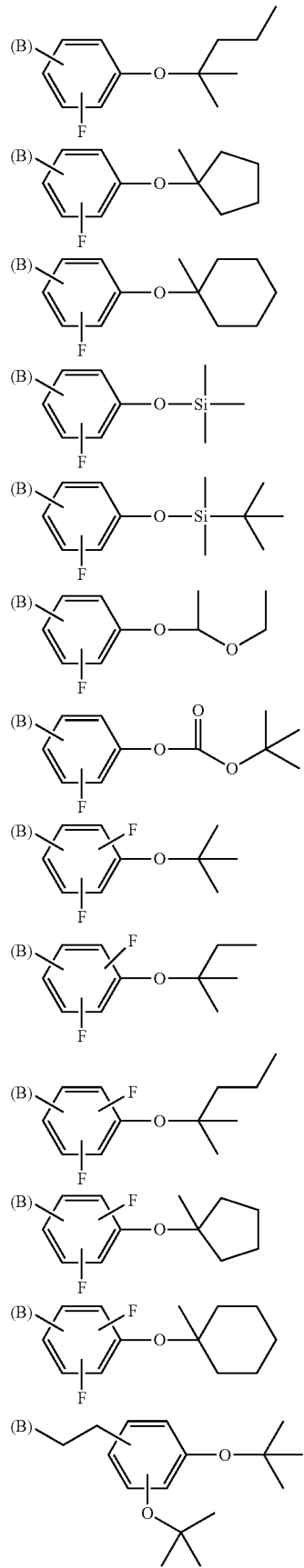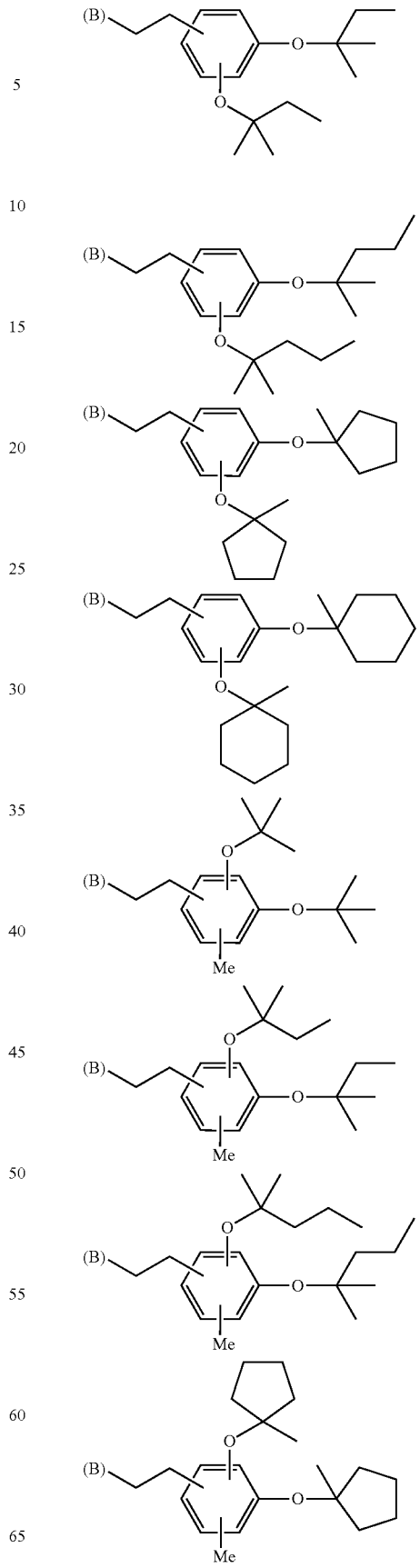

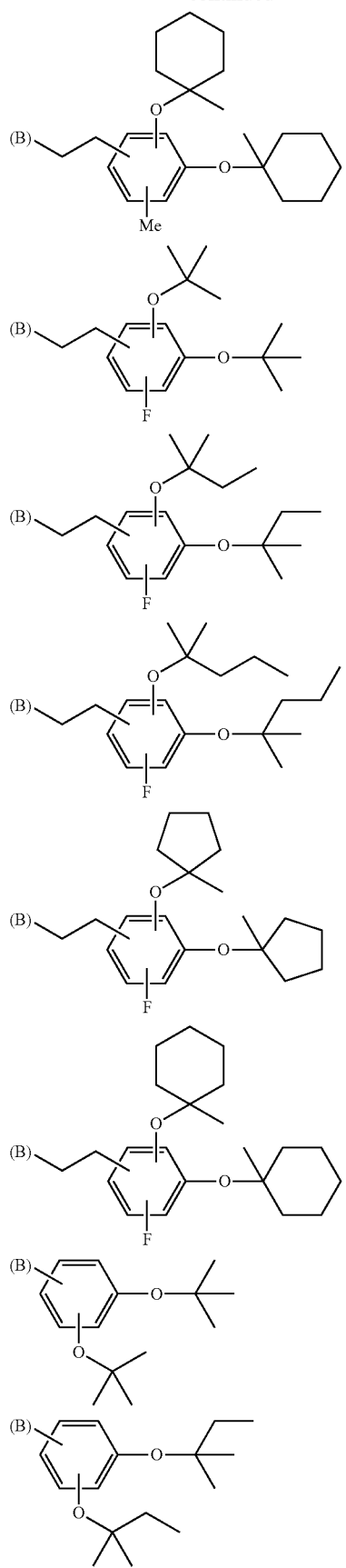
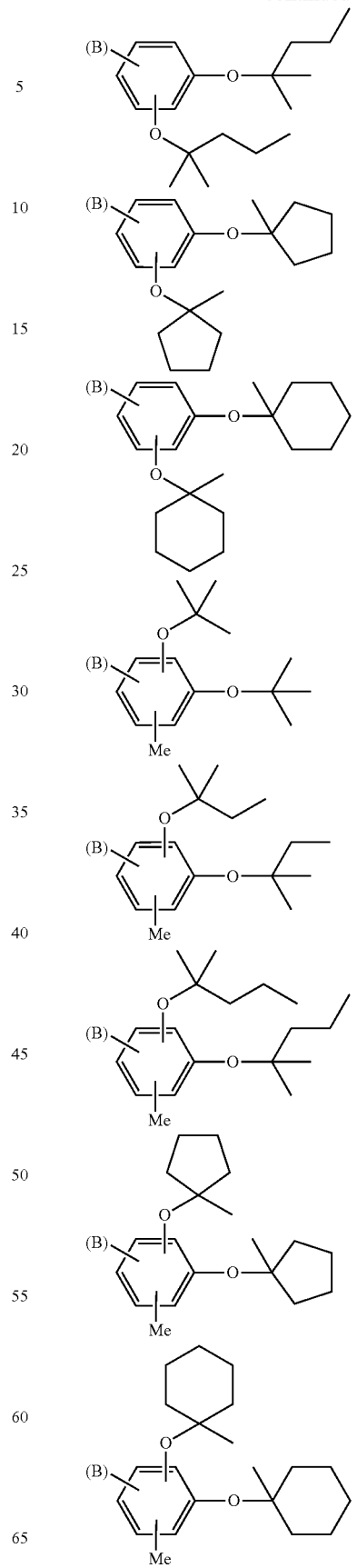

-continued

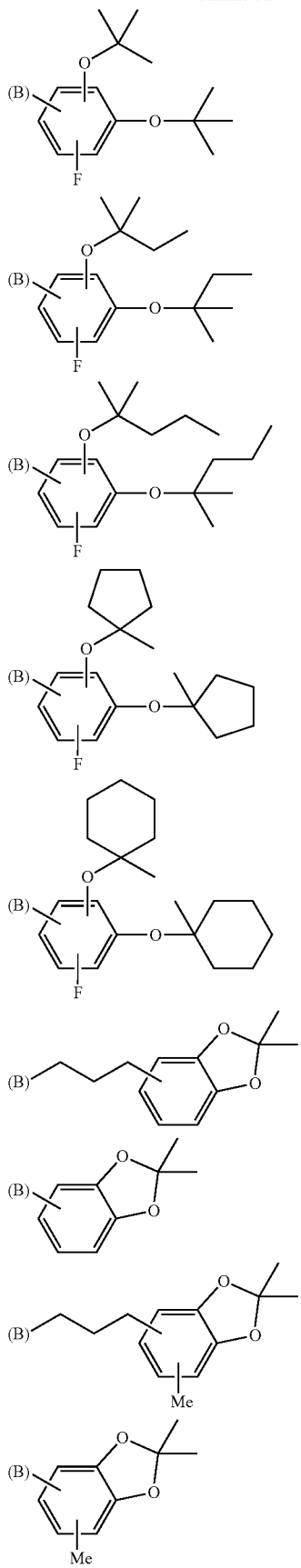

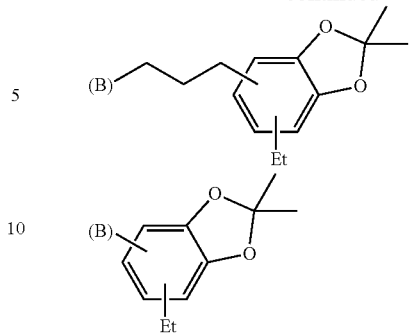

The compound (B) used in the silicon-containing resist underlayer film-forming composition of the present invention is a silicon compound shown by the following general formula (2), $$R^{10}{}_{m10}R^{11}{}_{m11}R^{12}{}_{m12}Si(OR^{13})_{(4-m10-m11-m12)} \quad (2)$$

wherein $R^{13}$ represents an organic group having 1 to 6 carbon atoms; each of $R^{10}$, $R^{11}$, and $R^{12}$ represents a hydrogen atom or a monovalent organic group having 1 to 30 carbon atoms; and m10, m11, and m12 represent 0 or 1, and $0 \leq m10+m11+m12 \leq 3$.

Illustrative examples of the organic groups of $R^{10}$, $R^{11}$, and $R^{12}$ include a monovalent, non-substituted hydrocarbon group such as a linear, a branched, or a cyclic alkyl group, an alkenyl group, an alkynyl group, an aryl group, and aralkyl group; a group having one or more of hydrogen atoms in the above groups substituted with an epoxy group, an alkoxyl group, a hydroxyl group, and so forth; a group intervened with —O—, —CO—, —OCO—, —COO—, or —OCOO— shown by the general formula (4) as mentioned later; and an organic group having a Si—Si bond.

As to the compounds shown by the above general formula (2), following compounds may be mentioned.

Illustrative examples of the tetraalkoxy silane with m10=0, m11=0, and m12=0 include tetramethoxy silane, tetraethoxy silane, tetra-n-propoxy silane, and tetra-iso-propoxy silane.

Illustrative examples of the trialkoxy silane with m10+m11+m12=1 include trimethoxy silane, triethoxy silane, tri-n-propoxy silane, tri-iso-propoxy silane, methyl trimethoxy silane, methyl triethoxy silane, methyl tri-n-propoxy silane, methyl tri-iso-propoxy silane, ethyl trimethoxy silane, ethyl triethoxy silane, ethyl tri-n-propoxy silane, ethyl tri-iso-propoxy silane, vinyl trimethoxy silane, vinyl triethoxy silane, vinyl tri-n-propoxy silane, vinyl tri-iso-propoxy silane, n-propyl trimethoxy silane, n-propyl triethoxy silane, n-propyl tri-n-propoxy silane, n-propyl tri-iso-propoxy silane, i-propyl trimethoxy silane, i-propyl triethoxy silane, i-propyl tri-n-propoxy silane, i-propyl tri-iso-propoxy silane, n-butyl trimethoxy silane, n-butyl triethoxy silane, n-butyl tri-n-propoxy silane, n-butyl tri-iso-propoxy silane, sec-butyl trimethoxy silane, sec-butyl triethoxy silane, sec-butyl tri-n-propoxy silane, sec-butyl tri-iso-propoxy silane, t-butyl trimethoxy silane, t-butyl triethoxy silane, t-butyl tri-n-propoxy silane, t-butyl tri-iso-propoxy silane, cyclopropyl trimethoxy silane, cyclopropyl triethoxy silane, cyclopropyl tri-n-propoxy silane, cyclopropyl tri-iso-propoxy silane, cyclobutyl trimethoxy silane, cyclobutyl triethoxy silane, cyclobutyl tri-n-propoxy silane, cyclobutyl tri-iso-propoxy silane, cyclopentyl trimethoxy silane, cyclopentyl triethoxy silane, cyclopentyl tri-n-propoxy silane, cyclopentyl tri-iso-propoxy silane, cyclohexyl trimethoxy silane, cyclohexyl triethoxy silane, cyclohexyl tri-n-propoxy silane, cyclohexyl tri-iso-propoxy silane, cyclohexenyl trimethoxy silane, cyclohexenyl triethoxy silane, cyclohexenyl tri-n-propoxy silane, cyclohexenyl tri-iso-propoxy silane, cyclohexenylethyl trimethoxy silane, cyclohexenylethyl triethoxy silane, cyclohexenylethyl tri-n-propoxy silane, cyclohexenylethyl tri-iso-propoxy silane, cyclooctanyl trimethoxy silane, cyclooctanyl triethoxy silane, cyclooctanyl tri-n-propoxy silane, cyclooctanyl tri-iso-propoxy silane, cyclopentadienylpropyl trimethoxy silane, cyclopentadienylpropyl triethoxy silane, cyclopentadienylpropyl tri-n-propoxy silane, cyclopentadienylpropyl tri-iso-propoxy silane, bicycloheptenyl trimethoxy silane, bicycloheptenyl triethoxy silane, bicycloheptenyl tri-n-propoxy silane, bicycloheptenyl tri-iso-propoxy silane, bicycloheptyl trimethoxy silane, bicycloheptyl triethoxy silane, bicycloheptyl tri-n-propoxy silane, bicycloheptyl tri-iso-propoxy silane, adamantyl trimethoxy silane, adamantyl triethoxy silane, adamantyl tri-n-propoxy silane, adamantyl tri-iso-propoxy silane, phenyl trimethoxy silane, phenyl triethoxy silane, phenyl tri-n-propoxy silane, phenyl tri-iso-propoxy silane, benzyl trimethoxy silane, benzyl triethoxy silane, benzyl tri-n-propoxy silane, benzyl tri-iso-propoxy silane, tolyl trimethoxy silane, tolyl triethoxy silane, tolyl tri-n-propoxy silane, tolyl tri-iso-propoxy silane, phenetyl trimethoxy silane, phenetyl triethoxy silane, phenetyl tri-n-propoxy silane, phenetyl tri-iso-propoxy silane, naphthyl trimethoxy silane, naphthyl triethoxy silane, naphthyl tri-n-propoxy silane, and naphthyl tri-iso-propoxy silane.

Illustrative examples of the dialkoxy silane with m10+m11+m12=2 include dimethyl dimethoxy silane, dimethyl diethoxy silane, methyl ethyl dimethoxy silane, methyl ethyl diethoxy silane, dimethyl di-n-propoxy silane, dimethyl di-iso-propoxy silane, diethyl dimethoxy silane, diethyl diethoxy silane, diethyl di-n-propoxy silane, diethyl di-iso-propoxy silane, di-n-propyl dimethoxy silane, di-n-propyl diethoxy silane, di-n-propyl di-n-propoxy silane, di-n-propyl di-iso-propoxy silane, di-iso-propyl dimethoxy silane, di-iso-propyl diethoxy silane, di-iso-propyl di-n-propoxy silane, di-iso-propyl di-iso-propoxy silane, di-n-butyl dimethoxy silane, di-n-butyl diethoxy silane, di-n-butyl di-n-propoxy silane, di-n-butyl di-iso-propoxy silane, di-sec-butyl dimethoxy silane, di-sec-butyl diethoxy silane, di-sec-butyl di-n-propoxy silane, di-sec-butyl di-iso-propoxy silane, di-t-butyl dimethoxy silane, di-t-butyl diethoxy silane, di-t-butyl di-n-propoxy silane, di-t-butyl di-iso-propoxy silane, di-cyclopropyl dimethoxy silane, di-cyclopropyl diethoxy silane, di-cyclopropyl di-n-propoxy silane, di-cyclopropyl di-iso-propoxy silane, di-cyclobutyl dimethoxy silane, di-cyclobutyl diethoxy silane, di-cyclobutyl di-n-propoxy silane, di-cyclobutyl di-iso-propoxy silane, dicyclopentyl dimethoxy silane, dicyclopentyl diethoxy silane, dicyclopentyl di-n-propoxy silane, dicyclopentyl di-iso-propoxy silane, dicyclohexyl dimethoxy silane, dicyclohexyl diethoxy silane, dicyclohexyl di-n-propoxy silane, dicyclohexyl di-iso-propoxy silane, dicyclohexenyl dimethoxy silane, dicyclohexenyl diethoxy silane, dicyclohexenyl di-n-propoxy silane, dicyclohexenyl di-iso-propoxy silane, dicyclohexenylethyl dimethoxy silane, dicyclohexenylethyl diethoxy silane, dicyclohexenylethyl di-n-propoxy silane, dicyclohexenylethyl di-iso-propoxy silane, dicyclooctanyl dimethoxy silane, dicyclooctanyl diethoxy silane, dicyclooctanyl di-n-propoxy silane, dicyclooctanyl di-iso-propoxy silane, dicyclopentadienylpropyl dimethoxy silane, dicyclopentadienylpropyl diethoxy silane, dicyclopentadienylpropyl di-n-propoxy silane, dicyclopentadienylpropyl di-iso-propoxy silane, bis-bicycloheptenyl dimethoxy silane, bis-bicycloheptenyl diethoxy silane, bis-bicycloheptenyl di-n-propoxy silane, bis-bicycloheptenyl di-iso-propoxy silane, bis-bicycloheptyl dimethoxy silane, bis-bicycloheptyl diethoxy silane, bis-bicycloheptyl di-n-propoxy silane, bis-bicycloheptyl di-iso-propoxy silane, bis-adamantyl dimethoxy silane, bis-adamantyl diethoxy silane, bis-adamantyl di-n-propoxy silane, bis-adamantyl di-iso-propoxy silane, diphenyl dimethoxy silane, diphenyl diethoxy silane, methyl phenyl dimethoxy silane, methyl phenyl diethoxy silane, diphenyl di-n-propoxy silane, and diphenyl di-iso-propoxy silane.

Illustrative examples of the monoalkoxy silane with m10=1, m11=1, and m12=1 include trimethyl methoxy silane, trimethyl ethoxy silane, dimethyl ethyl methoxy silane, dimethyl ethyl ethoxy silane, dimethyl phenyl methoxy silane, dimethyl phenyl ethoxy silane, dimethyl benzyl methoxy silane, dimethyl benzyl ethoxy silane, dimethyl phenethyl methoxy silane, and dimethyl phenethyl ethoxy silane.

Preferable examples of the entirety thereof include tetramethoxy silane, tetraethoxy silane, methyl trimethoxy silane, methyl triethoxy silane, ethyl trimethoxy silane, ethyl triethoxy silane, vinyl trimethoxy silane, vinyl triethoxy silane, n-propyl trimethoxy silane, n-propyl triethoxy silane, iso-propyl trimethoxy silane, iso-propyl triethoxy silane, n-butyl trimethoxy silane, n-butyl triethoxy silane, iso-butyl trimethoxy silane, iso-butyl triethoxy silane, allyl trimethoxy silane, allyl triethoxy silane, cyclopentyl trimethoxy silane, cyclopentyl triethoxy silane, cyclohexyl trimethoxy silane, cyclohexyl triethoxy silane, cyclohexenyl trimethoxy silane, cyclohexenyl triethoxy silane, phenyl trimethoxy silane, phenyl triethoxy silane, benzyl trimethoxy silane, benzyl triethoxy silane, phenetyl trimethoxy silane, phenetyl triethoxy silane, dimethyl dimethoxy silane, dimethyl diethoxy silane, diethyl dimethoxy silane, diethyl diethoxy silane, methyl ethyl dimethoxy silane, methyl ethyl diethoxy silane, di-n-propyl dimethoxy silane, di-n-butyl dimethoxy silane, methyl phenyl dimethoxy silane, methyl phenyl diethoxy silane, trimethyl methoxy silane, dimethyl ethyl methoxy silane, dimethyl phenyl methoxy silane, dimethyl benzyl methoxy silane, and dimethyl phenethyl methoxy silane.

Other examples of the organic groups represented by $R^{10}$, $R^{11}$, and $R^{12}$ include an organic group having one or more of a carbon-oxygen single bond or a carbon-oxygen double bond. Specifically, an organic group having one or more of a group selected from the group consisting of an epoxy group, an ester group, an alkoxyl group, and a hydroxyl group may be mentioned. Illustrative examples of the organic group having one or more of a carbon-oxygen single bond or a carbon-oxygen double bond in the above general formula (2) include the group shown by the following general formula (4).

$$(P\text{-}Q_1\text{-}(S_1)_{v1}\text{-}Q_2\text{-})_u\text{-}(T)_{v2}\text{-}Q_3\text{-}(S_2)_{v3}\text{-}Q_4\text{-} \quad (4)$$

wherein P represents a hydrogen atom, a hydroxyl group, epoxy ring:

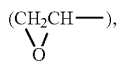

an alkoxyl group having 1 to 4 carbon atoms, an alkylcarbonyloxy group having 1 to 6 carbon atoms, or an alkylcarbonyl group having 1 to 6 carbon atoms; each of $Q_1$, $Q_2$, $Q_3$, and $Q_4$ independently represents —$C_qH_{(2q-p)}P_p$—, wherein P represents the same meaning as before, p represents an integer of 0 to 3, q represents an integer of 0 to 10 (however, q=0 means a single bond); u represents an integer of 0 to 3; each of $S_1$ and $S_2$ independently represents —O—, —CO—, —OCO—, —COO—, or —OCOO—. Each of v1, v2, and v3 independently represents 0 or 1. Concurrently with the above, T represents divalent group comprising an alicycle or an aromatic ring optionally containing a heteroatom, and illustrative examples of the alicycle or the aromatic ring T optionally containing a heteroatom such as oxygen include those shown below. In T, a bonding site between $Q_2$ and $Q_3$ is not particularly restricted; and the site is appropriately selected by considering reactivity due to steric factors, availability of commercially reagents, and so on.

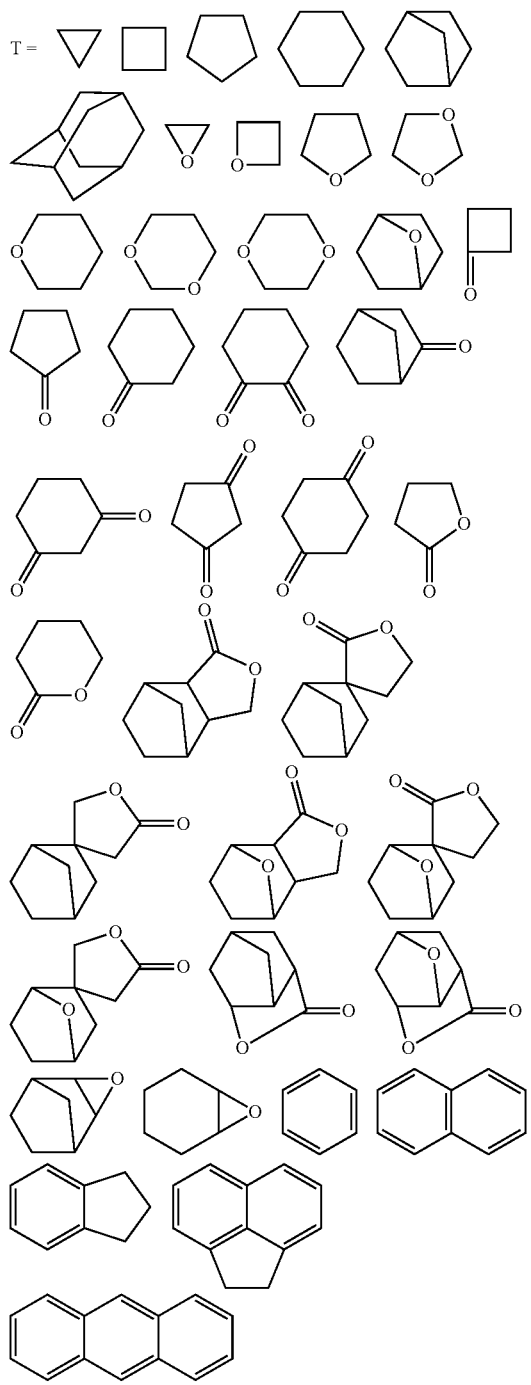

shown below. Meanwhile, in the following formulae, (Si) is described to show the bonding sites.

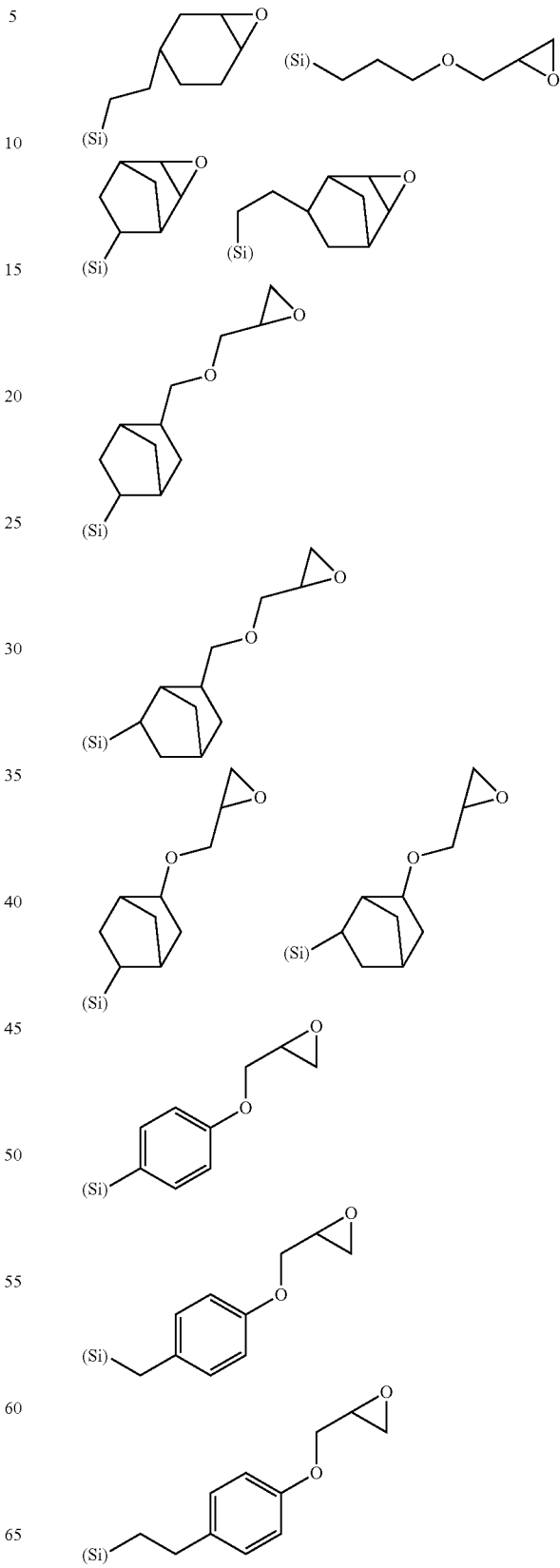

Preferable examples of the organic group having one or more of a carbon-oxygen single bond or a carbon-oxygen double bond in the above general formula (2) include those 33
-continued
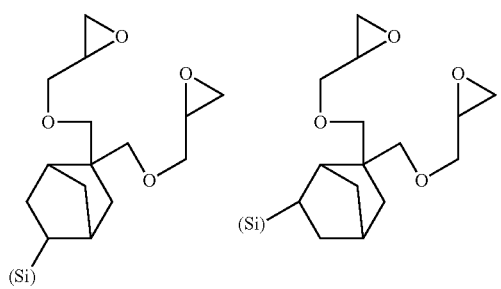
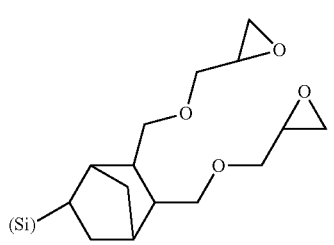
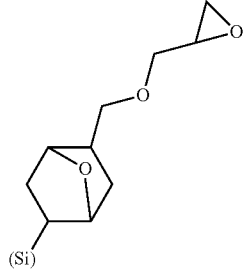
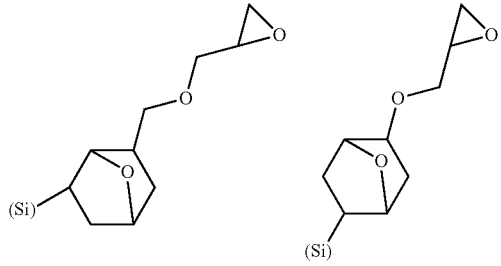
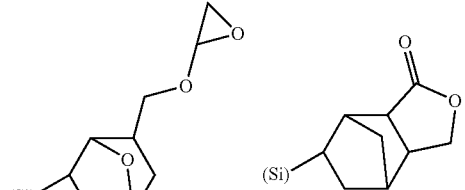
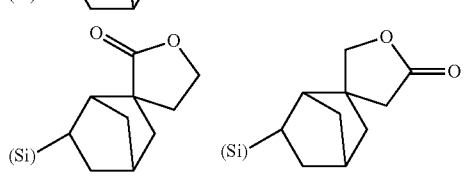
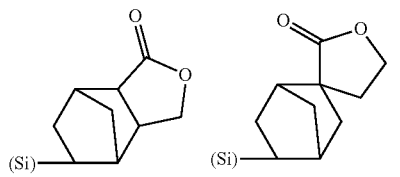
34
-continued
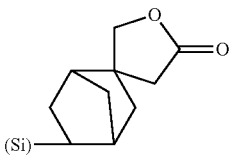
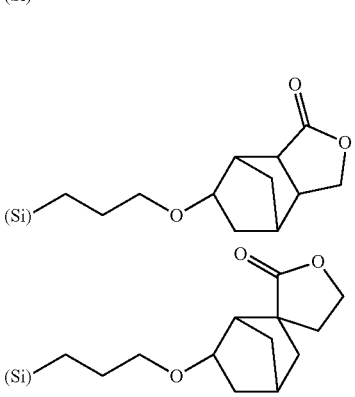
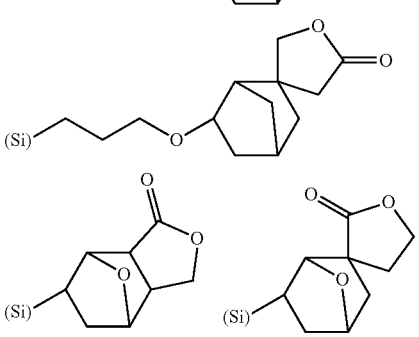
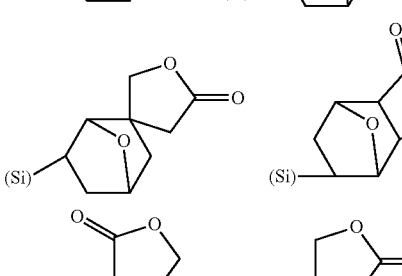
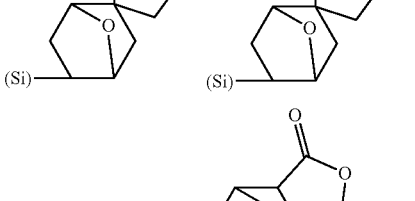
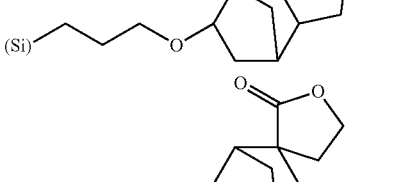
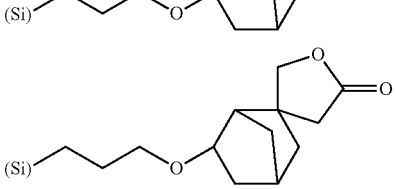

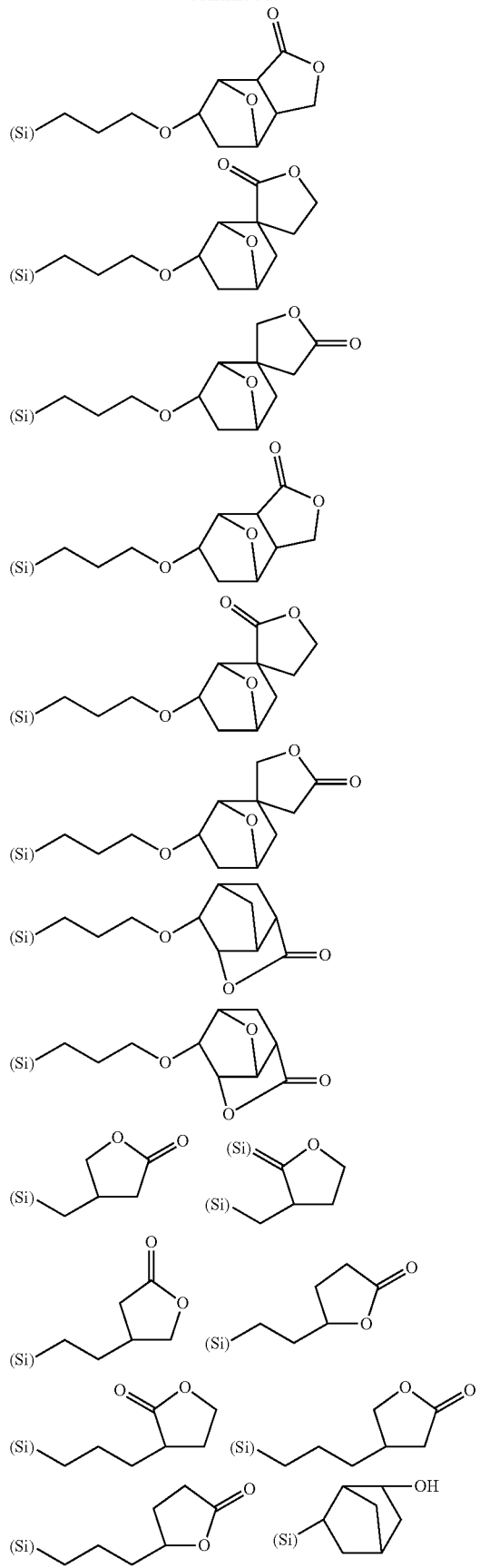
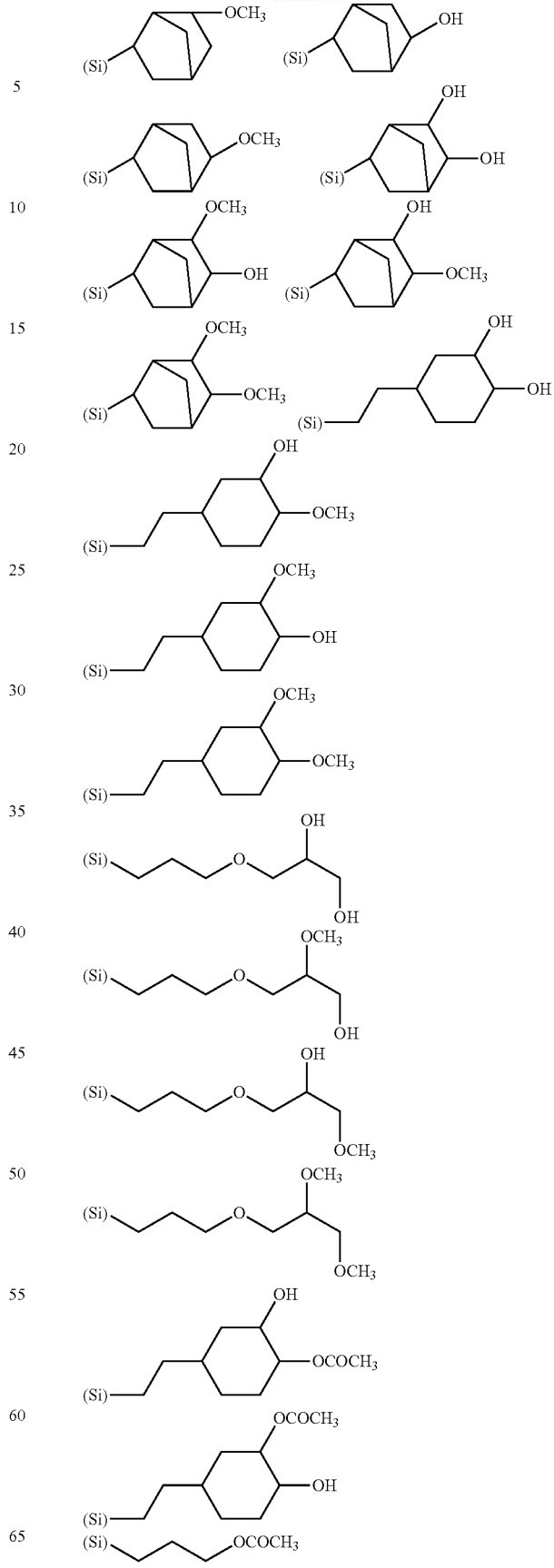

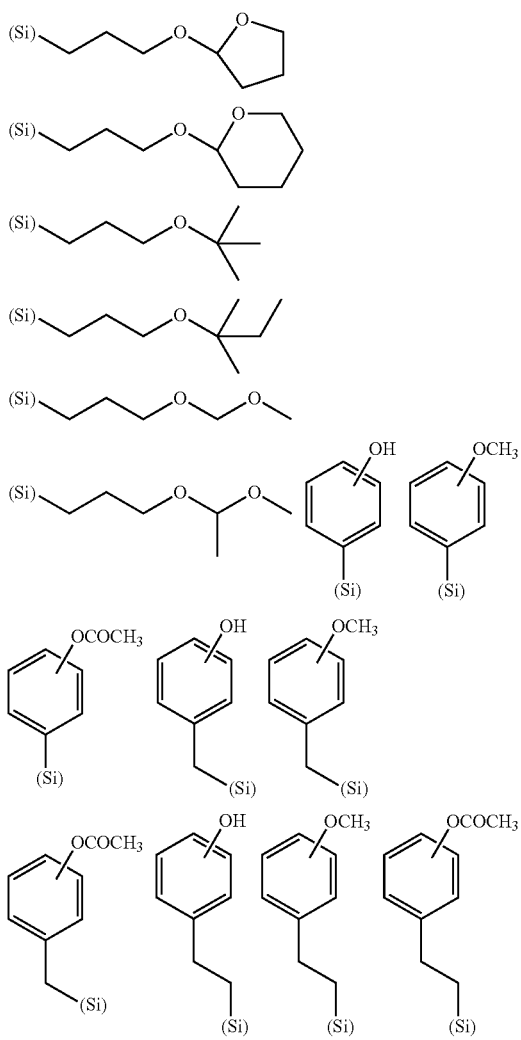

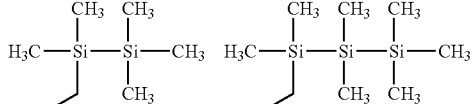

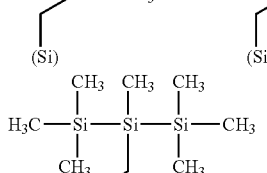

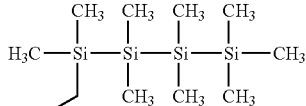

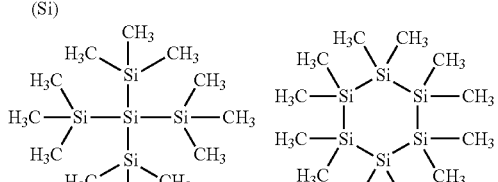

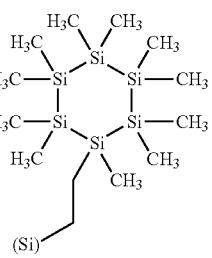

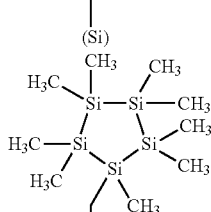

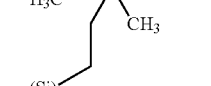

Illustrative examples of the organic groups shown by $R^{10}$, $R^{11}$, and $R^{12}$ can include an organic group having a Si—Si bond. Groups shown below are the specific examples thereof.

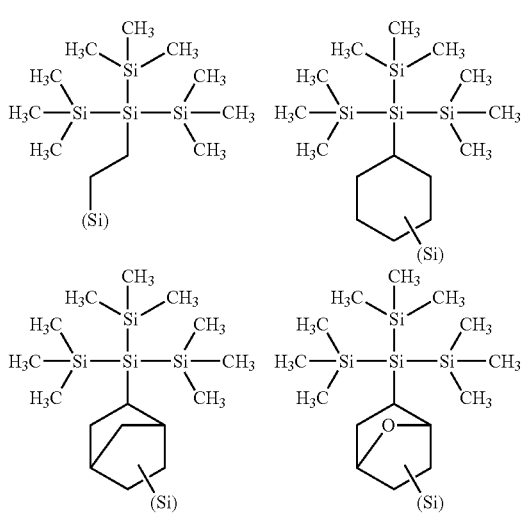

The silicon-containing resist underlayer film-forming composition of the present invention may contain any one of a condensation product and a hydrolysis condensation product or both of a mixture comprising the foregoing compound (A), the foregoing compound (B), and a compound (C) shown by the following general formula (3), $$U(OR^2)_{m2}(OR^3)_{m3}(O)_{m4} \qquad (3)$$

wherein $R^2$ and $R^3$ represent a hydrogen atom, or an organic group having 1 to 30 carbon atoms; m2+m3+m4 is a valency that is determined by a kind of U; m2, m3, and m4 represent an integer of 0 or more; and U represents an element belonging to the groups III, IV, or V in the periodic table except for carbon and silicon.

Illustrative examples of the compound shown by the above general formula (3) include the following compounds, but not limited to them.

For example, in the case that U is boron, the compounds shown by the general formula (3) are different from the compounds shown by the general formula (1); and illustrative examples thereof include, as the monomer, boron methoxide, boron ethoxide, boron propoxide, boron butoxide, boron amyloxide, boron hexyloxide, boron cyclopentoxide, boron cyclohexyloxide, boron allyloxide, boron phenoxide, boron methoxyethoxide, boric acid, and boron oxide.

In the case that U is an aluminum, illustrative examples of the compound shown by the general formula (3) include, as the monomer, aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxyethyl acetoacetate, aluminum dibutoxyethyl acetoacetate, aluminum propoxy bisethyl acetoacetate, aluminum butoxy bisethyl acetoacetate, aluminum 2,4-pentanedionate, and aluminum 2,2,6,6-tetramethyl-3,5-heptanedionate.

In the case that U is a gallium, illustrative examples of the compound shown by the general formula (3) include, as the monomer, gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxyethyl acetoacetate, gallium dibutoxyethyl acetoacetate, gallium propoxy bisethyl acetoacetate, gallium butoxy bisethyl acetoacetate, gallium 2,4-pentanedionate, and gallium 2,2,6,6-tetramethyl-3,5-heptanedionate.

In the case that U is a yttrium, illustrative examples of the compound shown by the general formula (3) include, as the monomer, yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxyethyl acetoacetate, yttrium dibutoxyethyl acetoacetate, yttrium propoxy bisethyl acetoacetate, yttrium butoxy bisethyl acetoacetate, yttrium 2,4-pentanedionate, and yttrium 2,2,6,6-tetramethyl-3,5-heptanedionate.

In the case that U is a germanium, illustrative examples of the compound shown by the general formula (3) include, as the monomer, germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, and germanium ethoxyethoxide.

In the case that U is a titanium, illustrative examples of the compound shown by the general formula (3) include, as the monomer, titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy bisethyl acetoacetate, titanium dibutoxy bisethyl acetoacetate, titanium dipropoxy bis-2,4-pentanedionate, and titanium dibutoxy bis-2,4-pentanedionate.

In the case that U is a zirconium, illustrative examples of the compound shown by the general formula (3) include, as the monomer, methoxy zirconium, ethoxy zirconium, propoxy zirconium, butoxy zirconium, phenoxy zirconium, zirconium dibutoxide bis(2,4-pentanedionate), and zirconium dipropoxide bis(2,2,6,6-tetramethyl-3,5-heptanedionate).

In the case that U is a hafnium, illustrative examples of the compound shown by the general formula (3) include, as the monomer, hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy bisethyl acetoacetate, hafnium dibutoxy bisethyl acetoacetate, hafnium dipropoxy bis-2,4-pentanedionate, and hafnium dibutoxy bis-2,4-pentanedionate.

In the case that U is a bismuth, illustrative examples of the compound shown by the general formula (3) include, as the monomer, methoxy bismuth, ethoxy bismuth, propoxy bismuth, butoxy bismuth, and phenoxy bismuth.

In the case that U is a tin, illustrative examples of the compound shown by the general formula (3) include, as the monomer, methoxy tin, ethoxy tin, propoxy tin, butoxy tin, phenoxy tin, methoxyethoxy tin, ethoxyethoxy tin, tin 2,4-pentanedionate, and tin 2,2,6,6-tetramethyl-3,5-heptanedionate.

In the case that U is a phosphorous, illustrative examples of the compound shown by the general formula (3) include, as the monomer, trimethyl phosphite, triethyl phosphite, tripropyl phosphite, trimethyl phosphate, triethyl phosphate, tripropyl phosphate, and diphosphorous pentaoxide.

In the case that U is a vanadium, illustrative examples of the compound shown by the general formula (3) include, as the monomer, vanadium oxide bis(2,4-pentanedionate), vanadium 2,4-pentanedionate, vanadium tributoxide oxide, and vanadium tripropoxide oxide.

In the case that U is an arsenic, illustrative examples of the compound shown by the general formula (3) include, as the monomer, methoxy arsenic, ethoxy arsenic, propoxy arsenic, butoxy arsenic, and phenoxy arsenic.

In the case that U is an antimony, illustrative examples of the compound shown by the general formula (3) include, as the monomer, methoxy antimony, ethoxy antimony, propoxy antimony, butoxy antimony, phenoxy antimony, antimony acetate, and antimony propionate.

In the case that U is a niobium, illustrative examples of the compound shown by the general formula (3) include, as the monomer, methoxy niobium, ethoxy niobium, propoxy niobium, butoxy niobium, and phenoxy niobium.

In the case that U is a tantalum, illustrative examples of the compound shown by the general formula (3) include, as the monomer, methoxy tantalum, ethoxy tantalum, propoxy tantalum, butoxy tantalum, and phenoxy tantalum.

In the silicon-containing resist underlayer film-forming composition of the present invention, a mixture obtained by selecting and mixing, before or after the reaction, one or more of the compound (A) shown by the general formula (1), one or more of the compound (B) shown by the general formula (2), and as necessary, one or more of the compound (C) shown by the general formula (3) can be used as the reaction raw materials (hereinafter, this mixture is sometimes referred to as "monomer mixture") to make any one of the condensation product and the hydrolysis condensation product or both (hereinafter, these products are sometimes referred to as "silicon-containing compound").

[Synthesis Methods of Silicon-Containing Compounds]
(Synthesis Method 1: Synthesis of a Condensation Product)

A condensation product can be produced from the monomer mixture.

A product can be obtained by operation procedures in which the monomer mixture is heated at the temperature ranging from room temperature to reflux temperature of a reaction mixture by using an acid catalyst or a base catalyst described in the following synthesis method, or without a catalyst, followed by aging the reaction mixture. This method is particularly preferable when m1 in the component (A) is 1 or 2.

At this time, an organic solvent may be added thereto, if necessary. Illustrative examples of the organic solvent include an alcohol solvent such as methanol, ethanol, and butanol; an ether solvent such as tetrahydrofuran and butyl ether; an ester solvent such as propylene glycol methyl ether acetate; a ketone solvent such as methyl isobutyl ketone, methyl amyl ketone, and cyclohexanone; and a hydrocarbon solvent such as hexane and toluene.

As the condensation takes place, an alcohol is by-produced; and with this, progress of the reaction can also be confirmed. The reaction can be stopped by resuming a room temperature when the reaction takes place appropriately.

After the reaction, a condensation product is obtained, if necessary, by removing the organic solvent used in the reaction and the by-produced alcohol under conditions of proper temperature and pressure. The condensation product thus obtained may be used, as it is, as a component (as a base polymer) of the silicon-containing resist underlayer film-forming composition. Alternatively, the condensation product may be used in the subsequent operation without removing the organic solvent used in the reaction and the by-produced alcohol.

Further alternatively, a product after the hydrolysis condensation by an acid catalyst or a base catalyst may be used as a component of the silicon-containing resist underlayer film-forming composition as shown below.

(Synthesis Method 2: Synthesis of a Hydrolysis Condensation Product by Using an Acid Catalyst)

A hydrolysis condensation product of the present invention can be produced by hydrolysis condensation of a monomer mixture, or the foregoing condensation product, or a mixture containing the foregoing condensation product and other monomer by using one or more kinds of an acid catalyst selected from an organic acid, an inorganic acid, and so on.

Illustrative examples of the acid catalyst used for this reaction include formic acid, acetic acid, oxalic acid, maleic acid, trifluoroacetic acid, hydrofluoric acid, hydrochloric acid, hydrobromic acid, sulfuric acid, nitric acid, perchloric acid, phosphoric acid, methanesulfonic acid, benzenesulfonic acid, and toluenesulfonic acid. Use amount of the catalyst is $1 \times 10^{-6}$ to 10 moles, preferably $1 \times 10^{-5}$ to 5 moles, or more preferably $1 \times 10^{-1}$ to 1 mole, relative to 1 mole of the monomer mixture and so on.

Amount of water to obtain the hydrolysis condensation product by the hydrolysis condensation reaction of the monomer mixture and so on is preferably 0.01 to 100 moles, more preferably 0.05 to 50 moles, or still more preferably 0.1 to 30 moles, relative to 1 mole of the hydrolysable substituent which is bonded to the monomer mixture and so on. When the amount is less than 100 moles, small equipment can be used for the reaction; and thus, it is economical.

Operational procedure of adding the monomer mixture and so on into an aqueous catalyst solution is employed to start the hydrolysis condensation reaction. At this time, an organic solvent may be added in the aqueous catalyst solution, or the monomer mixture and so on may be diluted by an organic solvent, or both of them may be done. The reaction temperature is 0 to 100° C., or preferably 5 to 80° C. A method, in which the temperature thereof is kept at 5 to 80° C. during the time of gradual addition of the monomer mixture and so on, and then, aging is done at 20 to 80° C., is preferable.

Preferable examples of the organic solvent which can be added to the aqueous catalyst solution or can dilute the monomer mixture and so on include methanol, ethanol, 1-propanol, 2-propanol, 1-butanol, 2-butanol, 2-methyl-1-propanol, acetone, acetonitrile, tetrahydrofurane, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, and a mixture of these solvents.

Among these solvents, a water-soluble solvent is preferable. Illustrative examples thereof include an alcohol such as methanol, ethanol, 1-propanol, and 2-propanol; a polyol such as ethylene glycol and propylene glycol; a polyol condensation derivative such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether; acetone, acetonitrile, and tetrahydrofurane. Among them, a solvent having a boiling point of 100° C. or lower is particularly preferable.

Meanwhile, use amount of the organic solvent is preferably 0 to 1,000 mL, or particularly 0 to 500 mL, relative to 1 mole of the monomer mixture and so on. Less use amount of the organic solvent is more economical because the reaction vessel becomes smaller.

Thereafter, a neutralization reaction of the catalyst is carried out, if necessary, to obtain an aqueous solution of a hydrolysis condensation product. Use amount of an alkaline substance for neutralization is preferably 0.1 to 2 equivalents relative to the acid used as the catalyst. Any alkaline substance may be used as far as the substance shows properties of an alkaline in water.

Then, it is preferable to remove by-products such as an alcohol produced by the hydrolysis condensation reaction from the aqueous solution of the hydrolysis condensation product under reduced pressure or the like. Temperature to heat the aqueous solution of the hydrolysis condensation product in this operation is preferably 0 to 100° C., more preferably 10 to 90° C., or still more preferably 15 to 80° C., though it depends on kinds of a used organic solvent and a produced alcohol and so forth. Degree of vacuum in this operation is preferably an atmospheric pressure or lower, more preferably 80 kPa or lower in absolute pressure, or still more preferably 50 kPa or lower in absolute pressure, though it depends on kinds of an organic solvent and an alcohol and so forth to be removed, exhausting equipment, condensation equipment, and heating temperature. Although it is difficult to know exactly an amount of the alcohol removed, it is preferable that about 80% or more by mass of a produced alcohol and so forth is removed.

Then, the acid catalyst used in the hydrolysis condensation reaction may be removed from the hydrolysis condensation product. The acid catalyst may be removed by mixing water with the hydrolysis condensation product, and then the hydrolysis condensation product is extracted by an organic solvent. An organic solvent which can dissolve the hydrolysis condensation product and which can be separated into two layers when mixed with water is preferably used. Illustrative examples of the organic solvent include methanol, ethanol, 1-propanol, 2-propanol, 1-butanol, 2-butanol, 2-methyl-1-propanol, acetone, tetrahydrofurane, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, and a mixture of them.

In addition, a mixture of a water-soluble organic solvent and a water-hardly soluble organic solvent may also be used. Illustrative examples of the preferable mixture include a mixture of methanol and ethyl acetate, a mixture of ethanol and ethyl acetate, a mixture of 1-propanol and ethyl acetate, a mixture of 2-propanol and ethyl acetate, a mixture of butanediol monomethyl ether and ethyl acetate, a mixture of propylene glycol monomethyl ether and ethyl acetate, a mixture of ethylene glycol monomethyl ether and ethyl acetate, a mixture of butanediol monoethyl ether and ethyl acetate, a mixture of propylene glycol monoethyl ether and ethyl acetate, a mixture of ethylene glycol monoethyl ether and ethyl acetate, a mixture of butanediol monopropyl ether and ethyl acetate, a mixture of propylene glycol monopropyl ether and ethyl acetate, a mixture of ethylene glycol monopropyl ether and ethyl acetate, a mixture of methanol and methyl isobutyl ketone, a mixture of ethanol and methyl isobutyl ketone, a mixture of 1-propanol and methyl isobutyl ketone, a mixture of 2-propanol and methyl isobutyl ketone, a mixture of propylene glycol monomethyl ether and methyl isobutyl ketone, a mixture of ethylene glycol monomethyl ether and methyl isobutyl ketone, a mixture of propylene glycol monoethyl ether and methyl isobutyl ketone, a mixture of ethylene glycol monoethyl ether and methyl isobutyl ketone, a mixture of propylene glycol monopropyl ether and methyl isobutyl ketone, a mixture of ethylene glycol monopropyl ether and methyl isobutyl ketone, a mixture of methanol and cyclopentyl methyl ether, a mixture of ethanol and cyclopentyl methyl ether, a mixture of 1-propanol and cyclopentyl methyl ether, a mixture of 2-propanol and cyclopentyl methyl ether, a mixture of propylene glycol monomethyl ether and cyclopentyl methyl ether, a mixture of ethylene glycol monomethyl ether and cyclopentyl methyl ether, a mixture of propylene glycol monoethyl ether and cyclopentyl methyl ether, a mixture of ethylene glycol monoethyl ether and cyclopentyl methyl ether, a mixture of propylene glycol monopropyl ether and cyclopentyl methyl ether, a mixture of ethylene glycol monopropyl ether and cyclopentyl methyl ether, a mixture of methanol and propylene glycol methyl ether acetate, a mixture of ethanol and propylene glycol methyl ether acetate, a mixture of 1-propanol and propylene glycol methyl ether acetate, a mixture of 2-propanol and propylene glycol methyl ether acetate, a mixture of propylene glycol monomethyl ether and propylene glycol methyl ether acetate, a mixture of ethylene glycol monomethyl ether and propylene glycol methyl ether acetate, a mixture of propylene glycol monoethyl ether and propylene glycol methyl ether acetate, a mixture of ethylene glycol monoethyl ether and propylene glycol methyl ether acetate, a mixture of propylene glycol monopropyl ether and propylene glycol methyl ether acetate, and a mixture of ethylene glycol monopropyl ether and propylene glycol methyl ether acetate, though the combination is not limited to the above.

Meanwhile, mixing ratio of the water-soluble organic solvent to the water-hardly soluble organic solvent is appropriately selected; but the amount of the water-soluble organic solvent is 0.1 to 1,000 parts by mass, preferably 1 to 500 parts by mass, or more preferably 2 to 100 parts by mass, relative to 100 parts by mass of the water-hardly soluble organic solvent.

Then, washing by neutral water may be done. So-called de-ionized water or ultrapure water may be used. Amount of this water is 0.01 to 100 liters, preferably 0.05 to 50 liters, more preferably 0.1 to 5 liters, relative to 1 liter of the hydrolysis condensation product solution. The operation may be done in such a way that the both solutions are mixed in a vessel by agitation, and then settled to separate a water layer. Number of washing is 1 or more, or preferably 1 to 5, because washing of 10 times or more is not worth to have full effects.

Alternatively, the acid catalyst may be removed by use of an ion-exchange resin, or in such a way that it is neutralized by an epoxy compound such as ethylene oxide and propylene oxide, and then removed. These methods may be selected appropriately according to the acid catalyst used in the reaction.

In this operation of water-washing, number of washing and amount of water for washing may be determined appropriately in view of effects of catalyst removal and fractionation because there is an instance that a part of the hydrolysis condensation product escapes into a water layer thereby substantially the same effect as fractionation operation can be obtained.

To any of the aqueous hydrolysis condensation product solution having the remaining acid catalyst and the hydrolysis condensation product solution having the acid catalyst removed is added a final solvent, and then solvents therein are exchanged under reduced pressure to obtain an intended solution of the hydrolysis condensation product. Temperature at the time of the solvent exchange is preferably 0 to 100° C., more preferably 10 to 90° C., or still more preferably 15 to 80° C., though it is depending on the reaction solvent and the extraction solvent to be removed. Degree of vacuum in this operation is preferably an atmospheric pressure or lower, more preferably 80 kPa or lower in absolute pressure, or still more preferably 50 kPa or lower in absolute pressure, though it depends on kinds of the extraction solvent to be removed, exhausting equipment, condensation equipment, and heating temperature.

In this operation, there is an instance that the hydrolysis condensation product becomes unstable by the solvent exchange. This occurs depending on compatibility of a final solvent with the hydrolysis condensation product; and in order to prevent this from occurring, an alcohol having the valency of one or more which has a cyclic ether as a substituent described in paragraphs (0181) to (0182) in the Japanese Patent Laid-Open Publication No. 2009-126940 may be added as a stabilizer. Adding amount thereof is 0 to 25 parts by mass, preferably 0 to 15 parts by mass, more preferably 0 to 5 parts by mass, or 0.5 parts or more by mass when it is added, relative to 100 parts by mass of the hydrolysis condensation product contained in the solution before the solvent exchange. The solvent exchange may be done, if necessary, with addition of an alcohol having the valency of one or more which has a cyclic ether as a substituent into the solution before the solvent exchange.

There is a fear that the hydrolysis condensation product undergoes the condensation reaction further when it is concentrated beyond a certain concentration level whereby changing to the state where it cannot be redissolved into an organic solvent; and thus, it is preferable that the product is kept in the state of solution with proper concentration. However, if the concentration thereof is too dilute, amount of the solvent becomes excessively large; and thus, to keep the solution in the state of proper concentration is economical and preferable. Preferable concentration at this time is in the range of 0.1 to 20% by mass.

A preferable solvent finally added to the hydrolysis condensation product solution is an alcohol solvent; and especially preferable solvents are monoalkyl ether derivatives of ethylene glycol, diethylene glycol, triethylene glycol, propylene glycol, dipropylene glycol, butanediol, and so on. Specific examples of the preferable solvent include butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether.

Alternatively, if these solvents are a main solvent, a non-alcoholic solvent may be added thereinto as an adjuvant solvent. Illustrative examples of this adjuvant solvent include acetone, tetrahydrofurane, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, and cyclopentyl methyl ether.

Still alternatively, a high boiling point solvent having a boiling point of 180° C. or higher, or preferably 180° C. or higher and 300° C. or lower, may be added. Illustrative examples thereof include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropyelene glycol, glycerin, n-nonyl acetate, ethylene glycol monoethyl ether acetate, 1,2-diacetoxyethane, 1-acetoxy-2-methoxyethane, 1,2-diacetoxypropane, diethylene glycol monomethyl ether acetate, diethylene glycol monoethyl ether acetate, diethylene glycol mono-n-butyl ether acetate, propylene glycol monomethyl ether acetate, propylene glycol monopropyl ether acetate, propylene glycol monobutyl ether acetate, dipropylene glycol monomethyl ether acetate, and dipropylene glycol monoethyl ether acetate.

In an alternative operational procedure using an acid catalyst, the hydrolysis reaction is started by adding water or a water-containing organic solvent into a monomer mixture and so on or into an organic solution of a monomer mixture and so on. In this operation, the catalyst may be added into the monomer mixture and so on or the organic solution of a monomer mixture and so on, or into water or the water-containing organic solvent. The reaction temperature is 0 to 100° C., or preferably 10 to 80° C. A method, in which the temperature thereof is kept at 10 to 50° C. during the time of gradual addition of water, and then, aging is done at 20 to 80° C., is preferable.

When the organic solvent is used, a water-soluble solvent is preferable. Illustrative examples thereof include methanol, ethanol, 1-propanol, 2-propanol, 1-butanol, 2-butanol, 2-methyl-1-propanol, acetone, tetrahydrofurane, acetonitrile; and a polyol condensation derivative such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, propylene glycol monopropyl ether acetate; and a mixture of these solvents.

Use amount of these organic solvents is preferably 0 to 1,000 mL, or particularly 0 to 500 mL, relative to 1 mole of the monomer mixture and so on. Less use amount of the organic solvent is more economical because the reaction vessel becomes smaller. Post treatment of the reaction mixture thus obtained is done in a manner similar to those mentioned before, whereby obtaining the hydrolysis condensation product.

(Synthesis Method 3: Synthesis of a Hydrolysis Condensation Product by Using a Base Catalyst)

Alternatively, the hydrolysis condensation product can be produced by carrying out the hydrolysis condensation of the monomer mixture and so on in the presence of a base catalyst. Illustrative examples of the base catalyst used in this operation include methylamine, ethylamine, propylamine, butylamine, ethylene diamine, hexamethylene diamine, dimethylamine, diethylamine, ethyl methyl amine, trimethylamine, triethylamine, tripropylamine, tributylamine, cyclohexylamine, dicyclohexylamine, monoethanol amine, diethanol amine, dimethyl monoethanol amine, monomethyl diethanol amine, triethanol amine, diazabicyclooctane, diazabicyclononene, diazabicycloundecene, hexamethylene tetramine, aniline, N,N-dimethylaniline, pyridine, N,N-dimethylaminopyridine, pyrrole, piperazine, pyrrolidine, piperidine, picoline, tetramethyl ammonium hydroxide, choline hydroxide, tetrapropyl ammonium hydroxide, tetrabutyl ammonium hydroxide, ammonia, lithium hydroxide, sodium hydroxide, potassium hydroxide, barium hydroxide, and calcium hydroxide. Use amount of the catalyst is $1 \times 10^{-6}$ to 10 moles, preferably $1 \times 10^{-5}$ to 5 moles, and more preferably $1 \times 10^{-4}$ to 1 mole, relative to 1 mole of the monomer mixture and so on.

Amount of water to obtain the hydrolysis condensation product by the hydrolysis condensation reaction of the foregoing monomer mixture and so on is preferably 0.1 to 50 moles, relative to 1 mole of the hydrolysable substituent which is bonded to the monomer mixture and so on. When the amount is 50 moles or less, small equipment can be used for the reaction; and thus, it is economical.

Operational procedure of adding the monomer mixture and so on into an aqueous catalyst solution is employed to start the hydrolysis condensation reaction. At this time, an organic solvent may be added in the aqueous catalyst solution, or the monomer mixture and so on may be diluted by an organic solvent, or both of them may be done. The reaction temperature is 0 to 100° C., or preferably 5 to 80° C. A method, in which the temperature thereof is kept at 5 to 80° C. during the time of gradual addition of the monomer mixture and so on, and then, aging is done at 20 to 80° C., is preferable.

Preferable organic solvents which can be added to the aqueous base catalyst solution or can dilute the monomer mixture and so on are similar to those mentioned as the examples of the organic solvent which can be added into the aqueous acid catalyst solution. Meanwhile, use amount of the organic solvent is preferably 0 to 1,000 mL relative to 1 mole of the monomer mixture and so on to carry out the reaction economically.

Thereafter, a neutralization reaction of the catalyst is carried out, if necessary, to obtain an aqueous solution of a hydrolysis condensation reaction product. Use amount of an acidic substance for neutralization is preferably 0.1 to 2 equivalents relative to the basic substance used as the catalyst. Any acidic substance may be used as far as the substance shows properties of an acid in water.

Then, it is preferable to remove by-products such as an alcohol produced by the hydrolysis condensation reaction from the aqueous solution of the hydrolysis condensation product under reduced pressure or the like. Temperature to heat the aqueous solution of the hydrolysis condensation product in this operation is preferably 0 to 100° C., more preferably 10 to 90° C., or still more preferably 15 to 80° C., though it depends on kinds of the used organic solvent and the produced alcohol. Degree of vacuum in this operation is preferably an atmospheric pressure or lower, more preferably 80 kPa or lower in absolute pressure, or still more preferably 50 kPa or lower in absolute pressure, though it depends on kinds of the organic solvent and the alcohol to be removed, exhausting equipment, condensation equipment, and heating temperature. Although it is difficult to know exactly an amount of the alcohol removed, it is preferable that about 80% or more by mass of a produced alcohol is removed.

Then, to remove the base catalyst used in the hydrolysis condensation reaction, the hydrolysis condensation product is extracted by an organic solvent. The organic solvent which can dissolve the hydrolysis condensation product and which can be separated into two layers when mixed with water is preferably used. Alternatively, a mixture of a water-soluble organic solvent and a water-hardly soluble organic solvent may be used.

Specific examples of the organic solvent which can be used to remove the base catalyst are similar to the organic solvents and the mixture of a water-soluble organic solvent and a water-hardly soluble organic solvent which were specifically shown to remove the acid catalyst previously.

Then, washing is done by neutral water. So-called de-ionized water or ultrapure water may be used. Amount of this water is 0.01 to 100 liters, preferably 0.05 to 50 liters, more preferably 0.1 to 5 liters, relative to 1 liter of the hydrolysis condensation product solution. The operation may be done in such a way that the both solutions are mixed in a vessel by agitation, and then settled to separate a water layer. Number of washing is 1 or more, or preferably 1 to 5, because washing of 10 times or more is not worth to have full effects.

To the hydrolysis condensation product solution after washing is added a final solvent, and then solvents therein are exchanged under reduced pressure to obtain an intended solution containing hydrolysis condensation product. Temperature at the time of the solvent exchange is preferably 0 to 100° C., more preferably 10 to 90° C., or still more preferably 15 to 80° C., though it depends on the reaction solvent to be removed. Degree of vacuum in this operation is preferably an atmospheric pressure or lower, more preferably 80 kPa or lower in absolute pressure, or still more preferably 50 kPa or lower in absolute pressure, though it depends on kinds of the extraction solvent to be removed, exhausting equipment, condensation equipment, and heating temperature.

A preferable solvent finally added to the hydrolysis condensation product solution is an alcohol solvent; and especially preferable solvents are a monoalkyl ether of ethylene glycol, diethylene glycol, triethylene glycol, and so on; and a monoalkyl ether of propylene glycol, dipropylene glycol, and so on. Specific examples of the preferable solvent include propylene glycol monomethyl ether, ethylene glycol monomethyl ether, propylene glycol monoethyl ether, ethylene glycol monoethyl ether, propylene glycol monopropyl ether, and ethylene glycol monopropyl ether.

Alternatively, if these solvents are a main solvent, a non-alcoholic solvent may be added thereinto as an adjuvant solvent. Still alternatively, a high boiling point solvent having a boiling point of 180° C. or higher, or preferably 180° C. or higher and 300° C. or lower, may be added.

Specifically, adjuvant solvents and high-boiling point solvents similar to those specifically shown in the Synthesis Method 2 can be used.

In an alternative operational procedure using a base catalyst, the hydrolysis reaction is started by adding water or a water-containing organic solvent into a monomer mixture and so on or into an organic solution of a monomer mixture and so on. In this operation, the catalyst may be added into the monomer mixture and so on or into the organic solution of a monomer mixture and so on, or into water or the water-containing organic solvent. The reaction temperature is 0 to 100° C., or preferably 10 to 80° C. A method, in which the temperature thereof is heated at 10 to 50° C. during the time of gradual addition of water, and then, aging is done at 20 to 80° C., is preferable.

As the organic solvent which can be used in the organic solution of a monomer mixture and so on or in the water-containing organic solvent, a water-soluble solvent is preferable. Illustrative examples thereof include methanol, ethanol, 1-propanol, 2-propanol, 1-butanol, 2-butanol, 2-methyl-1-propanol, acetone, tetrahydrofurane, acetonitrile; and a polyol condensation derivative such as propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether acetate; and a mixture of these solvents.

Molecular weight of silicon-containing compounds obtained by the Synthesis Methods 1 to 3 and so on can be controlled not only by selection of the monomer mixture and so on but also by control of reaction conditions during the time of condensation. When the compound having weight-average molecular weight of more than 100,000 is used, foreign matters or coating patch may be occurred in a certain instance; and thus, the weight-average molecular weight thereof is preferably 100,000 or less, more preferably 200 to 50,000, or still more preferably 300 to 30,000. Meanwhile, the data of the weight-average molecular weight are of the polystyrene-equivalent molecular weight based on the standard polystyrene, the data being obtained by a gel permeation chromatography (GPC) using $R^1$ as a detector and tetrahydrofuran as an eluting solvent.

[Other Components]
(Thermal Crosslinking Accelerator)

In the present invention, a thermal crosslinking accelerator may be blended to the silicon-containing resist underlayer film-forming composition. Examples of the blendable thermal crosslinking accelerator are compounds shown by the following general formula (5) or (6). Specific examples thereof are those shown in Patent Document 6.

$$L_aH_bX \tag{5}$$

wherein L represents any of lithium, sodium, potassium, rubidium, and cesium; X represents a hydroxyl group, or a monovalent, or a divalent or higher organic acid group having 1 to 30 carbon atoms; "a" represents an integer of one or more, b represents 0 or an integer of one or more, and a+b is a valency of the hydroxyl group or the organic acid group, $$MY \tag{6}$$

wherein M represents any of sulfonium, iodonium, and ammonium; and Y represents a non-nucleophilic counter ion.

Meanwhile, the foregoing thermal crosslinking accelerators may be used singly or in a combination of two or more of them. Adding amount of the thermal crosslinking accelerator is preferably 0.01 to 50 parts by mass, or more preferably 0.1 to 40 parts by mass, relative to 100 parts by mass of the base polymer (silicon-containing compound obtained by the Synthesis Methods mentioned above).

(Organic Acids)

To improve stability of the silicon-containing resist underlayer film-forming composition of the present invention, it is preferable that a monovalent, or a divalent or higher organic acid having 1 to 30 carbon atoms is added thereinto. Illustrative examples of the acid to be added here include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, and citric acid. Especially, oxalic acid, maleic acid, formic acid, acetic acid, propionic acid, citric acid, and the like are preferable. To keep storage stability, two or more kinds of these acids may be used. Adding amount thereof is 0.001 to 25 parts by mass, preferably 0.01 to 15 parts by mass, or more preferably 0.1 to 5 parts by mass, relative to 100 parts by mass of silicon which is contained in the composition.

Alternatively, the organic acid is added such that pH of the composition may become preferably 0≤pH≤7, more preferably 0.3≤pH≤6.5, or still more preferably 0.5≤pH≤6.

(Water)

In the present invention, water may be added to the composition. When water is added thereinto, the silicon-containing compound is hydrated whereby improving a lithography performance. Water content in the solvent component of the composition is more than 0% by mass and less than 50% by mass, particularly preferably 0.3 to 30% by mass, or still more preferably 0.5 to 20% by mass. In each component, if water amount is too large, uniformity of the silicon-containing resist underlayer film is deteriorated thereby possibly causing an eye hole in the worst case. On the other hand, if water amount is too small, there is a risk of deterioration in the lithography performance.

Use amount of entirety of the solvent including water is preferably 100 to 100,000 parts by mass, in particular 200 to 50,000 parts by mass, relative to 100 parts by mass of the base polymer.

(Photoacid Generator)

In the present invention, a photoacid generator may be added to the composition. Specific examples of the photoacid generator which can be used in the present invention are those materials described in paragraphs (0160) to (0179) of the Japanese Patent Laid-Open Publication No. 2009-126940.

(Stabilizer)

In addition, in the present invention, a stabilizer may be added to the composition. As a stabilizer, a monovalent, or a divalent or higher alcohol having a cyclic ether as a substituent may be added. Especially, addition of stabilizers described in paragraphs (0180) to (0184) of the Japanese Patent Laid-Open Publication No. 2009-126940 can improve stability of the silicon-containing resist underlayer film-forming composition.

(Surfactant)

Further, in the present invention, a surfactant may be added to the composition if necessary. Specific examples thereof are those materials described in paragraph (0185) of the Japanese Patent Laid-Open Publication No. 2009-126940.

[Negative-Patterning Process]

(Negative-Patterning Process 1)

The present invention provides a patterning process, wherein an organic underlayer film is formed on a body to be processed by using an organic underlayer film-forming composition of an application type, on the organic underlayer film is formed a silicon-containing resist underlayer film by using the silicon-containing resist underlayer film-forming composition, on the silicon-containing resist underlayer film is formed a photoresist film by using a resist composition of a chemically amplification type, and after heat treatment thereof, the photoresist film is exposed to a high energy beam, an unexposed area of the photoresist film is dissolved by using an organic solvent developer to form a negative pattern, the pattern is transferred to the silicon-containing resist underlayer film by dry etching by using the resist film having the pattern formed therein as a mask, the pattern is transferred to the organic underlayer film by dry etching by using the silicon-containing resist underlayer film having the pattern transferred thereto as a mask, and further the pattern is transferred to the body to be processed by dry etching by using the organic underlayer film having the pattern transferred thereto as a mask (what is called "multilayer resist method").

(Negative-Patterning Process 2)

In addition, the present invention provides a patterning process, wherein an organic hard mask composed of mainly a carbon is formed on a body to be processed by a CVD method, on the organic hard mask is formed a silicon-containing resist underlayer film by using the silicon-containing resist underlayer film-forming composition, on the silicon-containing resist underlayer film is formed a photoresist film by using a resist composition of a chemically amplification type, and after heat treatment thereof, the photoresist film is exposed to a high energy beam, an unexposed area of the photoresist film is dissolved by using an organic solvent developer to form a negative pattern, the pattern is transferred to the silicon-containing resist underlayer film by dry etching by using the resist film having the pattern formed therein as a mask, the pattern is transferred to the organic hard mask by dry etching by using the silicon-containing resist underlayer film having the pattern transferred thereto as a mask, and further the pattern is transferred to the body to be processed by dry etching by using the organic hard mask having the pattern transferred thereto as a mask (what is called "multilayer resist method").

If a negative pattern is formed by using the silicon-containing resist underlayer film formed by the silicon-containing resist underlayer film-forming composition of the present invention, a pattern formed in the photoresist film can be formed on the substrate without causing transfer difference in size by optimizing a combination with the CVD film or the organic underlayer film as mentioned above.

In addition, in exposure of the photoresist film, it is preferable that contact angle of the part of the silicon-containing resist underlayer film after exposure which corresponds to the exposed area of the exposed photoresist film is decreased by 10 degrees or more as compared with before exposure.

When contact angle of the part of the silicon-containing resist underlayer film corresponding to the exposed area of the photoresist film is decreased by 10 degrees or more as compared with before exposure, difference in the contact angle to the resist pattern after the negative development becomes smaller, whereby leading to enhancement of adhesion; and as a result, pattern collapse can be avoided, and a fine pattern can be formed.

The silicon-containing resist underlayer film which is used in patterning process of the present invention can be formed on the body to be processed from the silicon-containing resist underlayer film-forming composition of the present invention by a spin-coating method etc. similarly to the photoresist film. After spin-coating, it is preferable to carry out baking in order to evaporate a solvent and to accelerate the crosslinking reaction to avoid mixing with the photoresist film. This baking is done preferably in the temperature range of 50 to 500° C. and the time of 10 to 300 seconds. Especially preferable temperature thereof is 400° C. or lower in order to decrease a thermal damage to a device, though the temperature is depending on structure of the device to be manufactured.

Here, as the body to be processed, a substrate for a semiconductor device, a substrate for a semiconductor device coated, as the layer to be processed (as the part to be processed), with any of a metal film, a metal carbide film, a metal oxide film, a metal nitride film, a metal oxycarbide film, and a metal oxynitride film, or the like may be used.

As to the substrate for a semiconductor device, a silicon substrate is generally used, though not particularly limited thereto; and materials, such as Si, amorphous silicon (α-Si), p-Si, $SiO_2$, SiN, SiON, W, TiN, and Al, may be used and may be different from that of a processing layer.

As to the metal to constitute the body to be processed, any of silicon, titanium, tungsten, hafnium, zirconium, chromium, germanium, copper, aluminum, and iron, or a metal alloy of them may be used. As to the layer to be processed which contains these metals, used are, for example, Si, $SiO_2$, SiN, SiON, SiOC, p-Si, α-Si, TiN, WSi, BPSG, SOG, Cr, CrO, CrON, MoSi, W, W—Si, Al, Cu, Al—Si, various kinds of a low dielectric film, and an etching stopper film thereof; and film thickness thereof is usually 1 to 10,000 nm, in particular 5 to 5,000 nm.

In the negative-patterning process of the present invention, the photoresist film is not particularly restricted provided that it is of a chemically amplification type to give a negative pattern by development using an organic solvent developer.

In the exposure process of the present invention, for example, if the exposure process by an ArF excimer laser beam is used, a photoresist film of any usual resist composition for an ArF excimer laser beam can be used.

Many candidates for the resist composition like this for an ArF excimer laser beam have already been in the public domain, in which the heretofore known resins can be classified roughly into a poly(meth)acryl type, a COMA type (COMA: Cyclo Olefin Maleic Anhydride), a COMA-(meth) acryl hybrid type, a ROMP type (ROMP: Ring Opening Methathesis Polymerization), and a polynorbornene type; among them, a resist composition which uses a resin of the poly(meth)acryl type has better resolution than the other resin types because etching resistance thereof is secured by introducing an alicyclic skeleton to its side chain.

In the negative-patterning process, after the silicon-containing resist underlayer film is formed, the photoresist film is formed thereonto by using a photoresist composition solution; this film formation is preferably done by a spin-coating method similarly to formation of the silicon-containing resist underlayer film. After the photoresist composition is spin-coated, prebake is done, preferably with the temperature of 80 to 180° C. and the time of 10 to 300 seconds. Thereafter, exposure and organic solvent development are carried out successively to obtain a negative resist pattern. It is preferable that post-exposure bake (PEB) is done after the exposure.

Usable as the organic solvent developer includes a developer containing one, or more components selected from 4-methyl-2-pentanol, 2-octanone, 2-nonanone, 2-heptanone, 3-heptanone, 4-heptanone, 2-hexanone, 3-hexanone, diisobutyl ketone, methyl cyclohexanone, acetophenone, methyl acetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, in which it is preferable to use a developer having the foregoing one, or two or more developer components contained with the total amount thereof being 50% or more by mass to remedy pattern collapse and so on.

In the patterning process of the present invention, when the silicon-containing resist underlayer film is etched, a gas mainly comprised of a gas containing fluorine such as a flon based gas is used. To minimize film loss of the photoresist film, it is preferable that etching speed of the silicon-containing resist underlayer film to the gas is fast.

In the multilayer resist method as mentioned above, if an organic underlayer film is formed between the silicon-containing resist underlayer film and the body to be processed whereby using the organic underlayer film as an etching mask for the body to be processed, the organic underlayer film is preferably an organic film having an aromatic skeleton; on the other hand, if the organic underlayer film is a sacrifice film or the like, the silicon-containing organic underlayer film may be used provided that the silicon content therein is 15% or less by mass.

Organic underlayer films that are already in the public domain as the underlayer film for a tri-layer resist process or a bi-layer resist process which uses a silicon resist composition or that are already in public domain as the resist underlayer film-forming composition for a bi-layer process or a tri-layer process, the composition being many resins including a novolak resin such as 4,4'-(9-fluorenylidene)bisphenol novolak resin (molecular weight of 11,000) described in the Japanese Patent Laid-Open publication No. 2005-128509, may be used. To increase heat resistance as compared with usual novolak resins, not only a resin having a polycyclic skeleton such as 6,6'-(9-fluorenylidene)-di(2-naphthol) novolak resin but also a polyimide resin may be selected (for example Japanese Patent Laid-Open Publication No. 2004-153125).

The organic underlayer film can be formed on the body to be processed by using the composition solution thereof by a spin-coating method etc. similarly to the photoresist composition. After the organic underlayer film is formed by a spin-coating method etc., it is preferable to carry out baking to evaporate an organic solvent. The baking is done preferably with the temperature range of 80 to 300° C. and the time of 10 to 300 seconds.

Meanwhile, though not particularly restricted and depending on etching condition, thickness of the organic underlayer film is preferably 5 nm or more, or in particular 20 nm or more, and 50,000 nm or less; thickness of the silicon-containing resist underlayer film according to the present invention is preferably 1 nm or more, and 500 nm or less, more preferably 300 nm or less, or still more preferably 200 nm or less; and thickness of the photoresist film is preferably in the range of 1 to 200 nm.

[Patterning Process of the Present Invention by the Tri-Layer Resist Method]

The negative-patterning process of the present invention according to the tri-layer resist method as mentioned above is done as following (refer to FIG. 1). In this process, firstly the organic underlayer film 2 is formed on the body to be processed 1 by a spin-coating method (FIG. 1(I-A)). It is desirable that the organic underlayer film 2 have high etching resistance because this acts as a mask during etching of the body to be processed 1; and it is also desirable that this undergo crosslinking by heat or an acid after it is formed by spin-coating because mixing with the silicon-containing resist underlayer film of the upperlayer is required not to occur.

Then, after the silicon-containing resist underlayer film 3 is formed thereonto by using the silicon-containing resist underlayer film-forming composition of the present invention by spin-coating method (FIG. 1(I-B), thereupon is formed the photoresist film 4 by spin-coating method (FIG. 1(I-C)). Meanwhile, the silicon-containing resist underlayer film 3 may be formed by using the composition giving the silicon-containing resist underlayer film 3 whose contact angle to pure water in the part thereof corresponding to the exposed area of the photoresist film 4 is in the range of 40 degrees or more to less than 70 degrees after exposure of the photoresist film 4.

By using the mask 5, the photoresist film 4 is subjected to a usual pattern exposure using a light source P matching with the photoresist film 4, such as a KrF excimer laser beam, an ArF excimer laser beam, an $F_2$ laser beam, and an EUV beam, preferably any of a photolithography with the wavelength range of 10 nm or more to 300 nm or less, a direct drawing by an electron beam, and a nanoimprinting, or a combination of them, to form a pattern (FIG. 1(I-D)); and thereafter, heat treatment thereof under the condition matching with respective photoresist films (FIG. 1(I-E)), development by an organic solvent developer (negative development), and then, as appropriate, rinsing are performed to obtain the negative resist pattern 4a (FIG. 1(I-F)).

Then, by using this negative resist pattern 4a as an etching mask, etching is carried out under the dry etching condition such that the etching speed of the silicon-containing resist underlayer film 3 may be significantly faster relative to the photoresist film, for example, by dry etching using a fluorine-based gas plasma. As a result, the negative silicon-containing resist underlayer film pattern 3a can be obtained without substantially receiving an influence of the pattern change due to side etching of the resist film (FIG. 1(I-G)).

Then, the organic underlayer film 2 is dry etched under the dry etching condition such that the etching speed of the organic underlayer film 2 may be significantly faster relative to the substrate having the negative silicon-containing resist underlayer film pattern 3a transferred with the negative resist pattern 4a obtained above, for example, by reactive dry etching with a gas plasma containing oxygen or by reactive dry etching with a gas plasma containing hydrogen and nitrogen. In this etching process, the negative organic underlayer film pattern 2a is obtained, while at the same time, the uppermost photoresist film is usually lost (FIG. 1(I-H)). Then, by using the negative organic underlayer film pattern 2a thus obtained as an etching mask, the body to be processed 1 can be dry etched with high precision by using, for example, fluorine-based dry etching or chlorine-based dry etching thereby enabling to transfer the negative pattern 1a to the body to be processed 1 (FIG. 1(I-I)).

Meanwhile, in the process of the tri-layer resist method mentioned above, an organic hard mask formed by a CVD method may be used alternatively in place of the organic underlayer film 2. In this case also, the body to be processed can be processed by the procedure similar to the above procedure.

[Positive-Patterning Process]
(Positive-Patterning Process 1)

In addition, the present invention provides a patterning process, wherein an organic underlayer film is formed on a body to be processed by using an organic underlayer film-forming composition of an application type, on the organic underlayer film is formed a silicon-containing resist underlayer film by using the silicon-containing resist underlayer film-forming composition, on the silicon-containing resist underlayer film is formed a photoresist film by using a resist composition of a chemically amplification type, and after heat treatment thereof, the photoresist film is exposed to a high energy beam, an exposed area of the photoresist film is dissolved by using an alkaline developer to form a positive pattern, the pattern is transferred to the silicon-containing resist underlayer film by dry etching by using the resist film having the pattern formed therein as a mask, the pattern is transferred to the organic underlayer film by dry etching by using the silicon-containing resist underlayer film having the pattern transferred thereto as a mask, and further the pattern is transferred to the body to be processed by dry etching by using the organic underlayer film having the pattern transferred thereto as a mask (what is called "multilayer resist method").

(Positive-Patterning Process 2)

Moreover, the present invention provides a patterning process, wherein an organic hard mask composed of mainly a carbon is formed on a body to be processed by a CVD method, on the organic hard mask is formed a silicon-containing resist underlayer film by using the silicon-containing resist underlayer film-forming composition, on the silicon-containing resist underlayer film is formed a photoresist film by using a resist composition of a chemically amplification type, and after heat treatment thereof, the photoresist film is exposed to a high energy beam, an exposed area of the photoresist film is dissolved by using an alkaline developer to form a positive pattern, the pattern is transferred to the silicon-containing resist underlayer film by dry etching by using the resist film having the pattern formed therein as a mask, the pattern is transferred to the organic hard mask by dry etching by using the silicon-containing resist underlayer film having the pattern transferred thereto as a mask, and further the pattern is transferred to the body to be processed by dry etching by using the organic hard mask having the pattern transferred thereto as a mask (what is called "multilayer resist method").

If a pattern is formed by positive development by using the silicon-containing resist underlayer film formed by the silicon-containing resist underlayer film-forming composition of the present invention, a pattern formed in the photoresist can be formed on the substrate without causing transfer difference in size by optimizing a combination with the CVD film or the organic underlayer film as mentioned above.

Further, it is preferable that difference between contact angle to pure water of the silicon-containing resist underlayer film before formation of the photoresist film and contact angle to pure water of the silicon-containing resist underlayer film corresponding to the unexposed area of the photoresist film after exposure is 10 degrees or less. If the difference between these contact angles is 10 degrees or less, difference of the contact angles between the unexposed area of the photoresist film and the part corresponding to this in the silicon-containing resist underlayer film can be made 10 degrees or less, whereby leading to good adhesion in the positive development; and as a result, a fine pattern can be formed.

In the positive-patterning process of the present invention, the photoresist film is not particularly restricted provided that it is of a chemically amplification type to give a positive pattern by development using an alkaline developer. As to the other matters, i.e., the film formation method, the body to be processed, the organic underlayer film, and the organic hard mask, those mentioned in the negative-patterning process may be applied similarly.

In the positive-patterning process, after formation of the photoresist film and then heat-treatment thereof, exposure and then alkaline development by using an alkaline developer are carried out to obtain a positive resist pattern. In addition, after exposure, it is preferable to carry out post-exposure bake (PEB).

As to the alkaline developer, tetramethyl ammonium hydroxide (TMAH) or the like may be used.

[Patterning Process of the Present Invention by the Tri-Layer Resist Method]

The positive-patterning process of the present invention according to the tri-layer resist method is done as following (refer to FIG. 1). In this process, firstly the organic underlayer film 2 is formed on the body to be processed 1 by a spin-coating method (FIG. 1(II-A)). It is desirable that the organic underlayer film 2 have high etching resistance because this acts as a mask during etching of the body to be processed 1; and it is also desirable that this undergo crosslinking by heat or an acid after it is formed by spin-coating because mixing with the silicon-containing resist underlayer film of the upperlayer is required not to occur.

Then, the silicon-containing resist underlayer film 3 is formed thereupon by using the silicon-containing resist underlayer film-forming composition of the present invention by spin-coating method (FIG. 1(II-B), thereupon is formed the photoresist film 4 by spin-coating method (FIG. 1(II-C)). Meanwhile, the silicon-containing resist underlayer film 3 may be formed by using the composition giving the silicon-containing resist underlayer film 3 whose contact angle to pure water in the part thereof corresponding to the exposed area of the photoresist film 4 is in the range of 40 degrees or more to less than 70 degrees after exposure of the photoresist film 4.

By using the mask 5, the photoresist film 4 is subjected to a usual pattern exposure using a light source P matching with the photoresist film 4, such as a KrF excimer laser beam, an ArF excimer laser beam, an $F_2$ laser beam, and an EUV beam, preferably any of a photolithography method with the wavelength ranging from 10 nm or more to 300 nm or less, a direct drawing method by an electron beam, and a nanoimprinting method, or a combination of them, to form a pattern (FIG. 1(II-D)); and thereafter, heat treatment thereof under the condition matching with respective photoresist films (FIG. 1(II-E)), development by an alkaline developer, and then, as appropriate, rinsing are performed to obtain the positive resist pattern 4b (FIG. 1(II-F)).

Then, by using this resist pattern 4b as an etching mask, etching is carried out under the dry etching condition such that the etching speed of the silicon-containing resist underlayer film 3 may be significantly faster relative to the photoresist film, for example, by dry etching using a fluorine-based gas plasma. As a result, the positive silicon-containing resist underlayer film pattern 3b can be obtained without substantially receiving an influence of the pattern change due to side etching of the resist film (FIG. 1(II-G)).

Then, the organic underlayer film 2 is dry etched under the dry etching condition such that the etching speed of the organic underlayer film 2 may be significantly faster relative to the substrate having the positive silicon-containing resist underlayer film pattern 3b transferred with the positive resist pattern obtained above, for example, by reactive dry etching with a gas plasma containing oxygen or by reactive dry etching with a gas plasma containing hydrogen and nitrogen. In this etching process, the positive organic underlayer film pattern 2b is obtained, while at the same time, the uppermost photoresist film is usually lost (FIG. 1(II-H)). Then, by using the positive organic underlayer film pattern 2b thereby obtained as an etching mask, the body to be processed 1 can be dry etched with high precision by using, for example, fluorine-based dry etching or chlorine-based dry etching thereby enabling to transfer the positive pattern 1b to the body to be processed 1 (FIG. 1(II-I)).

Meanwhile, in the process of the tri-layer resist method mentioned above, an organic hard mask formed by a CVD method may be used alternatively in place of the organic underlayer film 2. In this case also, the body to be processed 1 can be processed by the procedure similar to the above procedure.

EXAMPLES

Although Synthesis Examples, Examples, and Comparative Examples will be shown and the present invention will be explained in detail hereafter, the present invention is not restricted to the following Examples. Note that the symbol "%" in the Examples represents a mass %, and the molecular weight measurement was based on GPC.

Synthesis Example A-1

A monomer mixture comprising 9.9 g of phenyl trimethoxy silane (Monomer 100), 13.6 g of methyl trimethoxy silane (Monomer 101), 38.1 g of tetramethoxy silane (Monomer 102), and 25.6 g of the boric acid derivative shown by "Monomer 120" was heated under a nitrogen atmosphere at 100° C. for 3 hours to obtain a boron-containing silane mixture after confirmation of disappearance of the boric acid derivative by GPC. After cooling down to a room temperature, this mixture was gradually added into a mixture comprising 120 g of methanol, 1 g of methanesulfonic acid, and 60 g of deionized water over 30 minutes at room temperature; and then, after completion of the gradual addition, the resulting mixture was kept at 20° C. for 24 hours to carry out the hydrolysis condensation. After the reaction, 100 g of propylene glycol ethyl ether (PGEE) was added thereinto, and then, by-produced alcohols were distilled out under reduced pressure. Then, 1,000 mL of ethyl acetate was added thereinto to separate the water layer. To the remaining organic layer was added 100 mL of ion-exchanged water; and the resulting mixture solution was stirred, settled, and then separated into the layers. This operation was repeated for three times. The remaining organic layer was added with 200 g of PGEE and then concentrated under reduced pressure to obtain 450 g of PGEE solution of silicon-containing compound A-1 which also contained boron (polymer concentration therein was 19.9%). In the solution thus obtained, the methanesulfonate ion was not detected by an ion chromatography. Polystyrene-equivalent molecular weight (Mw) of this compound was 3,600.

By using the monomers shown in Table 1, [Synthesis Example A-2] to [Synthesis Example A-3] were carried out under the same conditions as those in [Synthesis Example A-1] to obtain respective intended products.

Synthesis Example A-4

A monomer mixture comprising 27.2 g of methyl trimethoxy silane (Monomer 101), 38.1 g of tetramethoxy silane (Monomer 102), and 11.1 g of the boric acid derivative shown by "Monomer 123" was gradually added into a mixture comprising 120 g of methanol, 1 g of methanesulfonic acid, and 60 g of deionized water over 30 minutes at room temperature; and then, after completion of the gradual addition, the resulting mixture was kept at 20° C. for 24 hours to carry out the hydrolysis condensation. After the reaction, 100 g of propylene glycol ethyl ether (PGEE) was added thereinto, and then, by-produced alcohols were distilled out under reduced pressure. Then, 1,000 mL of ethyl acetate was added thereinto to separate the water layer. To the remaining organic layer was added 100 mL of ion-exchanged water; and the resulting mixture solution was stirred, settled, and then separated into the layers. This operation was repeated for three times. The remaining organic layer was added with 200 g of PGEE and then concentrated under reduced pressure to obtain 250 g of PGEE solution of silicon-containing compound A-4 which also contained boron (polymer concentration therein was 13.9%). In the solution thus obtained, the methanesulfonate ion was not detected by an ion chromatography. Polystyrene-equivalent molecular weight (Mw) of this compound was 2,200.

By using the monomers shown in Table 1, [Synthesis Example A-5] to [Synthesis Example A-6] were carried out under the same conditions as those in [Synthesis Example A-4] to obtain respective intended products.

Synthesis Example A-7

A monomer mixture comprising 20.4 g of methyl trimethoxy silane (Monomer 101), 52.2 g of tetraethoxy silane (Monomer 103), 9.4 g of triisopropyl borate (Monomer 110), and 11.1 g of the boric acid derivative shown by "Monomer 123" was gradually added into a mixture comprising 120 g of methanol, 1 g of methanesulfonic acid, and 60 g of deionized water over 30 minutes at room temperature; and then, after completion of the gradual addition, the resulting mixture was kept at 40° C. for 12 hours to carry out the hydrolysis condensation. After the reaction, 100 g of propylene glycol ethyl ether (PGEE) was added thereinto, and then, by-produced alcohols were distilled out under reduced pressure. Then, 1,000 mL of ethyl acetate was added thereinto to separate the water layer. To the remaining organic layer was added 100 mL of ion-exchanged water; and the resulting mixture solution was stirred, settled, and then separated into the layers. This operation was repeated for three times. The remaining organic layer was added with 200 g of PGEE and then concentrated under reduced pressure to obtain 250 g of PGEE solution of silicon-containing compound A-7 which also contained boron (polymer concentration therein was 12.6%). In the solution thus obtained, the methanesulfonate ion was not detected by an ion chromatography. Polystyrene-equivalent molecular weight (Mw) of this compound was 3,300.

By using the monomers shown in Table 1, [Synthesis Example A-8] to [Synthesis Example A-11] were carried out under the same conditions as those in [Synthesis Example A-7] to obtain respective intended products.

Synthesis Example A-12

A monomer mixture comprising 34.1 g of methyl trimethoxy silane (Monomer 101) and 55.5 g of the boric acid derivative shown by "Monomer 123" was gradually added into a mixture comprising 120 g of methanol, 1 g of methanesulfonic acid, and 60 g of deionized water over 30 minutes at room temperature; and then, after completion of the gradual addition, the resulting mixture was kept at 40° C. for 24 hours to carry out the hydrolysis condensation. After the reaction, 100 g of propylene glycol ethyl ether (PGEE) was added thereinto, and then, by-produced alcohols were distilled out under reduced pressure. Then, 1,000 mL of ethyl acetate was added thereinto to separate the water layer. To the remaining organic layer was added 100 mL of ion-exchanged water; and the resulting mixture solution was stirred, settled, and then separated into the layers. This operation was repeated for three times. The remaining organic layer was added with 500 g of PGEE and then concentrated under reduced pressure to obtain 500 g of PGEE solution of silicon-containing compound A-12 which also contained boron (polymer concentration therein was 11.4%). In the solution thus obtained, the methanesulfonate ion was not detected by an ion chromatography. Polystyrene-equivalent molecular weight (Mw) of this compound was 4,200.

Synthesis Example A-13

A monomer mixture comprising 6.8 g of methyl trimethoxy silane (Monomer 101) and 94.0 g of tetraethoxy silane (Monomer 103) was gradually added into a mixture comprising 120 g of methanol, 1 g of methanesulfonic acid, and 60 g of deionized water over 30 minutes at room temperature; and then, after completion of the gradual addition, the resulting mixture was kept at 40° C. for 12 hours to carry out the hydrolysis condensation. After the reaction, 600 g of propylene glycol ethyl ether (PGEE) was added thereinto, and then, by-produced alcohols were distilled out under reduced pressure to obtain 500 g of PGEE solution of silicon-containing compound A-13 (polymer concentration therein was 10.9%). Polystyrene-equivalent molecular weight (Mw) of this compound was 4,800.

Synthesis Example A-14

A monomer mixture comprising 13.5 g of 3-t-butoxyphenyl trimethoxy silane (Monomer 104), 27.2 g of methyl trimethoxy silane (Monomer 101), and 38.1 g of tetramethoxy silane (Monomer 102) was gradually added into a mixture comprising 120 g of methanol, 1 g of methanesulfonic acid, and 60 g of deionized water over 30 minutes at room temperature; and then, after completion of the gradual addition, the resulting mixture was kept at 20° C. for 24 hours to carry out the hydrolysis condensation. After the reaction, 100 g of propylene glycol ethyl ether (PGEE) was added thereinto, and then, by-produced alcohols were distilled out under reduced pressure. Then, 1,000 mL of ethyl acetate was added thereinto to separate the water layer. To the remaining organic layer was added 100 mL of ion-exchanged water; and the resulting mixture solution was stirred, settled, and then separated into the layers. This operation was repeated for three times. The remaining organic layer was added with 400 g of PGEE and then concentrated under reduced pressure to obtain 450 g of PGEE solution of silicon-containing compound A-14 (polymer concentration therein was 14.6%). In the solution thus obtained, the methanesulfonate ion was not detected by an ion chromatography. Polystyrene-equivalent molecular weight (Mw) of this compound was 2,900.

By using the monomers shown in Table 1, [Synthesis Examples A-16] was carried out under the same conditions as those in [Synthesis Example A-14] to obtain an intended product.

Synthesis Example A-15

A monomer mixture comprising 34.1 g of methyl trimethoxy silane (Monomer 101) and 67.6 g of 3-t-butoxyphenyl trimethoxy silane (Monomer 104) was gradually added into a mixture comprising 120 g of methanol, 1 g of methanesulfonic acid, and 60 g of deionized water over 30 minutes at room temperature; and then, after completion of the gradual addition, the resulting mixture was kept at 40° C. for 24 hours to carry out the hydrolysis condensation. After the reaction, 100 g of propylene glycol ethyl ether (PGEE) was added thereinto, and then, by-produced alcohols were distilled out under reduced pressure. Then, 1,000 mL of ethyl acetate was added thereinto to separate the water layer. To the remaining organic layer was added 100 mL of ion-exchanged water; and the resulting mixture solution was stirred, settled, and then separated into the layers. This operation was repeated for three times. The remaining organic layer was added with 500 g of PGEE and then concentrated under reduced pressure to obtain 500 g of PGEE solution of silicon-containing compound A-15 (polymer concentration therein was 12.2%). In the solution thus obtained, the methanesulfonate ion was not detected by an ion chromatography. Polystyrene-equivalent molecular weight (Mw) of this compound was 4,900.

By using the monomers shown in Table 1, [Synthesis Examples A-17] was carried out under the same conditions as those in [Synthesis Example A-15] to obtain an intended product.

TABLE 1

| Synthesis Example | Reaction raw material | Mw |
|---|---|---|
| A-1 | Monomer 100: 9.9 g, Monomer 101: 13.6 g, Monomer 102: 38.1 g, Monomer 120: 25.6 g | 3,600 |
| A-2 | Monomer 101: 27.2 g, Monomer 102: 38.1 g, Monomer 121: 12.5 g | 2,800 |
| A-3 | Monomer 101: 27.2 g, Monomer 102: 38.1 g, Monomer 122: 12.5 g | 3,100 |
| A-4 | Monomer 101: 27.2 g, Monomer 102: 38.1 g, Monomer 123: 11.1 g | 2,200 |
| A-5 | Monomer 101: 27.2 g, Monomer 102: 38.1 g, Monomer 124: 13.9 g | 3,000 |
| A-6 | Monomer 101: 27.2 g, Monomer 102: 38.1 g, Monomer 125: 11.1 g | 2,400 |
| A-7 | Monomer 101: 20.4 g, Monomer 103: 52.2 g, Monomer 110: 9.4 g, Monomer 123: 11.1 g | 3,300 |
| A-8 | Monomer 101: 20.4 g, Monomer 103: 52.2 g, Monomer 111: 17 g, Monomer 123: 11.1 g | 2,200 |
| A-9 | Monomer 101: 20.4 g, Monomer 103: 52.2 g, Monomer 112: 18.3 g, Monomer 123: 11.1 g | 3,900 |
| A-10 | Monomer 101: 20.4 g, Monomer 103: 52.2 g, Monomer 113: 3.5 g, Monomer 123: 11.1 g | 2,700 |
| A-11 | Monomer 101: 20.4 g, Monomer 103: 52.2 g, Monomer 114: 18.3 g, Monomer 123: 11.1 g | 2,200 |
| A-12 | Monomer 101: 34.1 g, Monomer 123: 55.5 g | 4,200 |
| A-13 | Monomer 101: 6.8 g, Monomer 103: 94 g | 4,800 |
| A-14 | Monomer 104: 13.5 g, Monomer 101: 27.2 g, Monomer 102: 38.1 g | 2,900 |
| A-15 | Monomer 104: 67.6 g, Monomer 101: 34.1 g | 4,900 |
| A-16 | Monomer 101: 27.2 g, Monomer 102: 38.1 g, Monomer 126: 7.5 g | 2,800 |
| A-17 | Monomer 101: 34.1 g, Monomer 126: 37.5 g | 4,500 |

TABLE 2

| | |
|---|---|
| PhSi(OCH$_3$)$_3$ | Monomer 100 |
| CH$_3$Si(OCH$_3$)$_3$ | Monomer 101 |
| Si(OCH$_3$)$_4$ | Monomer 102 |
| Si(OC$_2$H$_5$)$_4$ | Monomer 103 |
| [structure: (MeO)$_3$Si-phenyl-O-C(CH$_3$)$_3$] | Monomer 104 |
| B(OC$_3$H$_7$)$_3$ | Monomer 110 |
| Ti(OC$_4$H$_9$)$_4$ | Monomer 111 |
| Ge(OC$_4$H$_9$)$_4$ | Monomer 112 |
| P$_2$O$_5$ | Monomer 113 |
| Al[CH$_3$COCH=C(O—)CH$_3$]$_3$ | Monomer 114 |
| [structure with (HO)$_2$B-] | Monomer 120 |
| [structure with (HO)$_2$B-] | Monomer 121 |
| [structure with (HO)$_2$B-] | Monomer 122 |
| [structure with (MeO)$_2$B-] | Monomer 123 |
| [structure with (MeO)$_2$B-, Et] | Monomer 124 |
| [structure with (MeO)$_2$B- benzodioxole] | Monomer 125 |
| [structure: phenyl-B(OMe)(OMe)] | Monomer 126 |

Examples and Comparative Examples

Each of the silicon-containing compounds (A-1) to (A-12) and (A-16) to (A-17), which also contained boron, and the silicon-containing compounds (A-13) to (A-15), which did not contain boron, these compounds being synthesized by the above Synthesis Examples, was mixed with an acid, a thermal crosslinking accelerator, a solvent, and other additives in the ratio shown in Table 3; and then, the resulting mixture was filtrated through a 0.1-µm filter made of a fluorinated resin to obtain respective silicon-containing resist underlayer film-forming composition solutions Sol. 1 to Sol. 26.

TABLE 3

| No. | Silicon-containing compound (parts by mass) | Thermal crosslinking accelerator (parts by mass) | Photoacid generator (parts by mass) | Acid (parts by mass) | Solvent (parts by mass) | Water (parts by mass) |
|---|---|---|---|---|---|---|
| Sol. 1 | A-1 (4.0) | TPSOH (0.04) | — | Maleic acid (0.04) | PGEE (150) | Water (15) |

TABLE 3-continued

| No. | Silicon-containing compound (parts by mass) | Thermal crosslinking accelerator (parts by mass) | Photoacid generator (parts by mass) | Acid (parts by mass) | Solvent (parts by mass) | Water (parts by mass) |
|---|---|---|---|---|---|---|
| Sol. 2 | A-1 (4.0) | TPSHCO$_3$ (0.04) | — | Oxalic acid (0.04) | PGEE (150) | Water (15) |
| Sol. 3 | A-1 (4.0) | TPSOx (0.04) | — | Maleic acid (0.04) | PGEE (150) | Water (15) |
| Sol. 4 | A-1 (4.0) | TPSTFA (0.04) | — | Maleic acid (0.04) | PGEE (150) | Water (15) |
| Sol. 5 | A-1 (4.0) | TPSOCOPh (0.04) | — | Oxalic acid (0.04) | PGEE (150) | Water (15) |
| Sol. 6 | A-1 (4.0) | TPSH$_2$PO$_4$ (0.04) | — | Oxalic acid (0.04) | PGEE (150) | Water (15) |
| Sol. 7 | A-1 (4.0) | QMAMA (0.04) | — | Maleic acid (0.04) | PGEE (150) | Water (15) |
| Sol. 8 | A-1 (4.0) | QBANO$_3$ (0.04) | — | Maleic acid (0.04) | PGEE (150) | Water (15) |
| Sol. 9 | A-1 (4.0) | QMATFA (0.04) | TPSNf (0.04) | Maleic acid (0.04) | PGEE (150) | Water (15) |
| Sol. 10 | A-1 (4.0) | Ph$_2$ICl (0.04) | — | Maleic acid (0.04) | PGEE (150) | Water (15) |
| Sol. 11 | A-1 (4.0) | TPSMA (0.04) | — | Maleic acid (0.04) | PGEE (150) | Water (15) |
| Sol. 12 | A-2 (4.0) | TPSMA (0.04) | — | Oxalic acid (0.04) | PGEE (135) GBL (15) | Water (15) |
| Sol. 13 | A-3 (4.0) | TPSMA (0.04) | — | Maleic acid (0.04) | PGEE (150) | Water (15) |
| Sol. 14 | A-4 (4.0) | TPSMA (0.04) | — | Maleic acid (0.04) | PGEE (150) | Water (15) |
| Sol. 15 | A-5 (4.0) | TPSMA (0.04) | — | Oxalic acid (0.04) | PGEE (75) PGMEA (75) | Water (15) |
| Sol. 16 | A-6 (4.0) | TPSMA (0.04) | — | Oxalic acid (0.04) | PGEE (150) | Water (15) |
| Sol. 17 | A-7 (4.0) | TPSMA (0.04) | — | Maleic acid (0.04) | PGEE (150) | Water (15) |
| Sol. 18 | A-8 (4.0) | TPSMA (0.04) | — | Maleic acid (0.04) | PGEE (150) | Water (15) |
| Sol. 19 | A-9 (4.0) | TPSMA (0.04) | — | Maleic acid (0.04) | PGEE (135) PGMEA (15) | Water (15) |
| Sol. 20 | A-10 (4.0) | TPSMA (0.04) | TPSNf (0.04) | Maleic acid (0.04) | PGEE (150) | Water (15) |
| Sol. 21 | A-11 (4.0) | TPSMA (0.04) | — | Maleic acid (0.04) | PGEE (150) | Water (15) |
| Sol. 22 | A-12 (1.0) A-13 (3.0) | TPSMA (0.04) | — | Maleic acid (0.04) | PGEE (135) GBL (15) | Water (15) |
| Sol. 23 | A-14 (4.0) | TPSMA (0.04) | — | Maleic acid (0.04) | PGEE (150) | Water (15) |
| Sol. 24 | A-15 (1.0) A-13 (3.0) | TPSMA (0.04) | — | Maleic acid (0.04) | PGEE (150) | Water (15) |
| Sol. 25 | A-16 (4.0) | TPSMA (0.04) | — | Maleic acid (0.04) | PGEE (150) | Water (15) |
| Sol. 26 | A-17 (1.0) A-13 (3.0) | TPSMA (0.04) | — | Maleic acid (0.04) | PGEE (150) | Water (15) |

TPSOH: triphenylsulfonium hydroxide
TPSHCO$_3$: mono-(triphenylsulfonium)carbonate
TPSOx: mono-(triphenylsulfonium)oxalate
TPSTFA: triphenylsulfonium trifluoroacetate
TPSOCOPh: triphenylsulfonium benzoate
TPSH$_2$PO$_4$: mono-(triphenylsulfonium)phosphate
TPSMA: mono-(triphenylsulfonium)maleate
TPSNf: triphenylsulfonium nonafluorobutanesulfonate
QMAMA: mono-(tetramethyl ammonium)maleate
QMATFA: tetramethyl ammonium trifluoroacetate
QBANO$_3$: tetrabutyl ammonium nitrate
Ph$_2$ICl: diphenyl iodonium chloride
PGMEA: propylene glycol monomethyl ether acetate
GBL: gamma-butyrolactone Measurement of Contact Angle <Contact Angle Sample of the Underlayer Film>

Each of the silicon-containing resist underlayer film-forming composition solutions Sol. 1 to Sol. 26 was applied on a substrate and heated at 240° C. for 60 seconds to form respective silicon-containing resist underlayer films Film 1 to Film 26 having film thickness of 35 nm; and then, contact angle thereof to pure water (CA1) was measured (Table 4).

<Contact Angle Sample of the Underlayer Film Corresponding to the Unexposed Area Formed by Coating a Resist for Positive Development on the Underlayer Film and Removing it Thereafter>

Each of the silicon-containing resist underlayer film-forming composition solutions Sol. 1 to Sol. 26 was applied on a silicon wafer and then heated at 240° C. for 60 seconds to form respective silicon-containing resist underlayer films Film 1 to Film 26 having film thickness of 35 nm. On this film was applied the ArF resist solution (PR-1) shown in Table 9; and then, it was baked at 100° C. for 60 seconds to form the photoresist film having film thickness of 100 nm. Then, entirety of this resist film was removed by rinsing with propylene glycol monomethyl ether (PGME) to obtain the film equivalent of the resist underlayer film corresponding to the unexposed area of the photoresist film. Then, contact angle of it to pure water (CA2) was measured (Table 5).

<Contact Angle Sample of the Underlayer Film Corresponding to the Unexposed Area Formed by Coating a Resist for Negative Development on the Underlayer Film and Removing it Thereafter>

Each of the silicon-containing resist underlayer film-forming composition solutions Sol. 1 to Sol. 26 was applied on a silicon wafer and then heated at 240° C. for 60 seconds to form respective silicon-containing resist underlayer films Film 1 to Film 26 having film thickness of 35 nm. On this film was applied the ArF resist solution for negative development (PR-3) shown in Table 12; and then, it was baked at 100° C. for 60 seconds to form the photoresist film having film thickness of 100 nm. Further on this photoresist film was applied an immersion top coat (TC-1) shown in Table 10; and then, it was baked at 90° C. for 60 seconds to form the top coat having film thickness of 50 nm. Then, entirety of the immersion top coat and the photoresist film was removed by rinsing with propylene glycol monomethyl ether (PGME) to obtain the film equivalent of the resist underlayer film corresponding to the unexposed area of the photoresist film. Then, contact angle of it to pure water (CA3) was measured (Table 6).

<Contact Angle Sample of the Underlayer Film Corresponding to the Exposed Area Formed by Coating a Resist for Negative Development on the Underlayer Film and Removing it Thereafter>

Each of the silicon-containing resist underlayer film-forming composition solutions Sol. 1 to Sol. 26 was applied on a silicon wafer and then heated at 240° C. for 60 seconds to form respective silicon-containing resist underlayer films Film 1 to Film 26 having film thickness of 35 nm. On this film was applied the ArF resist solution for negative development (PR-3) shown in Table 12; and then, it was baked at 100° C. for 60 seconds to form the photoresist film having film thickness of 100 nm. Further on this photoresist film was applied an immersion top coat (TC-1) shown in Table 10; and then, it was baked at 90° C. for 60 seconds to form the top coat having film thickness of 50 nm. Then, after entirety thereof was exposed by using ArF immersion exposure instrument NSR-S610C (manufactured by Nikon Corp.) and then baked at 100° C. for 60 seconds (PEB), butyl acetate as a developer was discharged for 3 seconds from a developer nozzle with rotation speed of 30 rpm; and thereafter, rotation was stopped and puddle development was done for 27 seconds. After rinsing thereof by diisoamyl ether, it was spin-dried and then baked at 100° C. for 20 seconds to evaporate the rinse solvent. Entirety of the remaining resist film was removed by rinsing with PGME to obtain the film equivalent of the resist underlayer film corresponding to the exposed area of the photoresist film. Then, contact angle of it to pure water (CA4) was measured (Table 7).

<Contact Angle Sample Corresponding to the Exposed Area of the Resist for Negative Development>

After each of the ArF resist solutions for negative development (PR-3 and PR-4) shown in Table 12 was applied on a substrate, it was baked at 100° C. for 60 seconds to form the photoresist film having film thickness of 100 nm; and then, contact angle of it to pure water (CA5) was measured. Then, after entirety of the same resist film was exposed by using ArF exposure instrument NSR-S610C (manufactured by Nikon Corp.) and then baked at 100° C. for 60 seconds (PEB), it was rinsed by diisoamyl ether, spin-dried, and then baked at 100° C. for 20 seconds to evaporate the rinse solvent to obtain the ArF resist film corresponding to the pattern part having an acid-labile group eliminated at the time of negative development. Then, contact angle of it (CA6) to pure water was measured (Table 8).

TABLE 4

| No. | Contact angle |
|---|---|
| Film1 | 69° |
| Film2 | 71° |
| Film3 | 69° |
| Film4 | 72° |
| Film5 | 69° |
| Film6 | 69° |
| Film7 | 71° |
| Film8 | 70° |
| Film9 | 69° |
| Film10 | 69° |
| Film11 | 71° |
| Film12 | 72° |

TABLE 4-continued

| No. | Contact angle |
|---|---|
| Film13 | 72° |
| Film14 | 72° |
| Film15 | 71° |
| Film16 | 73° |
| Film17 | 70° |
| Film18 | 70° |
| Film19 | 70° |
| Film20 | 71° |
| Film21 | 74° |
| Film22 | 72° |
| Film23 | 71° |
| Film24 | 70° |
| Film25 | 70° |
| Film26 | 71° |

TABLE 5

| No. | Contact angle |
|---|---|
| Film1 | 63° |
| Film2 | 63° |
| Film3 | 66° |
| Film4 | 66° |
| Film5 | 66° |
| Film6 | 67° |
| Film7 | 65° |
| Film8 | 65° |
| Film9 | 67° |
| Film10 | 66° |
| Film11 | 67° |
| Film12 | 65° |
| Film13 | 65° |
| Film14 | 63° |
| Film15 | 64° |
| Film16 | 64° |
| Film17 | 63° |
| Film18 | 63° |
| Film19 | 63° |
| Film20 | 67° |
| Film21 | 66° |
| Film22 | 65° |
| Film23 | 67° |
| Film24 | 64° |
| Film25 | 64° |
| Film26 | 63° |

TABLE 6

| No. | Contact angle |
|---|---|
| Film1 | 65° |
| Film2 | 65° |
| Film3 | 66° |
| Film4 | 65° |
| Film5 | 66° |
| Film6 | 63° |
| Film7 | 64° |
| Film8 | 66° |
| Film9 | 64° |
| Film10 | 63° |
| Film11 | 64° |
| Film12 | 66° |
| Film13 | 64° |
| Film14 | 65° |
| Film15 | 65° |
| Film16 | 64° |
| Film17 | 64° |
| Film18 | 63° |
| Film19 | 64° |
| Film20 | 67° |

TABLE 6-continued

| No. | Contact angle |
|---|---|
| Film21 | 66° |
| Film22 | 64° |
| Film23 | 66° |
| Film24 | 63° |
| Film25 | 66° |
| Film26 | 67° |

TABLE 7

| No. | Contact angle |
|---|---|
| Film1 | 49° |
| Film2 | 52° |
| Film3 | 50° |
| Film4 | 52° |
| Film5 | 54° |
| Film6 | 52° |
| Film7 | 52° |
| Film8 | 48° |
| Film9 | 49° |
| Film10 | 49° |
| Film11 | 52° |
| Film12 | 49° |
| Film13 | 53° |
| Film14 | 49° |
| Film15 | 51° |
| Film16 | 49° |
| Film17 | 52° |
| Film18 | 48° |
| Film19 | 53° |
| Film20 | 55° |
| Film21 | 48° |
| Film22 | 50° |
| Film23 | 50° |
| Film24 | 50° |
| Film25 | 66° |
| Film26 | 65° |

TABLE 8

| No. | Contact angle (CA5) | No. | Contact angle (CA6) |
|---|---|---|---|
| Unexposed PR-3 | 71° | Exposed PR-3 | 53° |
| Unexposed PR-4 | 73° | Exposed PR-4 | 56° |

Patterning Test by Positive Development

Firstly, spin-on-carbon film ODL-50 (carbon content of 80% by mass, manufactured by Shin-Etsu Chemical Co., Ltd.) having film thickness of 200 nm was formed on a silicon wafer. Then, each of the silicon-containing resist underlayer film-forming composition solutions Sol. 11 to Sol. 26 was applied thereonto and then baked at 240° C. for 60 seconds to form the silicon-containing resist underlayer film having film thickness of 35 nm (Film 11 to Film 26).

Subsequently, the ArF resist solution for positive development (PR-1) shown in Table 9 was applied on the silicon-containing resist underlayer film; and then, it was baked at 110° C. for 60 seconds to form the photoresist film having the film thickness of 100 nm. Further on this photoresist film was applied the immersion top coat (TC-1) shown in Table 10; and then, it was baked at 90° C. for 60 seconds to form the top coat having film thickness of 50 nm.

Separately, the ArF resist solution for positive development (PR-2) shown in Table 9 was applied on the silicon-containing resist underlayer film; and then, it was baked at 110° C. for 60 seconds to form the photoresist film having the film thickness of 100 nm.

Then, after this was exposed by using ArF immersion exposure instrument NSR-S610C (NA of 1.30, σ of 0.98/0.65, 35-degree dipole polarized illumination, and 6% half tone phase shift mask, manufactured by Nikon Corp.), baking (PEB) was done at 100° C. for 60 seconds, which was then followed by development with an aqueous tetramethyl ammonium hydroxide (TMAH) solution with the concentration thereof being 2.38% by mass for 30 seconds to obtain a 43-nm 1:1 positive line-and-space pattern. With this dimension, pattern collapse was measured by using electron microscope CG4000 (manufactured by Hitachi High-Technologies Corp.), and cross-sectional profile was measured by using electron microscope S-9380 (manufactured by Hitachi, Ltd.) (Table 11).

TABLE 9

| No. | Polymer (parts by mass) | Acid generator (parts by mass) | Base (parts by mass) | Water-shedding polymer (parts by mass) | Solvent (parts by mass) |
|---|---|---|---|---|---|
| PR-1 | ArF resist polymer 1 (100) | PAG1 (7.0) | Quencher (1.0) | — | PGMEA (2,500) |
| PR-2 | ArF resist polymer 1 (100) | PAG1 (10.0) | Quencher (2.0) | Water-shedding polymer 1 (4.0) | PGMEA (2,500) |

ArF Resist Polymer 1:

Molecular weight (Mw): 7,800

Dispersity (Mw/Mn): 1.78

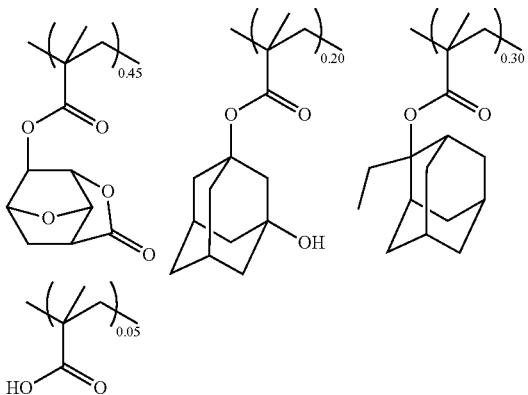

Acid Generator: PAG 1

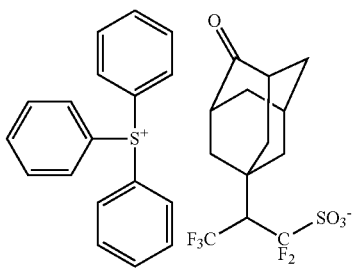

Base: Quencher

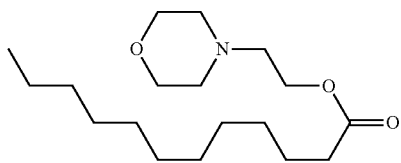

Water-Shedding Polymer 1:
 Molecular weight (Mw): 8,200
 Dispersity (Mw/Mn): 1.67

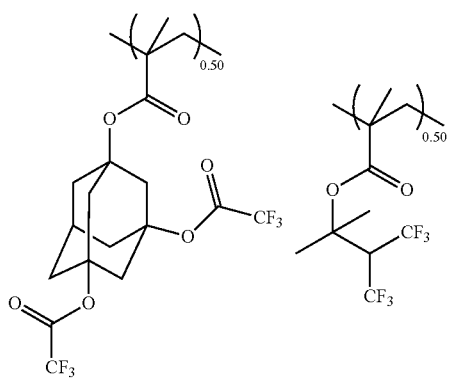

Top Coat Polymer
 Molecular weight (Mw): 8,800
 Dispersity (Mw/Mn): 1.69

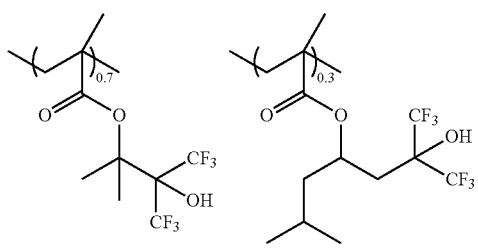

TABLE 10

| Polymer (parts by mass) | Organic solvent (parts by mass) |
|---|---|
| TC-1 | Top coat polymer (100) | diisoamyl ether (2,700) 2-methyl-1-butanol (270) |

TABLE 11

| Example | Silicon-containing resist underlayer film | ArF resist | Cross-sectional profile of positive pattern after positive development | Pattern collapse | CA1-CA2 |
|---|---|---|---|---|---|
| Example 1-1 | Film 11 | PR-1 | vertical profile | free | 4° |
| Example 1-2 | Film 12 | PR-1 | vertical profile | free | 7° |
| Example 1-3 | Film 13 | PR-1 | vertical profile | free | 7° |
| Example 1-4 | Film 14 | PR-1 | vertical profile | free | 9° |
| Example 1-5 | Film 15 | PR-1 | vertical profile | free | 7° |
| Example 1-6 | Film 16 | PR-1 | vertical profile | free | 9° |
| Example 1-7 | Film 17 | PR-1 | vertical profile | free | 7° |
| Example 1-8 | Film 18 | PR-1 | vertical profile | free | 7° |
| Example 1-9 | Film 19 | PR-1 | vertical profile | free | 7° |
| Example 1-10 | Film 20 | PR-1 | vertical profile | free | 4° |
| Example 1-11 | Film 21 | PR-2 | vertical profile | free | 8° |
| Example 1-12 | Film 22 | PR-2 | vertical profile | free | 7° |
| Comparative Example 1-1 | Film 23 | PR-1 | vertical profile | free | 4° |
| Comparative Example 1-2 | Film 24 | PR-1 | vertical profile | free | 6° |
| Comparative Example 1-3 | Film 25 | PR-1 | vertical profile | free | 6° |
| Comparative Example 1-4 | Film 26 | PR-1 | vertical profile | free | 8° |

As shown in Table 11, when the resist underlayer film whose amount of change between contact angle of the resist underlayer film (CA1) and contact angle of the silicon-containing resist underlayer film after coating of the upperlayer resist for positive development and removing it (CA2) was 10 degree or less was used, a resist cross section of a vertical profile could be obtained in the positive development. In addition, it was confirmed that there was no pattern collapse. Further, because amount of change in contact angle by resist coating and removal was 10 degree or less, it can be judged that intermixing between the silicon-containing resist underlayer film and the upperlayer photoresist hardly occurred and that the silicon-containing underlayer film was adequately cured.

Patterning Test by Negative Development

Firstly, spin-on-carbon film ODL-50 (carbon content of 80% by mass, manufactured by Shin-Etsu Chemical Co., Ltd.) having film thickness of 200 nm was formed on a silicon wafer. Then, each of the silicon-containing resist underlayer film-forming composition solutions Sol. 11 to Sol. 26 was applied thereunto and then baked at 240° C. for 60 seconds to form the silicon-containing resist underlayer film having film thickness of 35 nm (Film 11 to Film 26).

Subsequently, the ArF resist solution for negative development (PR-3) shown in Table 12 was applied on the silicon-containing resist underlayer film; and then, it was baked at 100° C. for 60 seconds to form the photoresist film having the film thickness of 100 nm. Further on this photoresist film was applied the immersion top coat (TC-1) shown in Table 10; and then, it was baked at 90° C. for 60 seconds to form the top coat having film thickness of 50 nm.

Then, after it was exposed by using ArF immersion exposure instrument NSR-S610C (NA of 1.30, σ of 0.98/0.65, 35-degree dipole polarized illumination, and 6% half tone phase shift mask, manufactured by Nikon Corp.) and then baked at 100° C. for 60 seconds (PEB), butyl acetate as a developer was discharged for 3 seconds from a developer nozzle with rotation speed of 30 rpm; and thereafter, rotation was stopped and puddle development was done for 27 seconds. After rinsing thereof by diisoamyl ether, it was spin-dried and then baked at 100° C. for 20 seconds to evaporate the rinse solvent. By this patterning, a 43-nm 1:1 negative line-and-space pattern was obtained. With this dimension, pattern collapse was measured by using electron microscope CG4000 (manufactured by Hitachi High-Technologies Corp.), and cross-sectional profile was measured by using electron microscope S-4700 (manufactured by Hitachi, Ltd.) (Table 13).

TABLE 12

| No. | Polymer (parts by mass) | Acid generator (parts by mass) | Base (parts by mass) | Water-shedding polymer (parts by mass) | Solvent (parts by mass) |
|---|---|---|---|---|---|
| PR-3 | ArF resist polymer 2 (100) | PAG2 (7.0) | Quencher (1.0) | — | PGMEA (2,500) |
| PR-4 | ArF resist polymer 3 (100) | PAG2 (7.0) | Quencher (1.0) | — | PGMEA (2,500) |
| PR-5 | ArF resist polymer 3 (100) | PAG2 (10.0) | Quencher (2.0) | Water-shedding polymer 1 (4.0) | PGMEA (2,500) |

ArF Resist Polymer 2:

Molecular weight (Mw): 8,600
Dispersity (Mw/Mn): 1.88

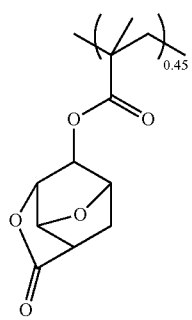

ArF Resist Polymer 3:

Molecular weight (Mw): 8,900
Dispersity (Mw/Mn): 1.93

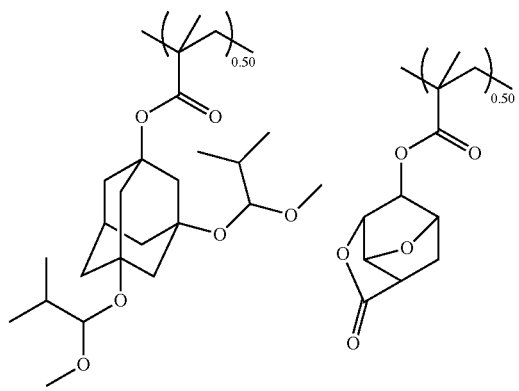

Acid Generator: PAG 2

Base: Quencher

TABLE 13

| Example | Silicon-containing resist underlayer film | ArF resist | Cross-sectional profile of negative pattern after negative development | Pattern collapse | CA3-CA4 |
|---|---|---|---|---|---|
| Example 2-1 | Film 11 | PR-3 | vertical profile | free | 12° |
| Example 2-2 | Film 12 | PR-3 | vertical profile | free | 17° |
| Example 2-3 | Film 13 | PR-3 | vertical profile | free | 11° |
| Example 2-4 | Film 14 | PR-3 | vertical profile | free | 16° |
| Example 2-5 | Film 15 | PR-3 | vertical profile | free | 14° |
| Example 2-6 | Film 16 | PR-3 | vertical profile | free | 15° |
| Example 2-7 | Film 17 | PR-3 | vertical profile | free | 12° |
| Example 2-8 | Film 18 | PR-3 | vertical profile | free | 15° |
| Example 2-9 | Film 19 | PR-3 | vertical profile | free | 11° |
| Example 2-10 | Film 20 | PR-3 | vertical profile | free | 12° |
| Example 2-11 | Film 21 | PR-3 | vertical profile | free | 18° |
| Example 2-12 | Film 22 | PR-3 | vertical profile | free | 14° |
| Comparative Example 2-1 | Film 23 | PR-3 | vertical profile | free | 16° |
| Comparative Example 2-2 | Film 24 | PR-3 | vertical profile | free | 13° |
| Comparative Example 2-3 | Film 25 | PR-3 | undercut profile | occurrence | 0° |
| Comparative Example 2-4 | Film 26 | PR-3 | undercut profile | occurrence | 2° |

As shown in Table 13, when the resist underlayer film whose amount of change between contact angle of the resist underlayer film after coating and removal of the upperlayer resist for negative development (CA3) and contact angle of the resist underlayer film after coating, exposure, and removal of the upperlayer resist for negative development (CA4) is 10 degrees or more was used, a resist cross section of a vertical profile could be obtained in the negative development. It was also confirmed that there was no pattern collapse. On the other hand, in negative development in Comparative Examples 2-3 and 2-4 in which an organic group substituted with an acid-labile group was not contained, amount of change in contact angle was so small, resulting in causing of pattern collapse.

Patterning Test: Developer

By using the ArF resists for negative development (PR-3, PR-4, and PR-5) shown in Table 12 and developers shown below in place of the developer in Example 1 (butyl acetate), a 43-nm 1:1 negative line-and-space pattern was obtained in the manner similar to those in Example 2.

TABLE 14

| Example | Silicon-containing resist underlayer film | ArF resist | Developer | Cross-sectional profile of negative pattern after negative development | Pattern collapse |
|---|---|---|---|---|---|
| Example 3-1 | Film 11 | PR-3 | 2-heptanone | vertical profile | free |
| Example 3-2 | Film 11 | PR-3 | methyl benzoate | vertical profile | free |
| Example 3-3 | Film 11 | PR-4 | ethyl benzoate | vertical profile | free |
| Example 3-4 | Film 11 | PR-4 | phenyl acetate | vertical profile | free |
| Example 3-5 | Film 11 | PR-5 | benzyl acetate | vertical profile | free |
| Example 3-6 | Film 11 | PR-5 | methyl phenyl acetate | vertical profile | free |

With any of these developers, a negative resist pattern having cross section of a vertical profile could be obtained.

Pattern Etching Test: Positively Developed Pattern

By using the resist pattern by positive development formed in the forgoing patterning test by positive development as a mask, the resist underlayer film was dry etched under the condition (1), and then, the pattern was transferred to the spin-on-carbon film by dry etching under the condition (2). The cross-sectional profile of the obtained pattern was measured by using electron microscope S-9380 (manufactured by Hitachi, Ltd.), and the pattern roughness was measured by using electron microscope CG4000 (manufactured by Hitachi High-Technologies Corp.). The results are summarized in Table 15 for comparison.

(1) Etching condition in the $CHF_3/CF_4$ gas system Instrument: dry etching instrument Telius SP (manufactured by Tokyo Electron Ltd.)

Etching condition (1):

| | |
|---|---|
| Chamber pressure | 10 Pa |
| Upper/lower RF power | 500 W/300 W |
| $CHF_3$ gas flow rate | 50 mL/minute |
| $CF_4$ gas flow rate | 150 mL/minute |
| Ar gas flow rate | 100 mL/minute |
| Treatment time | 40 seconds |

(2) Etching condition in the $O_2/N_2$ gas system Instrument: dry etching instrument Telius SP (manufactured by Tokyo Electron Ltd.)

Etching condition (2):

| | |
|---|---|
| Chamber pressure | 2 Pa |
| Upper/lower RF power | 1000 W/300 W |
| $O_2$ gas flow rate | 300 mL/minute |
| $N_2$ gas flow rate | 100 mL/minute |
| Ar gas flow rate | 100 mL/minute |
| Treatment time | 30 seconds |

TABLE 15

| Example | Silicon-containing resist underlayer film | ArF resist | Pattern profile of cross section of spin-on-carbon film after dry etching | Pattern roughness |
|---|---|---|---|---|
| Example 4-1 | Film 11 | PR-1 | vertical profile | 1.9 nm |
| Example 4-2 | Film 12 | PR-1 | vertical profile | 1.5 nm |
| Example 4-3 | Film 13 | PR-1 | vertical profile | 1.7 nm |
| Example 4-4 | Film 14 | PR-1 | vertical profile | 1.8 nm |
| Example 4-5 | Film 15 | PR-1 | vertical profile | 2.0 nm |
| Example 4-6 | Film 16 | PR-1 | vertical profile | 1.7 nm |
| Example 4-7 | Film 17 | PR-1 | vertical profile | 1.8 nm |
| Example 4-8 | Film 18 | PR-1 | vertical profile | 1.9 nm |
| Example 4-9 | Film 19 | PR-1 | vertical profile | 1.5 nm |
| Example 4-10 | Film 20 | PR-1 | vertical profile | 1.9 nm |
| Example 4-11 | Film 21 | PR-2 | vertical profile | 1.7 nm |
| Example 4-12 | Film 22 | PR-2 | vertical profile | 2.1 nm |
| Comparative Example 4-1 | Film 23 | PR-1 | vertical profile | 4.7 nm |
| Comparative Example 4-2 | Film 24 | PR-1 | vertical profile | 3.9 nm |

In the present invention, as shown in Table 15, it was confirmed that the resist profile after development and the cross-sectional profile and the pattern roughness after processing of the spin-on-carbon film were excellent. On the other hand, in the resist underlayer film formed only by a silicon compound (Comparative Examples 4-1 and 4-2), etching resistance of the component localized around the surface is comparatively high so that the upperlayer resist is damaged during the time of dry etching of the resist underlayer film by using the upperlayer resist pattern as a mask; as a result, this was observed finally as the pattern roughness after processing of the spin-on-carbon film.

Pattern Etching Test: Negatively Developed Pattern

By using the resist pattern by negative development formed in the forgoing patterning test by negative development as a mask, the resist underlayer film was dry etched under the condition (1), and then, the pattern was transferred to the spin-on-carbon film by dry etching under the condition (2). The cross-sectional profile of the obtained pattern was measured by using electron microscope S-9380 (manufactured by Hitachi, Ltd.), and the pattern roughness was measured by using electron microscope CG4000 (manufactured by Hitachi High-Technologies Corp.). The results are summarized in Table 16 for comparison.

TABLE 16

| Example | Silicon-containing resist underlayer film | ArF resist | Pattern profile of cross section of spin-on-carbon film after dry etching | Pattern roughness |
|---|---|---|---|---|
| Example 5-1 | Film 11 | PR-3 | vertical profile | 2.0 nm |
| Example 5-2 | Film 12 | PR-3 | vertical profile | 1.8 nm |
| Example 5-3 | Film 13 | PR-3 | vertical profile | 1.6 nm |
| Example 5-4 | Film 14 | PR-3 | vertical profile | 1.7 nm |
| Example 5-5 | Film 15 | PR-3 | vertical profile | 1.6 nm |
| Example 5-6 | Film 16 | PR-3 | vertical profile | 2.1 nm |
| Example 5-7 | Film 17 | PR-3 | vertical profile | 1.7 nm |
| Example 5-8 | Film 18 | PR-3 | vertical profile | 2.2 nm |
| Example 5-9 | Film 19 | PR-3 | vertical profile | 2.0 nm |
| Example 5-10 | Film 20 | PR-3 | vertical profile | 1.6 nm |
| Example 5-11 | Film 21 | PR-3 | vertical profile | 1.8 nm |
| Example 5-12 | Film 22 | PR-3 | vertical profile | 1.5 nm |
| Comparative Example 5-1 | Film 23 | PR-3 | vertical profile | 4.2 nm |
| Comparative Example 5-2 | Film 24 | PR-3 | vertical profile | 4.1 nm |

In the present invention, as shown in Table 16, it was confirmed that the resist profile after development and the cross-sectional profile and the pattern roughness after processing of the spin-on-carbon film were excellent. On the other hand, in the resist underlayer film formed only by a silicon compound (Comparative Examples 5-1 and 5-2), etching resistance of the component localized around the surface is comparatively high so that the upperlayer resist is damaged during the time of dry etching of the resist underlayer film by using the upperlayer resist pattern as a mask; as a result, this was observed finally as the pattern roughness after processing of the spin-on-carbon film.

It is to be noted that the present invention is not limited to the above embodiments. The above embodiments are merely illustrative, and whatever having the substantially same configurations as the technical concept recited in the appended claims and exhibiting the same functions and effects are embraced within the technical scope of the present invention.

What is claimed is:

1. A silicon-containing resist underlayer film-forming composition containing at least any one of a condensation product and a hydrolysis condensation product or both of a mixture comprising:
    one or more kinds of a compound (A) selected from the group consisting of an organic boron compound shown by the following general formula (1) and a condensation product thereof and
    one or more kinds of a silicon compound (B) shown by the following general formula (2),

$$R^1{}_{m0}B(OH)_{m1}(OR)_{(3-m0-m1)} \tag{1}$$

wherein R represents an organic group having 1 to 6 carbon atoms and optionally forming a cyclic organic group by bonding of two ORs; $R^1$ represents an organic group having a hydroxyl group or a carboxyl group substituted with an acid-labile group and optionally forming a cyclic organic group by bonding of two $R^1$s; m0 represents 1 or 2, m1 represents 0, 1, or 2, and $1 \leq m0+m1 \leq 3$,

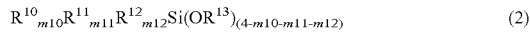
$$R^{10}{}_{m10}R^{11}{}_{m11}R^{12}{}_{m12}Si(OR^{13})_{(4-m10-m11-m12)} \quad (2)$$

wherein $R^{13}$ represents an organic group having 1 to 6 carbon atoms; each of $R^{10}$, $R^{11}$, and $R^{12}$ represents a hydrogen atom or a monovalent organic group having 1 to 30 carbon atoms; and m10, m11, and m12 represent 0 or 1, and $0 \leq m10+m11+m12 \leq 3$.

2. The silicon-containing resist underlayer film-forming composition according to claim 1, wherein the silicon-containing resist underlayer film-forming composition contains any one of a condensation product and a hydrolysis condensation product or both of a mixture comprising the compound (A), the compound (B), and a compound (C) shown by the following general formula (3),

$$U(OR^2)_{m2}(OR^3)_{m3}(O)_{m4} \quad (3)$$

wherein $R^2$ and $R^3$ represent a hydrogen atom, or an organic group having 1 to 30 carbon atoms; m2+m3+m4 is a valency that is determined by a kind of U; m2, m3, and m4 represent an integer of 0 or more; and U represents an element belonging to the groups III, IV, or V in the periodic table except for carbon and silicon.

3. The silicon-containing resist underlayer film-forming composition according to claim 2, wherein the U in the above general formula (3) represents any of boron, aluminum, gallium, yttrium, germanium, titanium, zirconium, hafnium, bismuth, tin, phosphorous, vanadium, arsenic, antimony, niobium, and an tantalum.

4. The silicon-containing resist underlayer film-forming composition according to claim 3, wherein a solvent having a boiling point of 180° C. or higher is contained in the silicon-containing resist underlayer film-forming composition.

5. A patterning process, wherein an organic underlayer film is formed on a body to be processed by using an organic underlayer film-forming composition of an application type, on the organic underlayer film is formed a silicon-containing resist underlayer film by using the silicon-containing resist underlayer film-forming composition according to claim 4, on the silicon-containing resist underlayer film is formed a photoresist film by using a resist composition of a chemically amplification type, and after heat treatment thereof, the photoresist film is exposed to a high energy beam, an exposed area of the photoresist film is dissolved by using an alkaline developer to form a positive pattern, the pattern is transferred to the silicon-containing resist underlayer film by dry etching by using the photoresist film having the pattern formed therein as a mask, the pattern is transferred to the organic underlayer film by dry etching by using the silicon-containing resist underlayer film having the pattern transferred thereto as a mask, and further the pattern is transferred to the body to be processed by dry etching by using the organic underlayer film having the pattern transferred thereto as a mask.

6. A patterning process, wherein an organic hard mask composed of mainly a carbon is formed on a body to be processed by a CVD method, on the organic hard mask is formed a silicon-containing resist underlayer film by using the silicon-containing resist underlayer film-forming composition according to claim 4, on the silicon-containing resist underlayer film is formed a photoresist film by using a resist composition of a chemically amplification type, and after heat treatment thereof, the photoresist film is exposed to a high energy beam, an exposed area of the photoresist film is dissolved by using an alkaline developer to form a positive pattern, the pattern is transferred to the silicon-containing resist underlayer film by dry etching by using the photoresist film having the pattern formed therein as a mask, the pattern is transferred to the organic hard mask by dry etching by using the silicon-containing resist underlayer film having the pattern transferred thereto as a mask, and further the pattern is transferred to the body to be processed by dry etching by using the organic hard mask having the pattern transferred thereto as a mask.

7. A patterning process, wherein an organic underlayer film is formed on a body to be processed by using an organic underlayer film-forming composition of an application type, on the organic underlayer film is formed a silicon-containing resist underlayer film by using the silicon-containing resist underlayer film-forming composition according to claim 4, on the silicon-containing resist underlayer film is formed a photoresist film by using a resist composition of a chemically amplification type, and after heat treatment thereof, the photoresist film is exposed to a high energy beam, an unexposed area of the photoresist film is dissolved by using an organic solvent developer to form a negative pattern, the pattern is transferred to the silicon-containing resist underlayer film by dry etching by using the photoresist film having the pattern formed therein as a mask, the pattern is transferred to the organic underlayer film by dry etching by using the silicon-containing resist underlayer film having the pattern transferred thereto as a mask, and further the pattern is transferred to the body to be processed by dry etching by using the organic underlayer film having the pattern transferred thereto as a mask.

8. A patterning process, wherein an organic hard mask composed of mainly a carbon is formed on a body to be processed by a CVD method, on the organic hard mask is formed a silicon-containing resist underlayer film by using the silicon-containing resist underlayer film-forming composition according to claim 4, on the silicon-containing resist underlayer film is formed a photoresist film by using a resist composition of a chemically amplification type, and after heat treatment thereof, the photoresist film is exposed to a high energy beam, an unexposed area of the photoresist film is dissolved by using an organic solvent developer to form a negative pattern, the pattern is transferred to the silicon-containing resist underlayer film by dry etching by using the photoresist film having the pattern formed therein as a mask, the pattern is transferred to the organic hard mask by dry etching by using the silicon-containing resist underlayer film having the pattern transferred thereto as a mask, and further the pattern is transferred to the body to be processed by dry etching by using the organic hard mask having the pattern transferred thereto as a mask.

9. The silicon-containing resist underlayer film-forming composition according to claim 2, wherein a solvent having a boiling point of 180° C. or higher is contained in the silicon-containing resist underlayer film-forming composition.

10. The silicon-containing resist underlayer film-forming composition according to claim 1, wherein a solvent having a boiling point of 180° C. or higher is contained in the silicon-containing resist underlayer film-forming composition.

11. A patterning process, wherein an organic underlayer film is formed on a body to be processed by using an organic underlayer film-forming composition of an application type, on the organic underlayer film is formed a silicon-containing resist underlayer film by using the silicon-containing resist underlayer film-forming composition according to claim 1, on the silicon-containing resist underlayer film is formed a photoresist film by using a resist composition of a chemically amplification type, and after heat treatment thereof, the photoresist film is exposed to a high energy beam, an exposed area of the photoresist film is dissolved by using an alkaline developer to form a positive pattern, the pattern is transferred to the silicon-containing resist underlayer film by dry etching by using the photoresist film having the pattern formed therein as a mask, the pattern is transferred to the organic underlayer film by dry etching by using the silicon-containing resist underlayer film having the pattern transferred thereto as a mask, and further the pattern is transferred to the body to be processed by dry etching by using the organic underlayer film having the pattern transferred thereto as a mask.

12. The patterning process according to claim 11, wherein difference between contact angle to pure water of the silicon-containing resist underlayer film before formation of the photoresist film and contact angle to pure water of the silicon-containing resist underlayer film corresponding to the unexposed area of the photoresist film after exposure is 10 degrees or less.

13. The patterning process according to claim 11, wherein, as the body to be processed, a substrate for a semiconductor device or a substrate for a semiconductor device coated with any of a metal film, a metal carbide film, a metal oxide film, a metal nitride film, a metal oxycarbide film, and a metal oxynitride film is used.

14. The patterning process according to claim 13, wherein the metal to constitute the body to be processed is any of silicon, titanium, tungsten, hafnium, zirconium, chromium, germanium, copper, aluminum, and iron, or a metal alloy of them.

15. A patterning process, wherein an organic hard mask composed of mainly a carbon is formed on a body to be processed by a CVD method, on the organic hard mask is formed a silicon-containing resist underlayer film by using the silicon-containing resist underlayer film-forming composition according to claim 1, on the silicon-containing resist underlayer film is formed a photoresist film by using a resist composition of a chemically amplification type, and after heat treatment thereof, the photoresist film is exposed to a high energy beam, an exposed area of the photoresist film is dissolved by using an alkaline developer to form a positive pattern, the pattern is transferred to the silicon-containing resist underlayer film by dry etching by using the photoresist film having the pattern formed therein as a mask, the pattern is transferred to the organic hard mask by dry etching by using the silicon-containing resist underlayer film having the pattern transferred thereto as a mask, and further the pattern is transferred to the body to be processed by dry etching by using the organic hard mask having the pattern transferred thereto as a mask.

16. The patterning process according to claim 15, wherein difference between contact angle to pure water of the silicon-containing resist underlayer film before formation of the photoresist film and contact angle to pure water of the silicon-containing resist underlayer film corresponding to the unexposed area of the photoresist film after exposure is 10 degrees or less.

17. The patterning process according to claim 15, wherein, as the body to be processed, a substrate for a semiconductor device or a substrate for a semiconductor device coated with any of a metal film, a metal carbide film, a metal oxide film, a metal nitride film, a metal oxycarbide film, and a metal oxynitride film is used.

18. The patterning process according to claim 17, wherein the metal to constitute the body to be processed is any of silicon, titanium, tungsten, hafnium, zirconium, chromium, germanium, copper, aluminum, and iron, or a metal alloy of them.

19. A patterning process, wherein an organic underlayer film is formed on a body to be processed by using an organic underlayer film-forming composition of an application type, on the organic underlayer film is formed a silicon-containing resist underlayer film by using the silicon-containing resist underlayer film-forming composition according to claim 1, on the silicon-containing resist underlayer film is formed a photoresist film by using a resist composition of a chemically amplification type, and after heat treatment thereof, the photoresist film is exposed to a high energy beam, an unexposed area of the photoresist film is dissolved by using an organic solvent developer to form a negative pattern, the pattern is transferred to the silicon-containing resist underlayer film by dry etching by using the photoresist film having the pattern formed therein as a mask, the pattern is transferred to the organic underlayer film by dry etching by using the silicon-containing resist underlayer film having the pattern transferred thereto as a mask, and further the pattern is transferred to the body to be processed by dry etching by using the organic underlayer film having the pattern transferred thereto as a mask.

20. The patterning process according to claim 19, wherein, in the exposure of the photoresist film, contact angle to pure water of the silicon-containing resist underlayer film corresponding to the exposed area of the photoresist film is decreased by 10 degrees or more as compared with before the exposure.

21. The patterning process according to claim 19, wherein, as the body to be processed, a substrate for a semiconductor device or a substrate for a semiconductor device coated with any of a metal film, a metal carbide film, a metal oxide film, a metal nitride film, a metal oxycarbide film, and a metal oxynitride film is used.

22. The patterning process according to claim 21, wherein the metal to constitute the body to be processed is any of silicon, titanium, tungsten, hafnium, zirconium, chromium, germanium, copper, aluminum, and iron, or a metal alloy of them.

23. A patterning process, wherein an organic hard mask composed of mainly a carbon is formed on a body to be processed by a CVD method, on the organic hard mask is formed a silicon-containing resist underlayer film by using the silicon-containing resist underlayer film-forming composition according to claim 1, on the silicon-containing resist underlayer film is formed a photoresist film by using a resist composition of a chemically amplification type, and after heat treatment thereof, the photoresist film is exposed to a high energy beam, an unexposed area of the photoresist film is dissolved by using an organic solvent developer to form a negative pattern, the pattern is transferred to the silicon-containing resist underlayer film by dry etching by using the photoresist film having the pattern formed therein as a mask, the pattern is transferred to the organic hard mask by dry etching by using the silicon-containing resist underlayer film having the pattern transferred thereto as a mask, and further the pattern is transferred to the body to be processed by dry etching by using the organic hard mask having the pattern transferred thereto as a mask.

24. The patterning process according to claim 23, wherein, in the exposure of the photoresist film, contact angle to pure water of the silicon-containing resist underlayer film corresponding to the exposed area of the photoresist film is decreased by 10 degrees or more as compared with before the exposure.

25. The patterning process according to claim 23, wherein, as the body to be processed, a substrate for a semiconductor device or a substrate for a semiconductor device coated with any of a metal film, a metal carbide film, a metal oxide film, a metal nitride film, a metal oxycarbide film, and a metal oxynitride film is used.

26. The patterning process according to claim 25, wherein the metal to constitute the body to be processed is any of silicon, titanium, tungsten, hafnium, zirconium, chromium, germanium, copper, aluminum, and iron, or a metal alloy of them.

* * * * *